US012593475B2

(12) United States Patent
Pan et al.

(10) Patent No.: US 12,593,475 B2
(45) Date of Patent: Mar. 31, 2026

(54) FIELD EFFECT TRANSISTOR WITH ISOLATION STRUCTURE AND METHOD

(71) Applicant: Taiwan Semiconductor Manufacturing Co., Ltd., Hsinchu (TW)

(72) Inventors: Kuan-Ting Pan, Hsinchu (TW); Kuo-Cheng Chiang, Hsinchu (TW); Shi Ning Ju, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 439 days.

(21) Appl. No.: 18/170,482

(22) Filed: Feb. 16, 2023

(65) Prior Publication Data

US 2024/0038901 A1     Feb. 1, 2024

Related U.S. Application Data

(60) Provisional application No. 63/392,617, filed on Jul. 27, 2022.

(51) Int. Cl.
  *H01L 29/786*     (2006.01)
  *H01L 29/06*     (2006.01)
  (Continued)

(52) U.S. Cl.
  CPC ....... *H10D 30/6757* (2025.01); *H10D 30/024* (2025.01); *H10D 30/6211* (2025.01);
  (Continued)

(58) Field of Classification Search
  CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/6757; H10D 30/797; H10D 62/021; H10D 62/118; H10D 62/119; H10D 62/121; H10D 62/149; H10D 62/151; H10D 64/015; H10D 64/018; H10D 64/021;
  (Continued)

(56) References Cited

U.S. PATENT DOCUMENTS 11,164,942 B1 * 11/2021 Weckx ................. H10D 62/121
12,328,904 B2 * 6/2025 Jin ........................ H10D 64/017
  (Continued)

*Primary Examiner* — David C Spalla
(74) *Attorney, Agent, or Firm* — Seed Intellectual Property Law Group LLP

(57)     ABSTRACT

A device includes: a first stack of nanostructures; a second stack of nanostructures horizontally offset from the first stack; a first source/drain region abutting the first stack of nanostructures; a second source/drain region abutting the second stack of nanostructures; a wall structure between the first and second stacks and spaced apart from the nanostructures of the first stack; and a first gate structure, which includes: a gate dielectric layer that wraps around the nanostructures of the first stack; and a conductive core layer on the gate dielectric layer, wherein thickness of the conductive core layer between one of the nanostructure of the first stack and the wall structure is in a range of 0 nanometers to 1 nanometer, inclusive.

20 Claims, 61 Drawing Sheets

(51) Int. Cl.

| | |
|---|---|
| *H01L 29/08* | (2006.01) |
| *H01L 29/66* | (2006.01) |
| *H10D 30/01* | (2025.01) |
| *H10D 30/62* | (2025.01) |
| *H10D 30/67* | (2025.01) |
| *H10D 62/00* | (2025.01) |
| *H10D 62/10* | (2025.01) |
| *H10D 64/01* | (2025.01) |
| *H10D 64/68* | (2025.01) |

(52) U.S. Cl.
CPC ......... *H10D 62/021* (2025.01); *H10D 62/118* (2025.01); *H10D 64/021* (2025.01); *H10D 64/691* (2025.01)

(58) Field of Classification Search
CPC ............... H10D 64/691; H10D 84/013; H10D 84/0158; H10D 84/017; H10D 84/0193; H10D 84/834; H10D 84/853
See application file for complete search history.

(56) References Cited

U.S. PATENT DOCUMENTS

| | | | |
|---|---|---|---|
| 2022/0102520 A1* | 3/2022 | Shiliang ............. | H10D 30/6757 |
| 2022/0216203 A1 | 7/2022 | Cheng et al. | |
| 2023/0095140 A1* | 3/2023 | Xie ...................... | H10D 30/014 |
| | | | 257/288 |
| 2023/0187514 A1* | 6/2023 | Zhou ................... | H10D 62/121 |
| | | | 257/288 |
| 2023/0207563 A1* | 6/2023 | Cheng ................. | H10D 30/031 |
| | | | 257/351 |

* cited by examiner

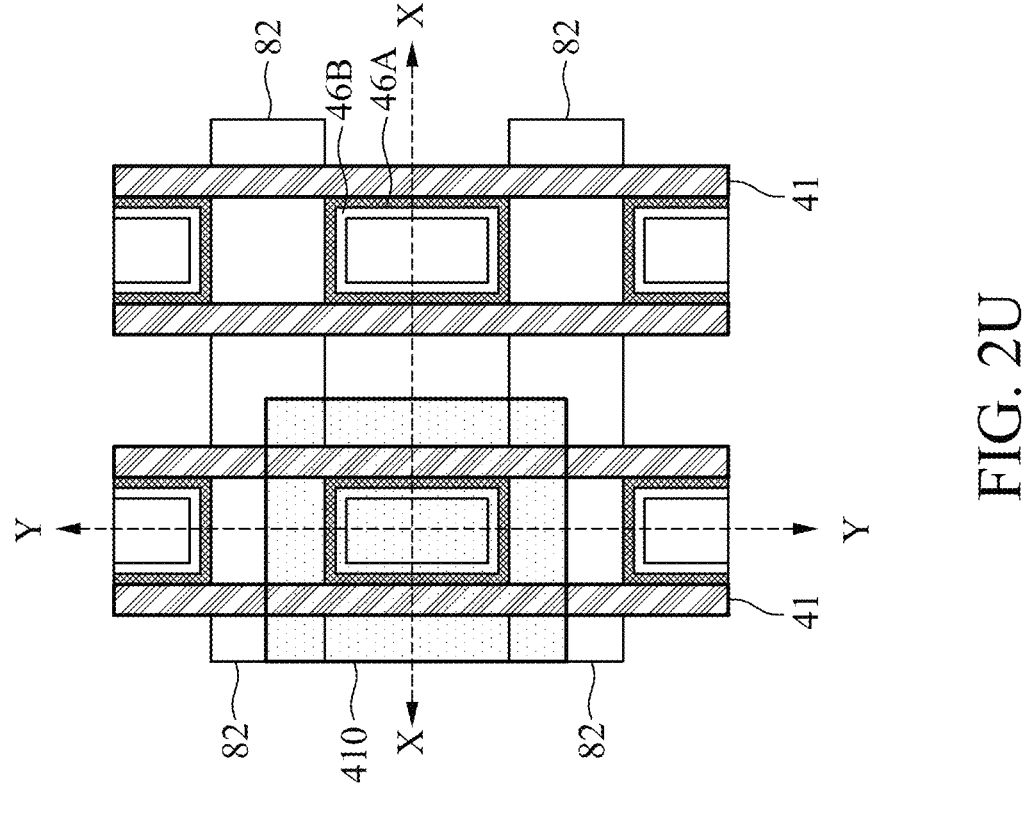
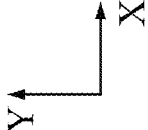
FIG. 2U

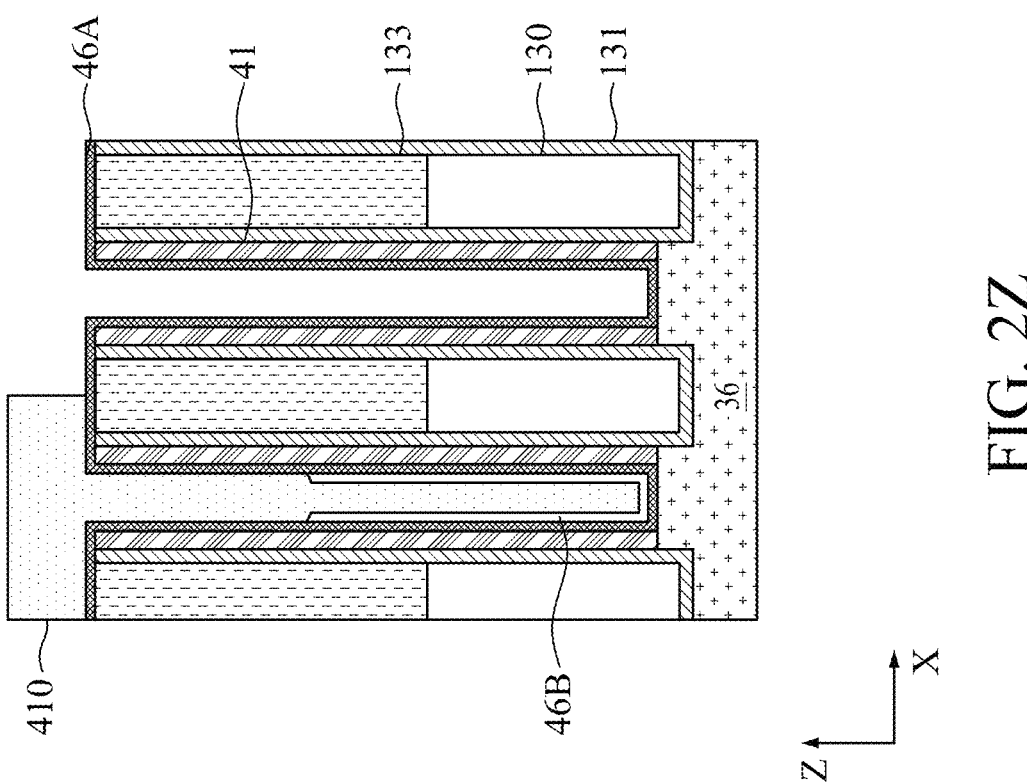
FIG. 2Z
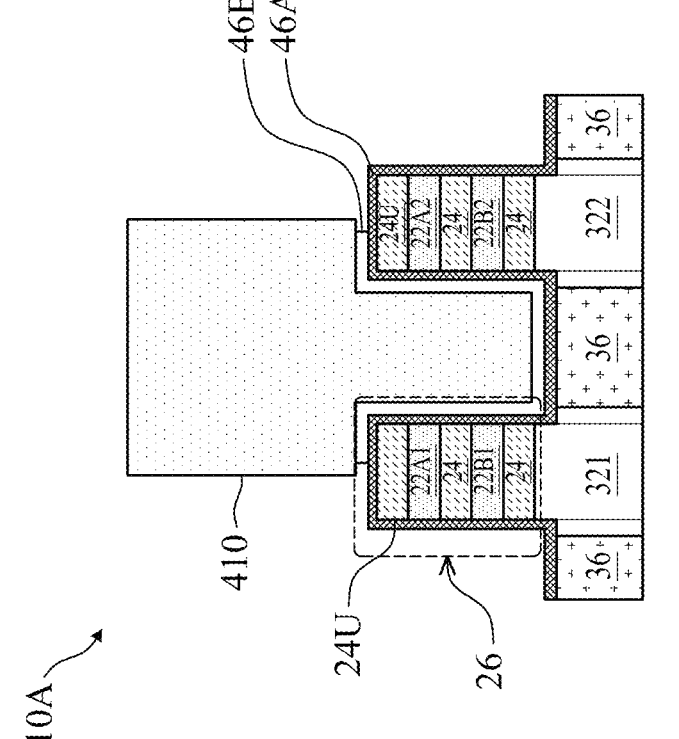
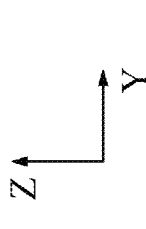
FIG. 2Y

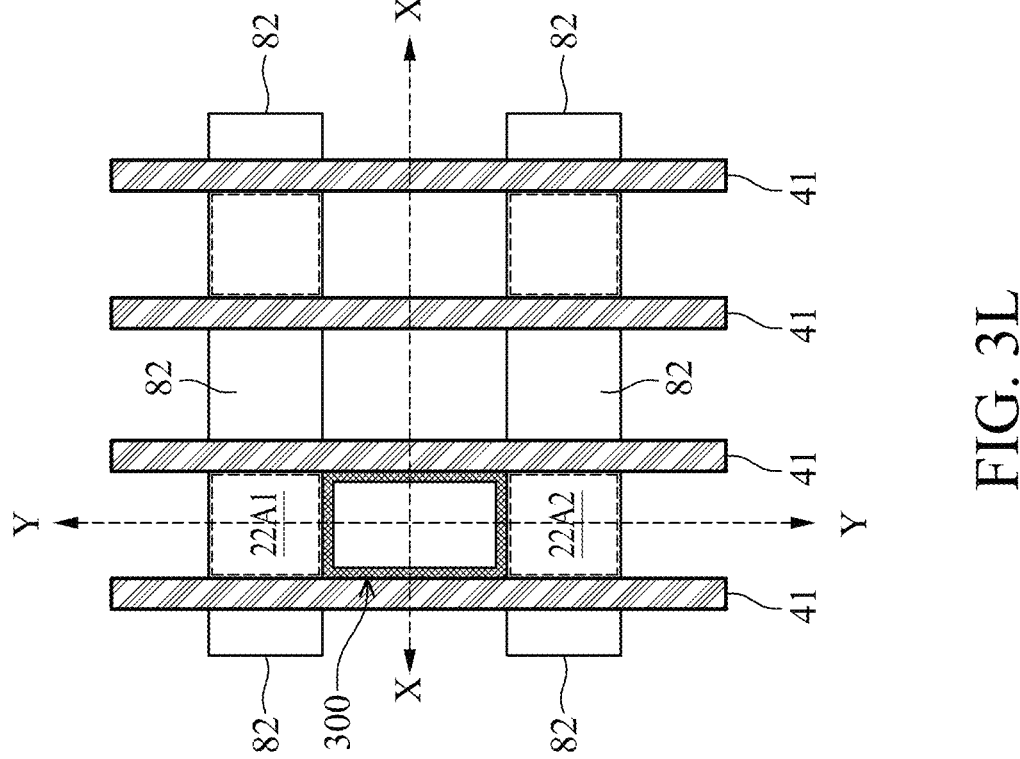
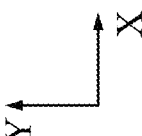
FIG. 3L

1100

1200

1300

1400

1500

1600

1700

1800

1900

Form isolated fin stacks

Form sacrificial gate structure over fin stacks

Form source/drain regions abutting fin stacks

Remove sacrificial gate structure to form trench

Form wall structure in trench

Release nanosheets of fin stacks

Form gate structure abutting wall structure

Form conductive bridging layer

Form gate isolation structure

1000

FIELD EFFECT TRANSISTOR WITH ISOLATION STRUCTURE AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
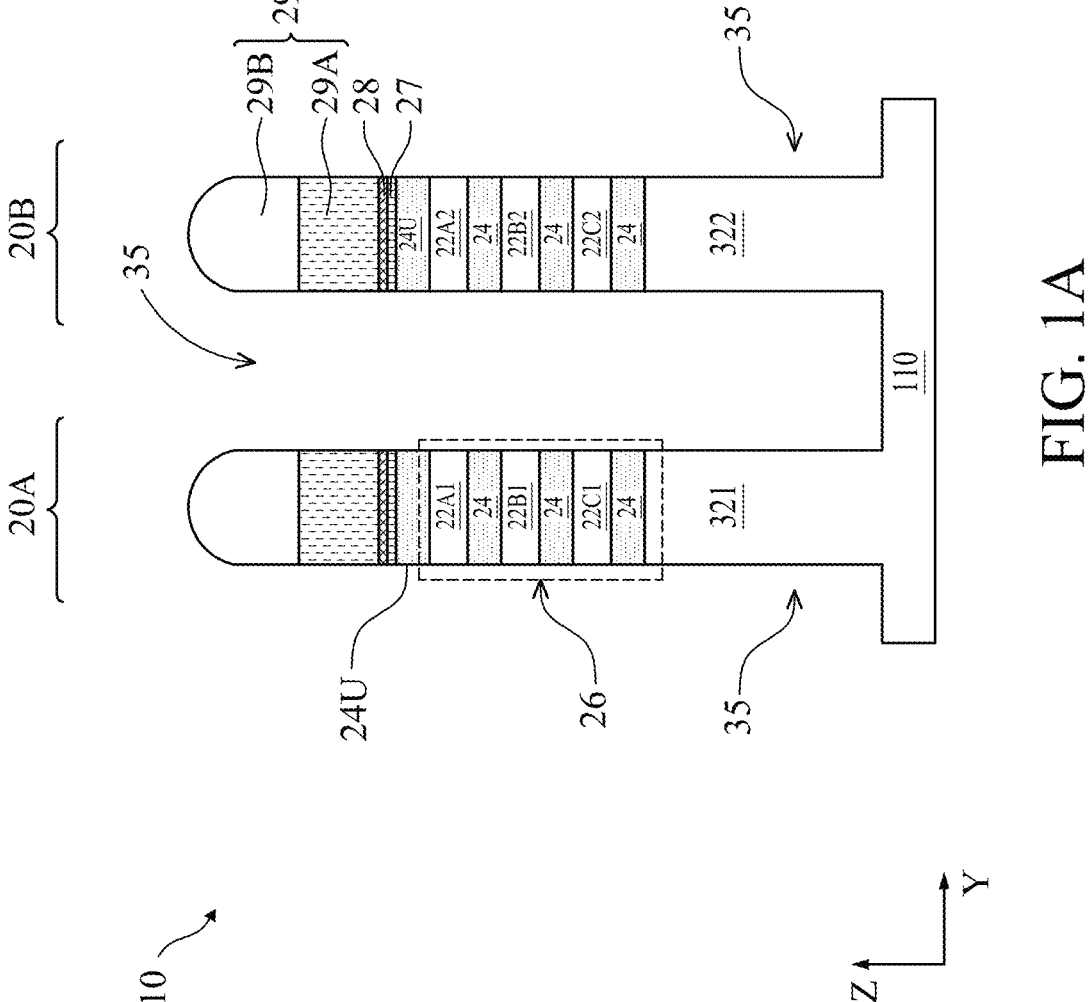
FIGS. 1A-1Z and 7 are diagrammatic top and cross-sectional side views of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms.

The present disclosure is generally related to semiconductor devices, and more particularly to field-effect transistors (FETs), such as planar FETs, three-dimensional fin FETs (FinFETs), or nanostructure devices. Examples of nanostructure devices include gate-all-around (GAA) devices, nanosheet FETs (NSFETs), nanowire FETs (NWFETs), and the like. In advanced technology nodes, active area spacing between nanostructure devices is generally uniform, source/drain epitaxy structures are symmetrical, and a metal gate surrounds four sides of the nanostructures (e.g., nanosheets). Gate-drain capacitance ("Cgd") is increased due to larger metal gate endcap and increased source/drain epitaxy size.

Nanostructure device architectures like NSFETs have improved short-channel characteristics due to better gate control while performance gains (e.g., AC reduction) can be expected with reduced metal gate endcap. In addition, reduced metal gate endcap can push active area space scaling, thereby reducing cell height. Direct etch-away of side metal gate for endcap reduction can induce serious high threshold voltage (Vt) and Vt variation. As such, the cell height is constrained by minimum feature size uniformity and overlay shift of metal gate isolation photolithography.

Embodiments of the disclosure provide a method of forming a self-aligned gate isolation wall, which can enable density scaling and device AC reduction without losing short-channel control. In the embodiments, the gate isolation wall is formed in a replacement gate process, in which a polysilicon gate is replaced with a metal gate. The gate isolation wall may be formed after sacrificial gate removal and before channel release (e.g., SiGe removal), and the gate isolation wall is confined between sidewall spacers and between active areas (e.g., fins), forming a forksheet structure. A high-k gate dielectric extends all around nanosheets due to HK merge in the endcap, making metal gate workfunction metal in the endcap optional. In some embodiments, the work-function metal is filled in the endcap to a thickness less than 1 nanometer (nm). Thickness of top work-function metal (i.e., over the top nanosheet) is the same as inter-sheet work-function metal thickness.

The above technical features allow for cell height reduction (e.g., due to active area space reduction), cell capacitance reduction (Ccell), power efficiency ($\Delta$peff) improvement due to forksheet structure and high-k gate dielectric all-around GAA-like profile. Performance (e.g., Vt) between nanosheets is more uniform due to the thickness of the top work-function metal being the same as that of the inter-sheet work-function metal. Source/drain-contact-to-gate-via short concern is low because the wall is confined between sidewall spacers.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor structure.

Figure 1B:
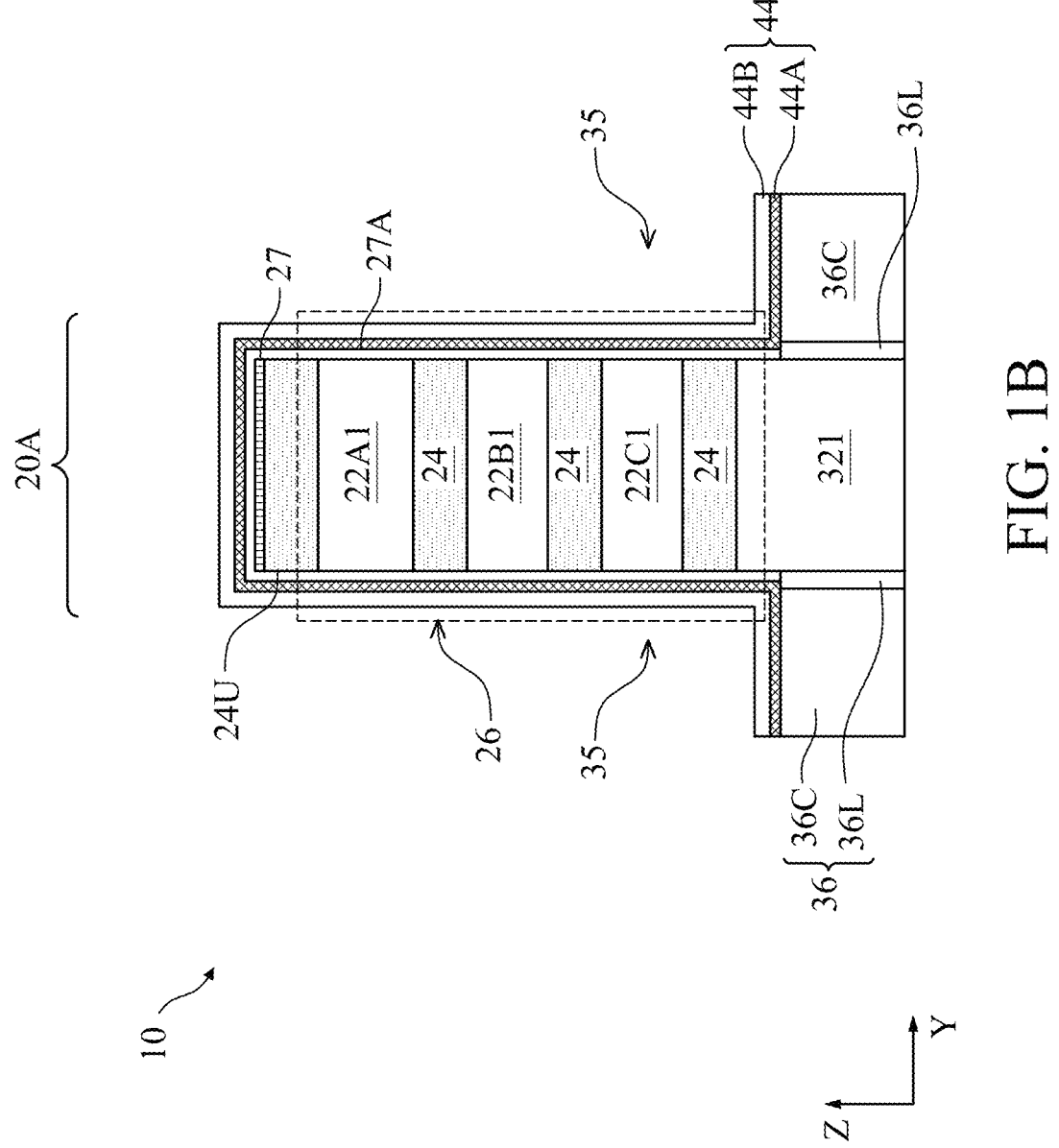
Figure 1C:
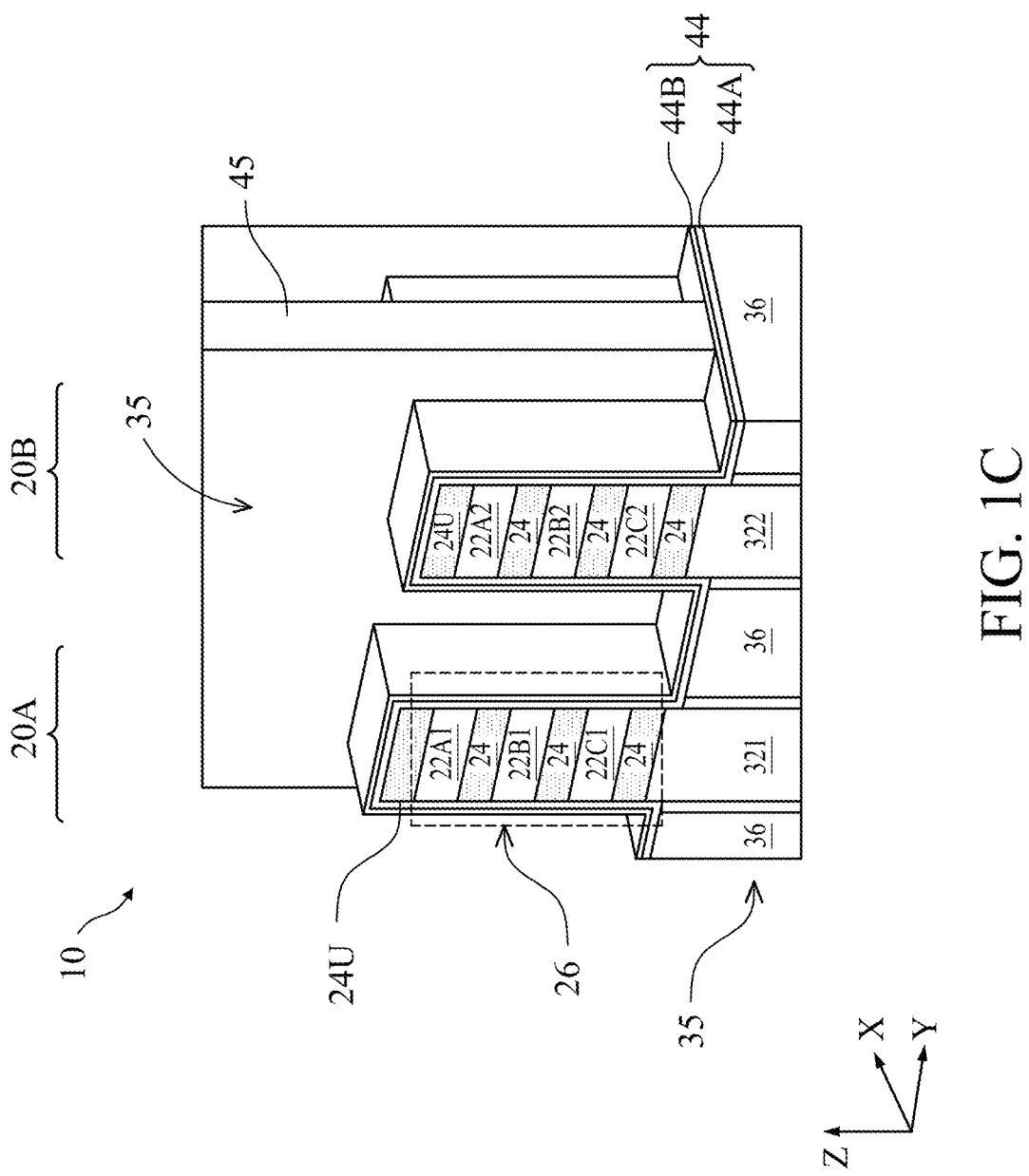
Figure 1D:
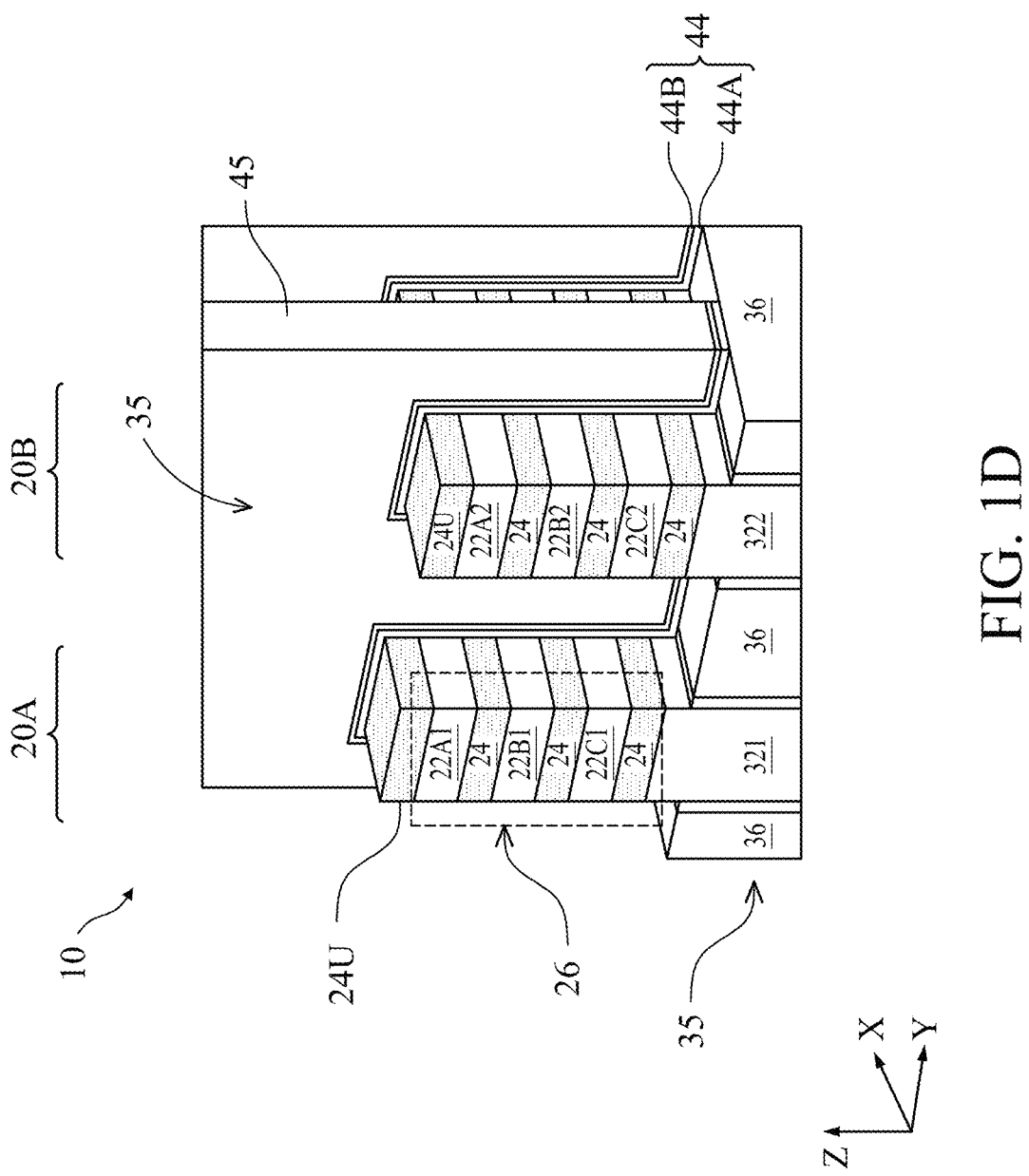
Figure 1F:
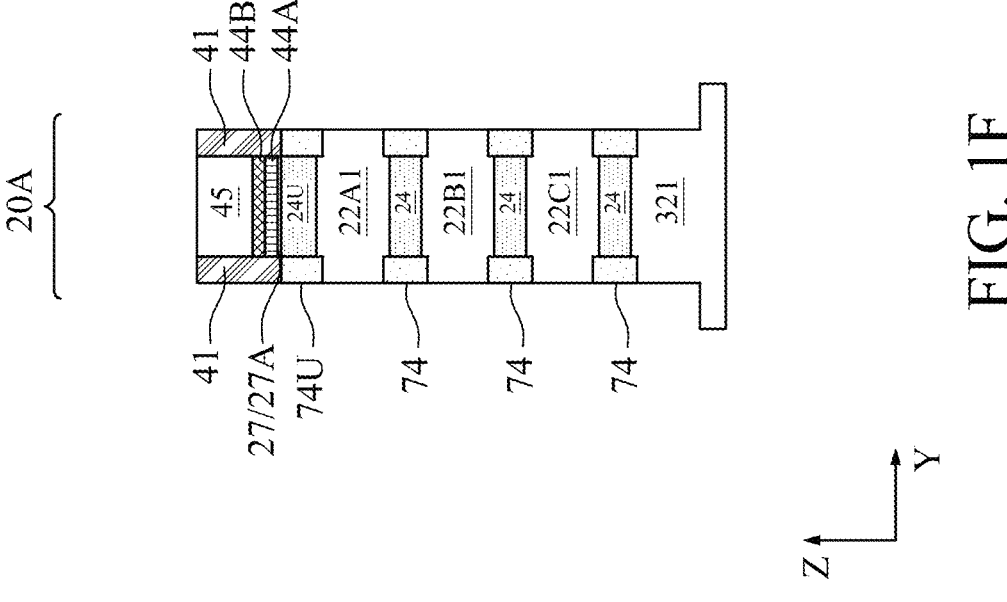
Figure 1E:
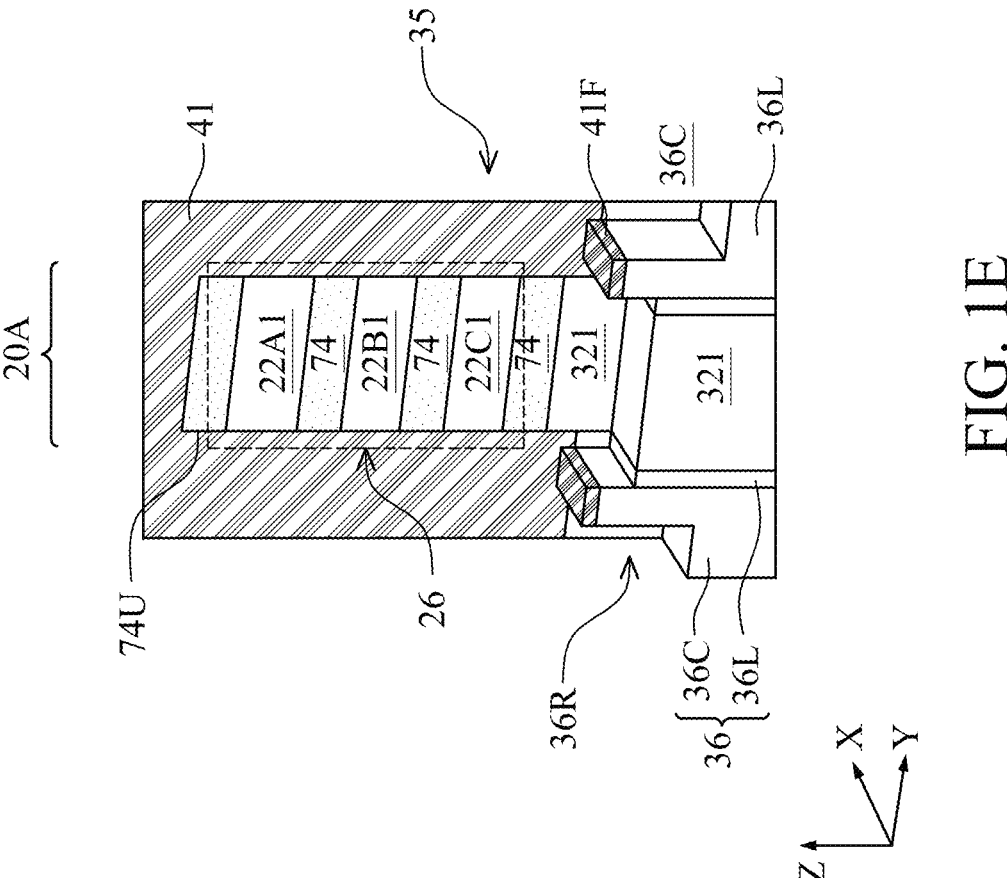
Figure 1G:
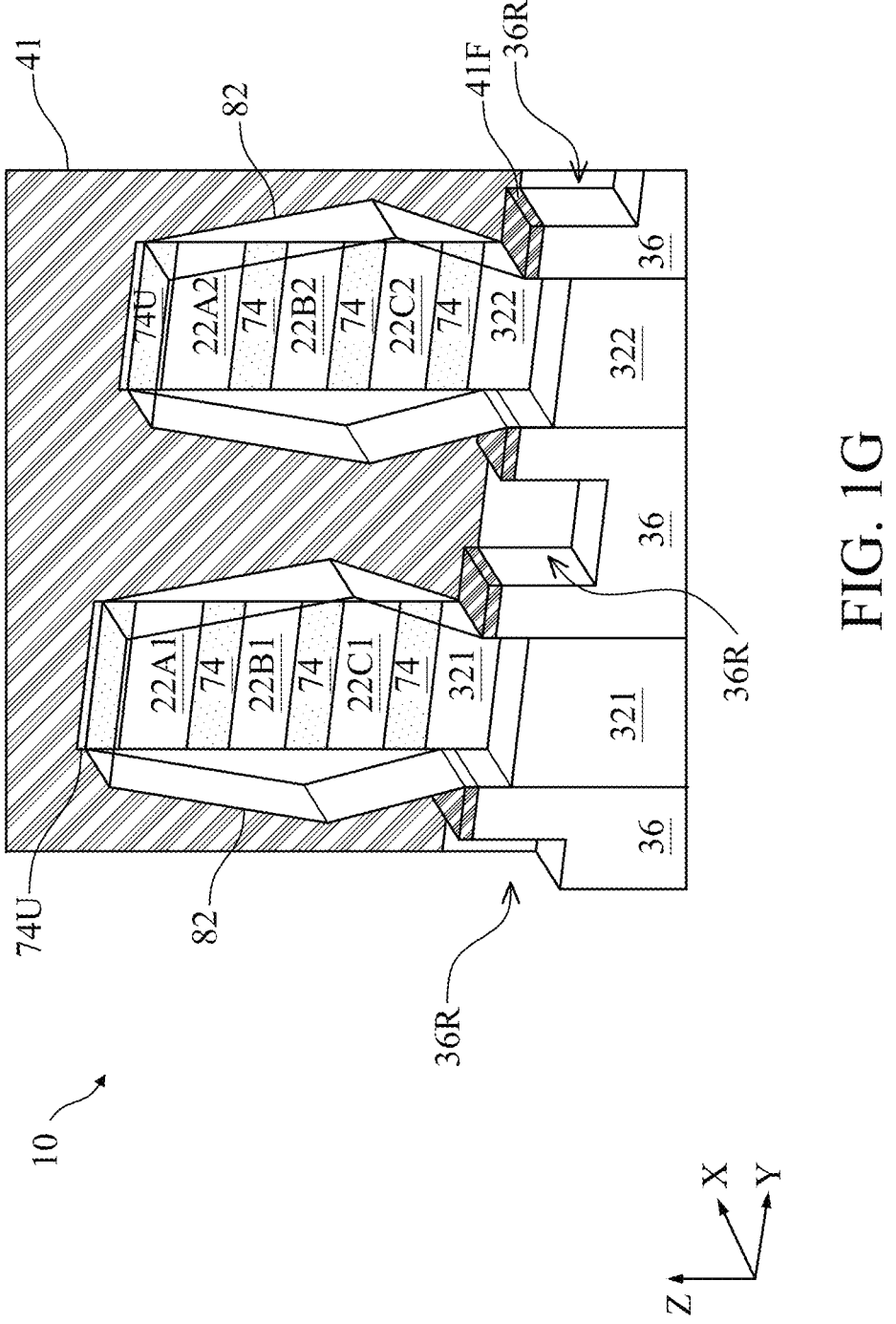
Figure 1I:
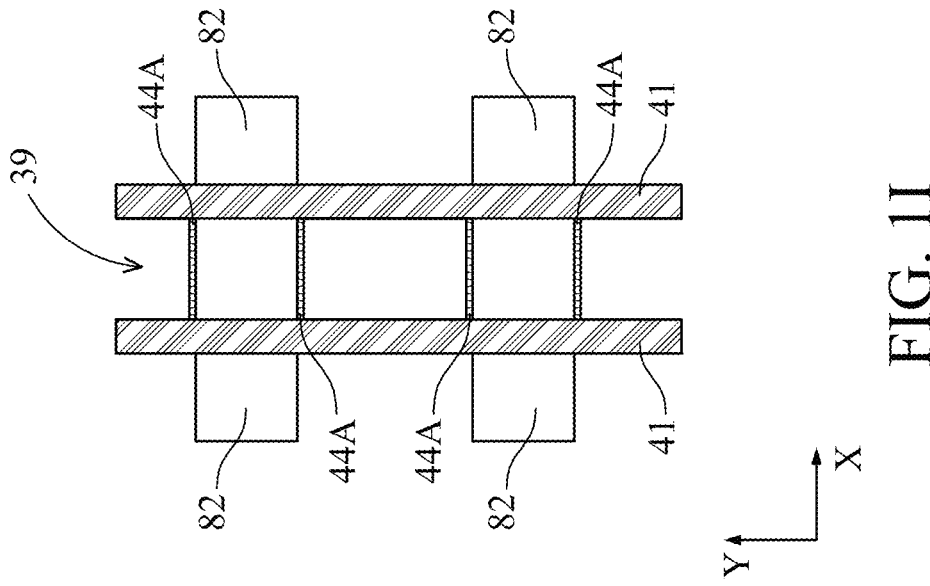
Figure 1H:
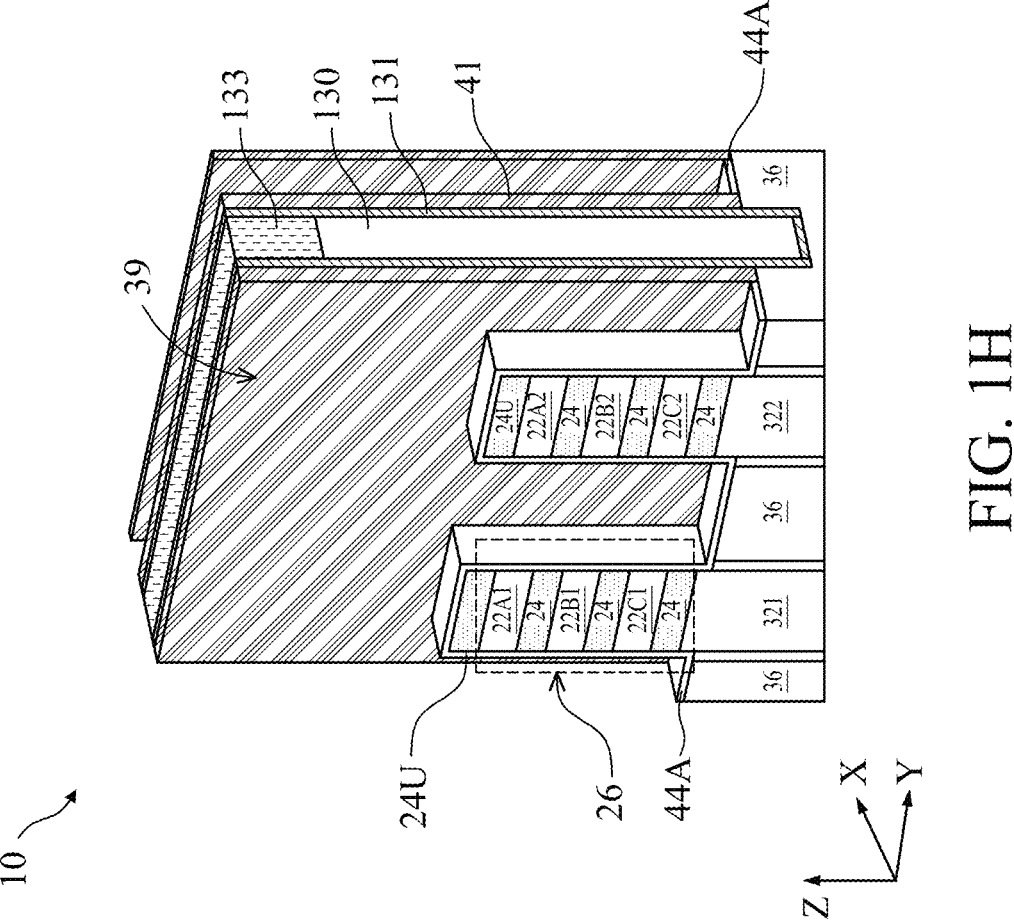
Figures 1J, 1K:
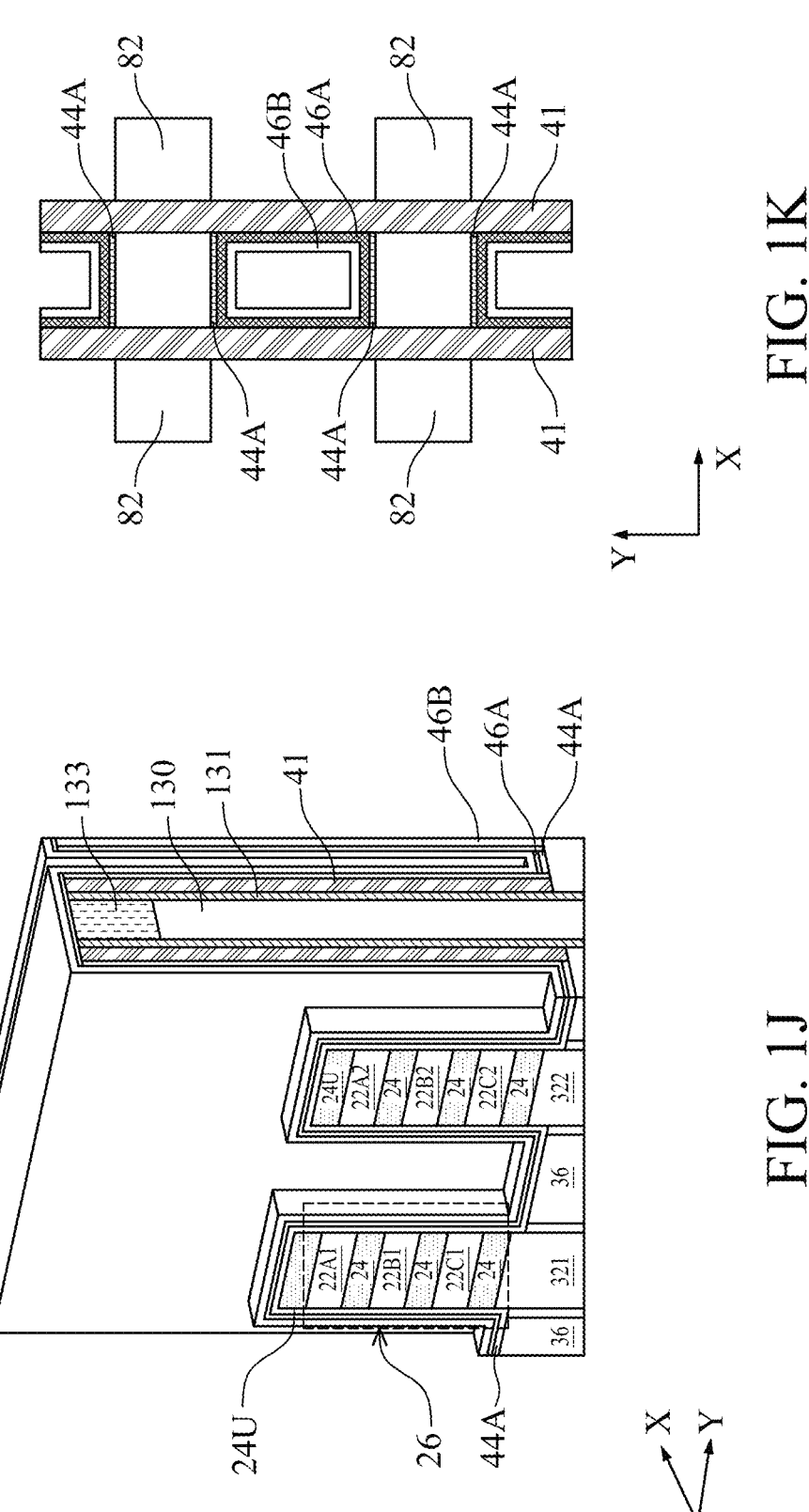
Figures 1L, 1M:
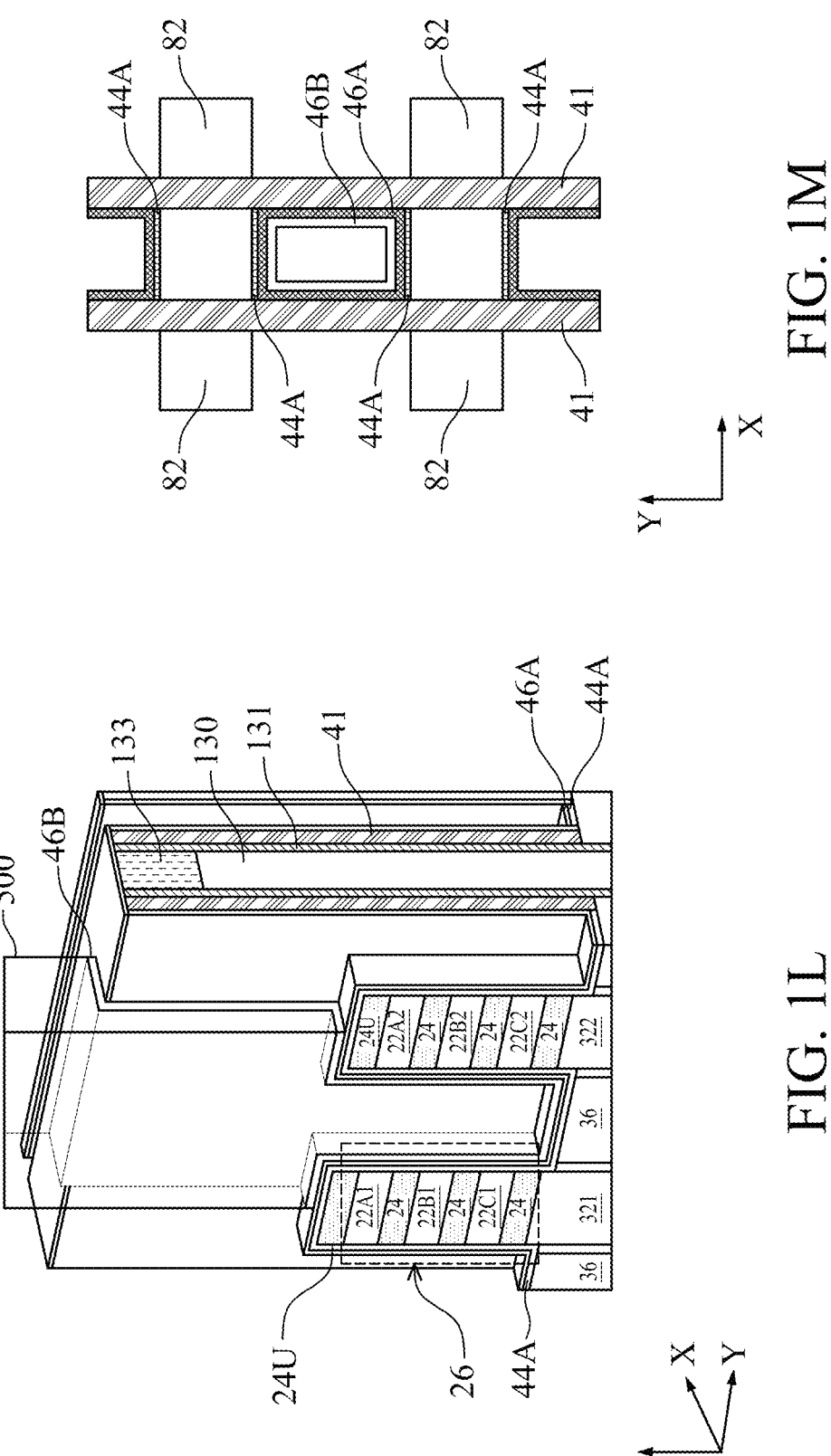
Figures 1N, 1O:
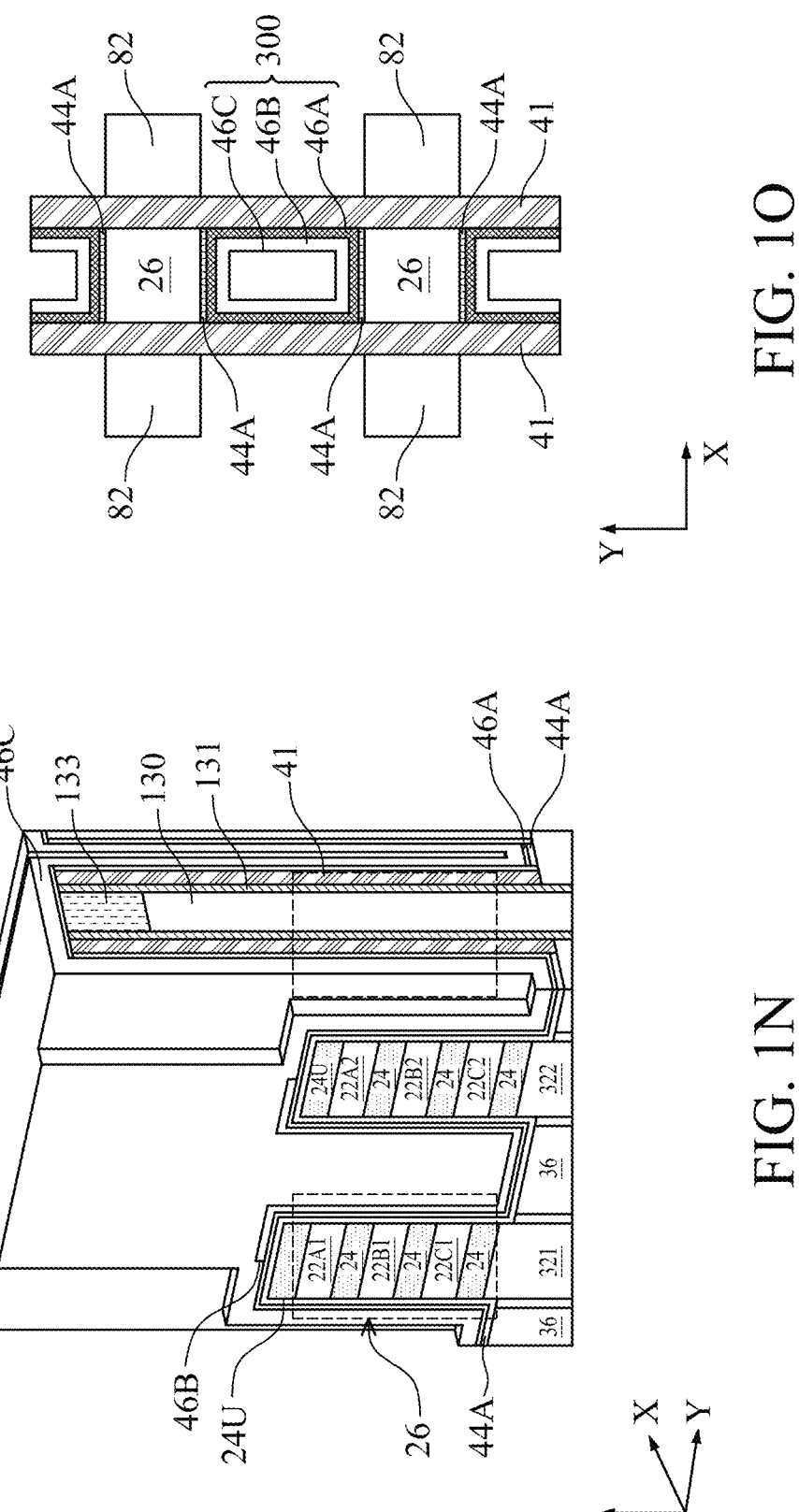
Figure 1Q:
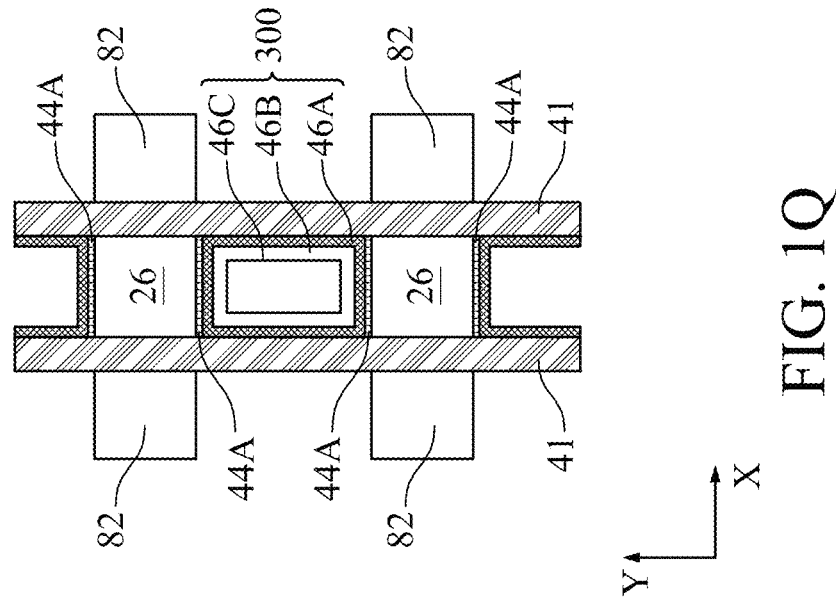
Figure 1P:
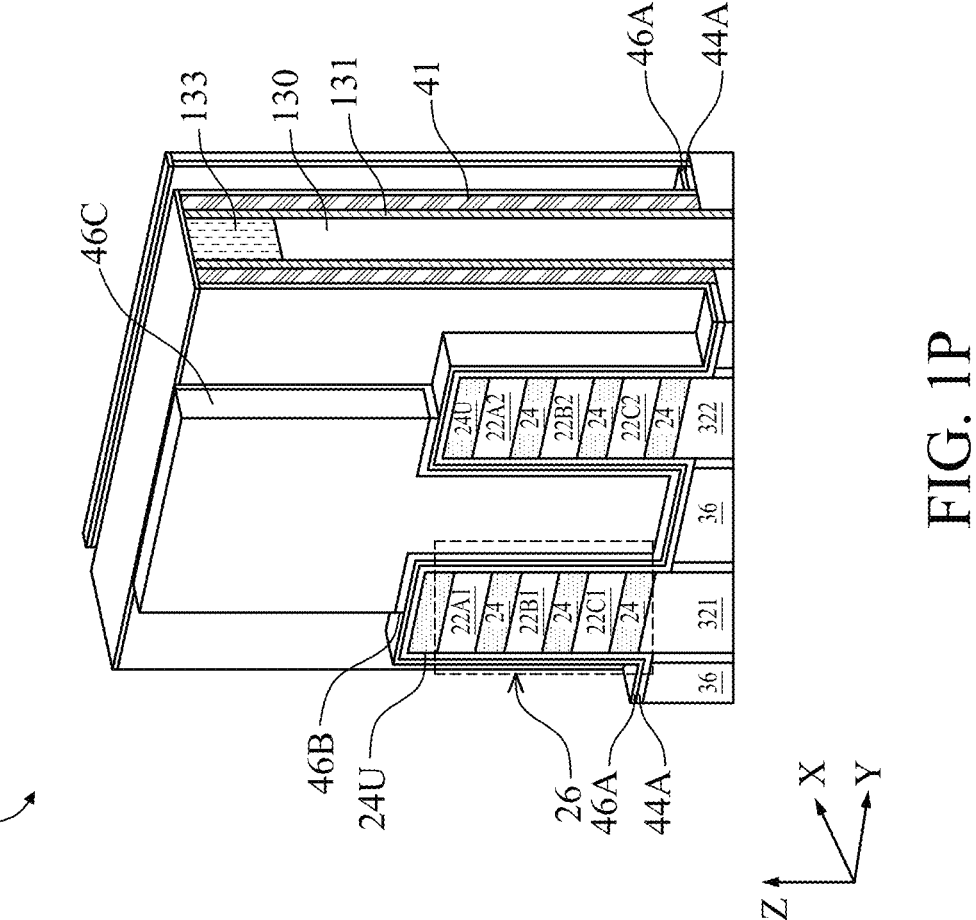
Figure 1S:
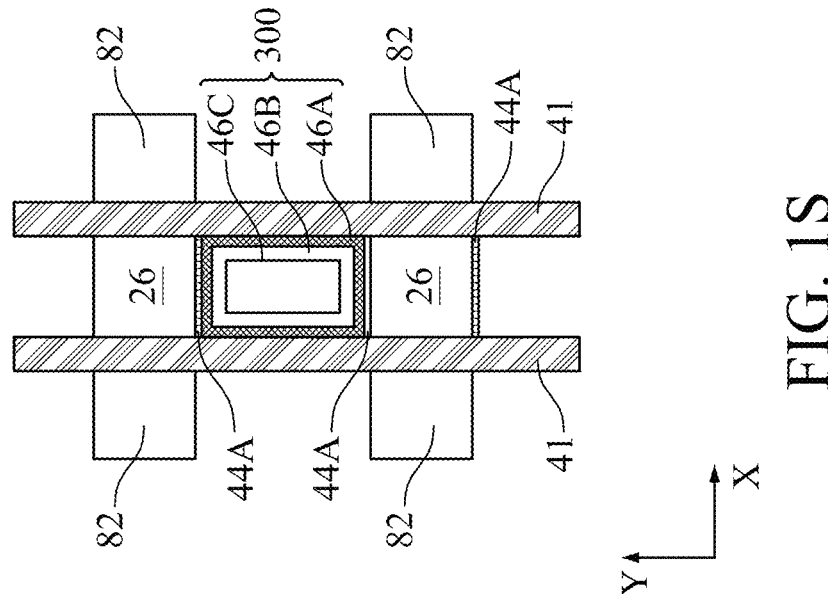
Figure 1R:
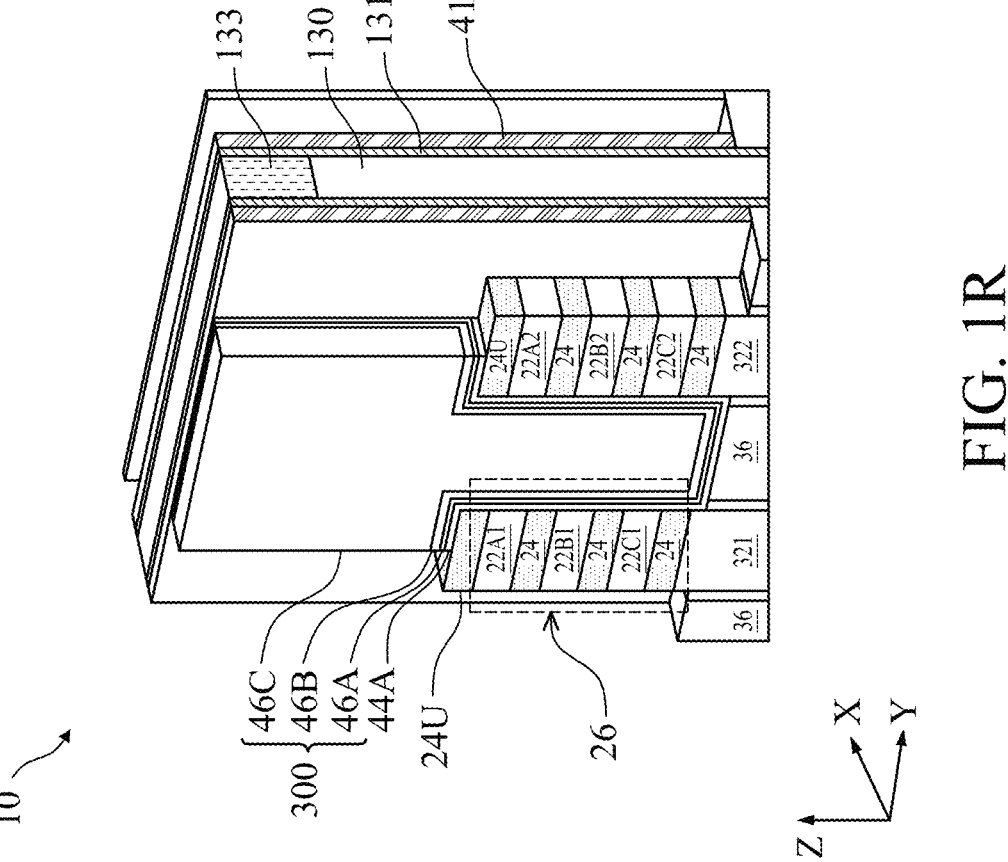
Figure 1T:
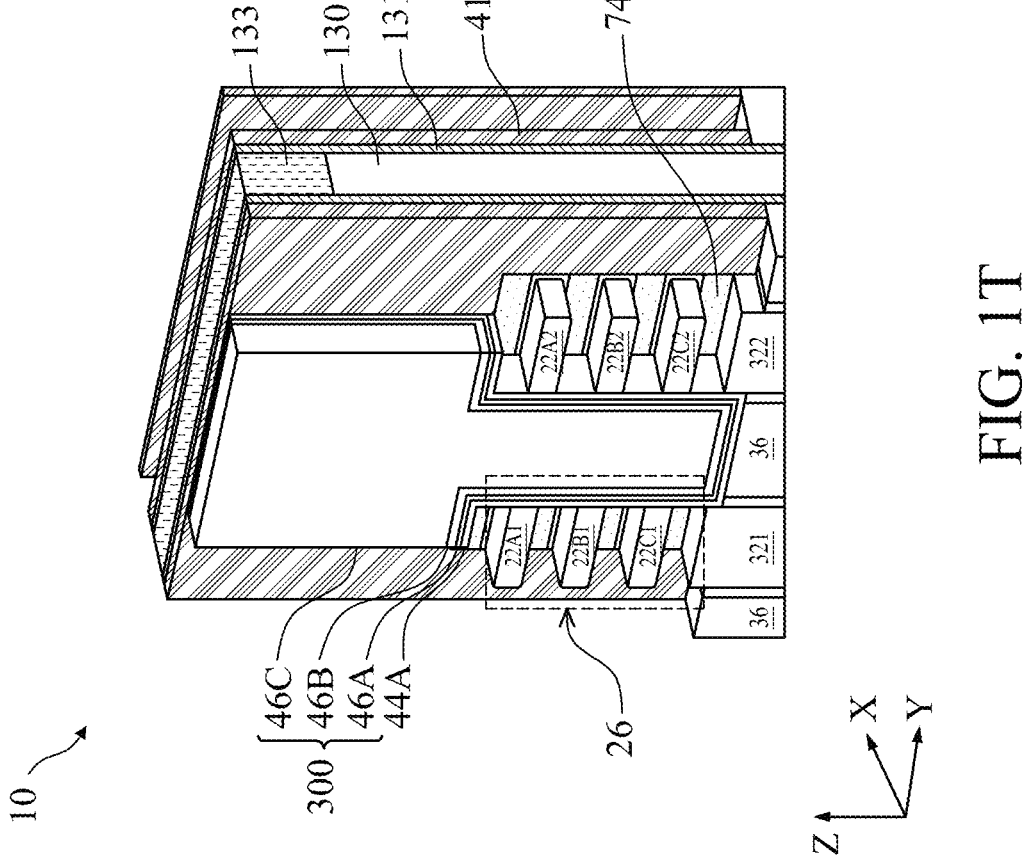
Figure 1U:
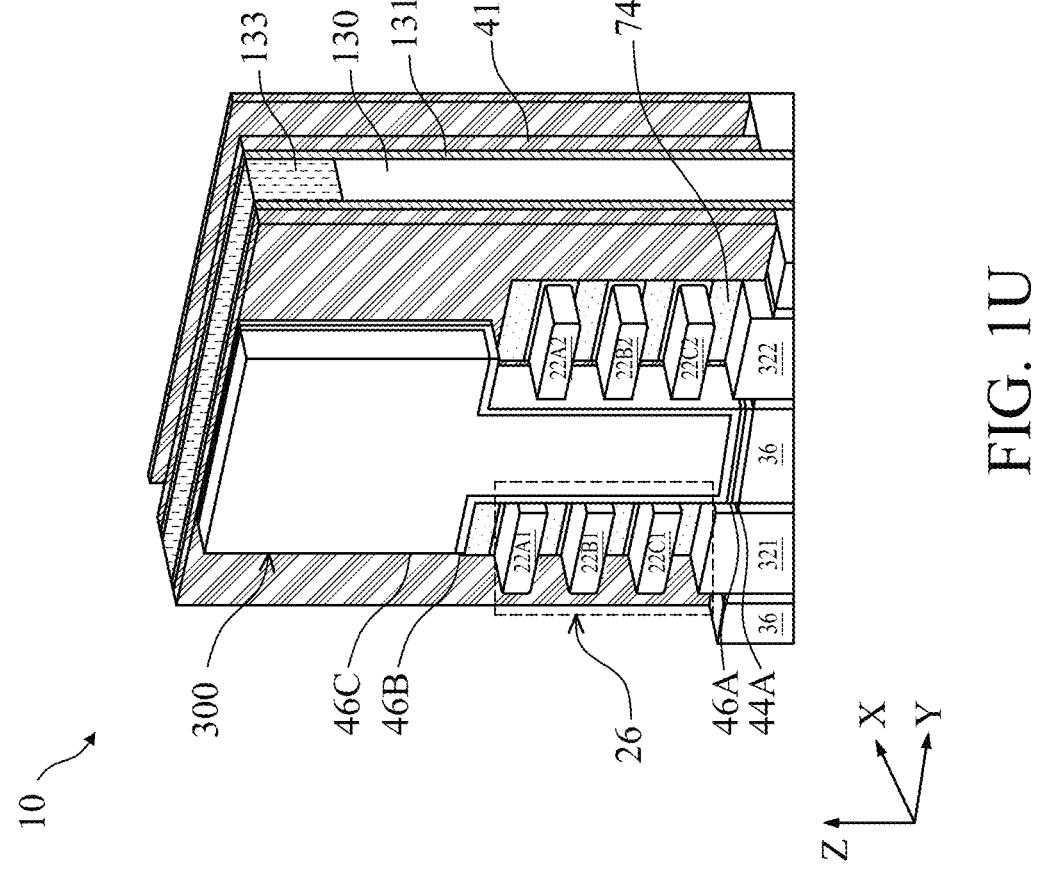
Figure 1V:
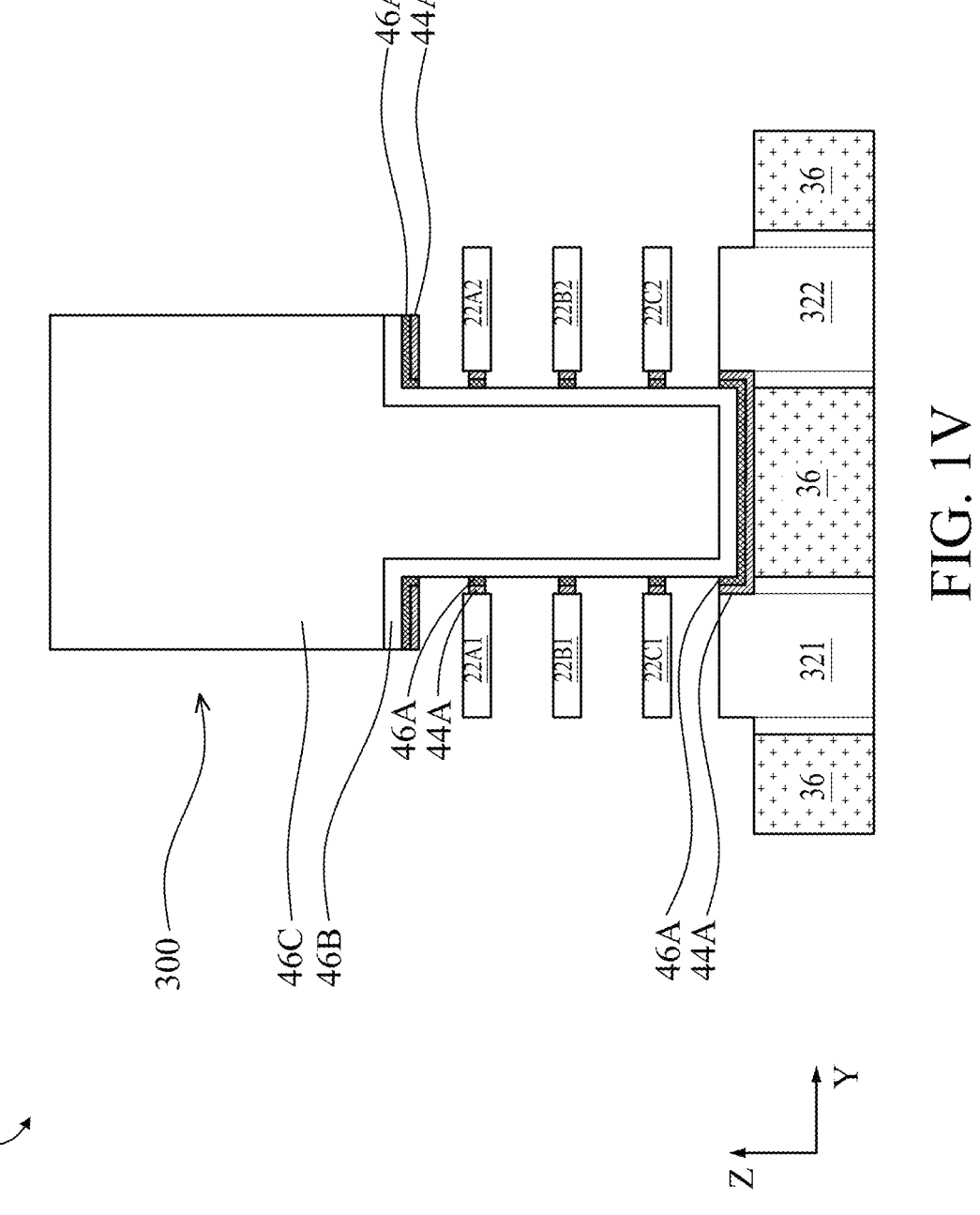
Figure 1W:
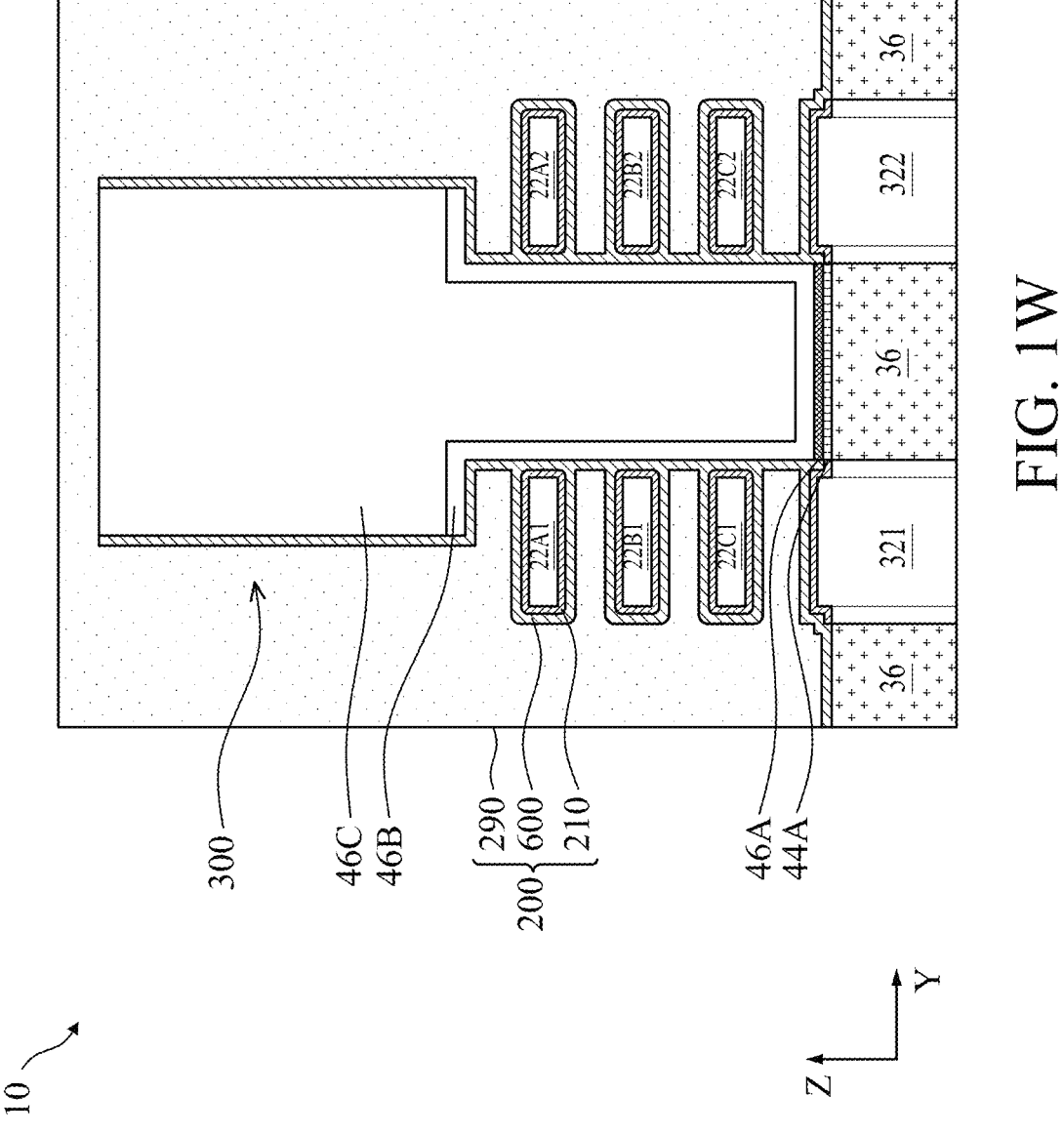
Figure 1X:
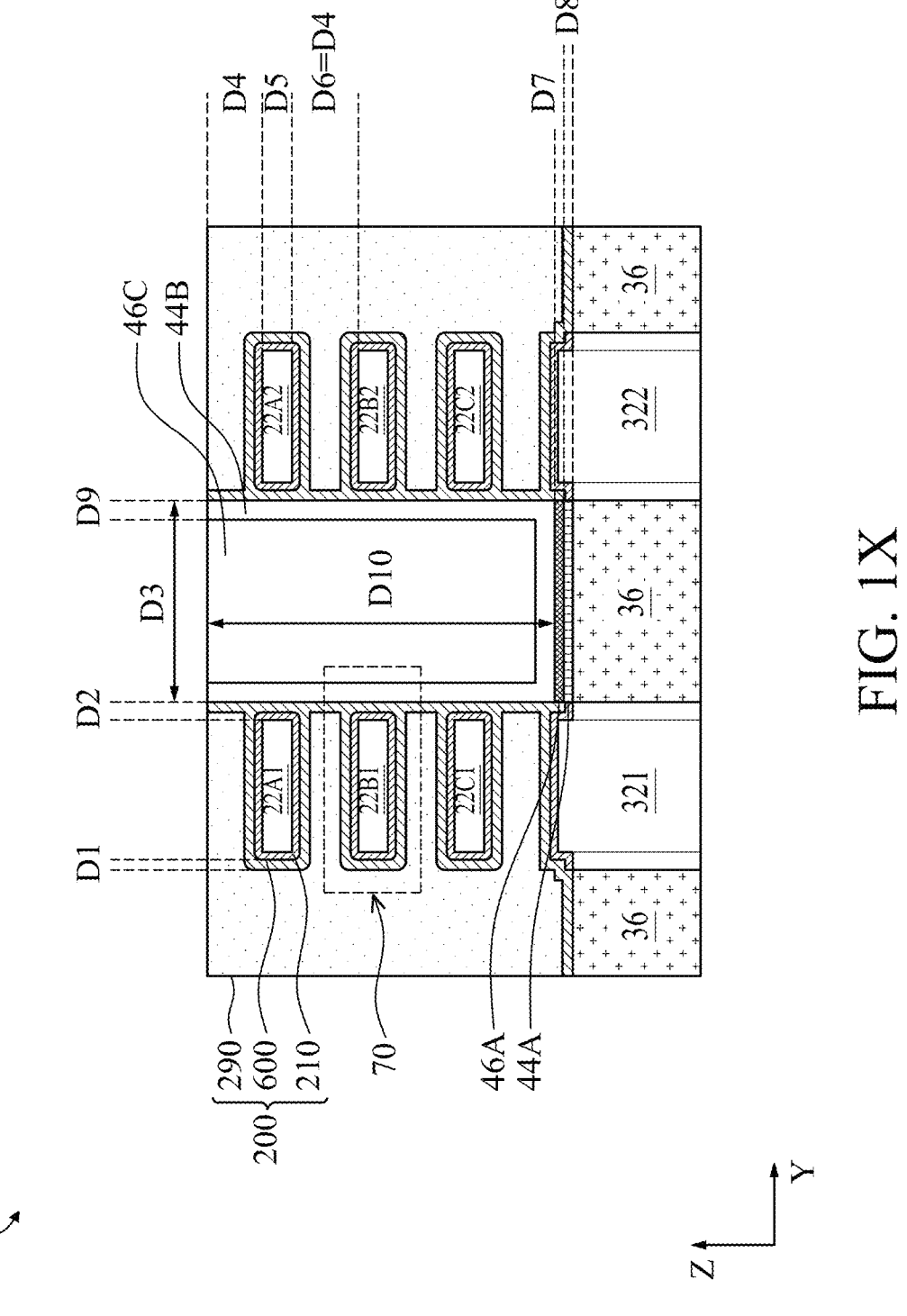
Figure 1Y:
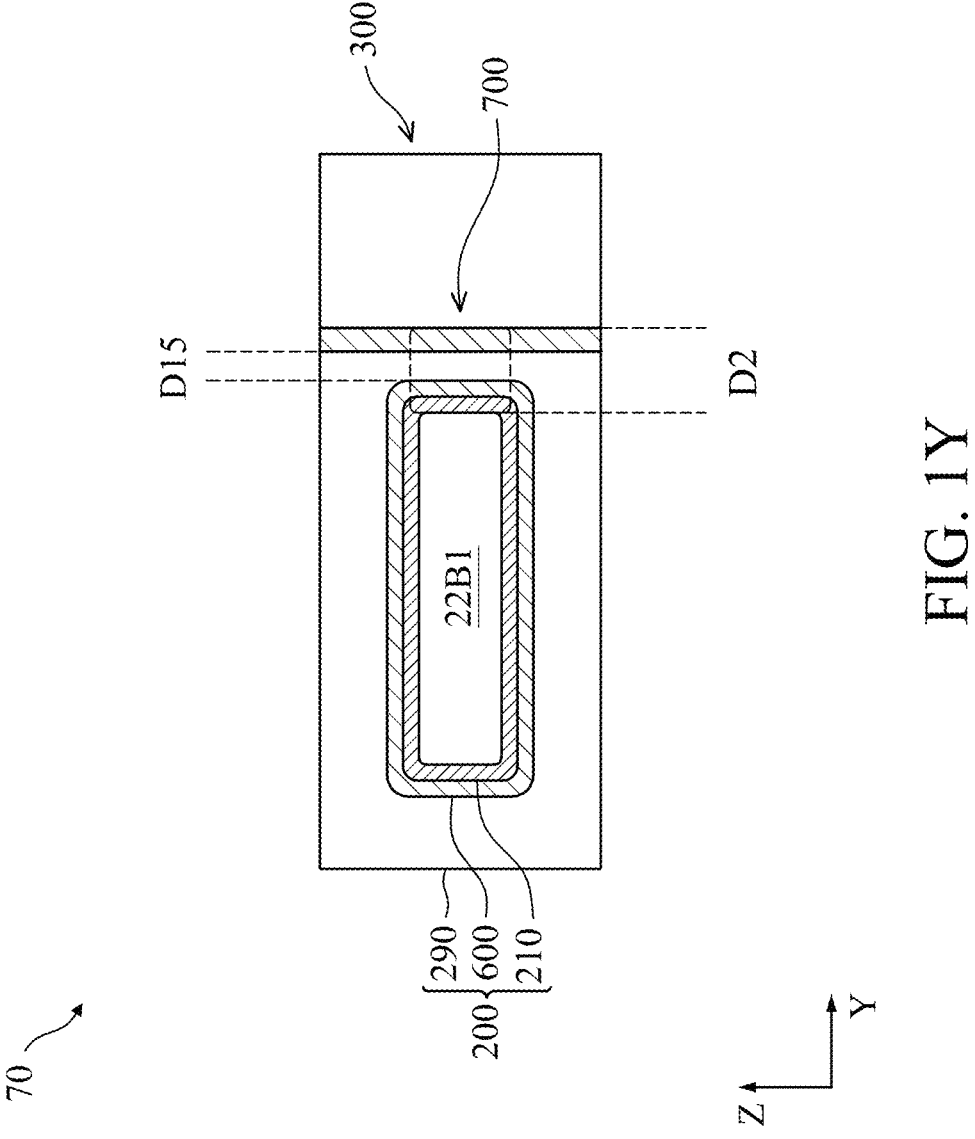
Figure 1Z:
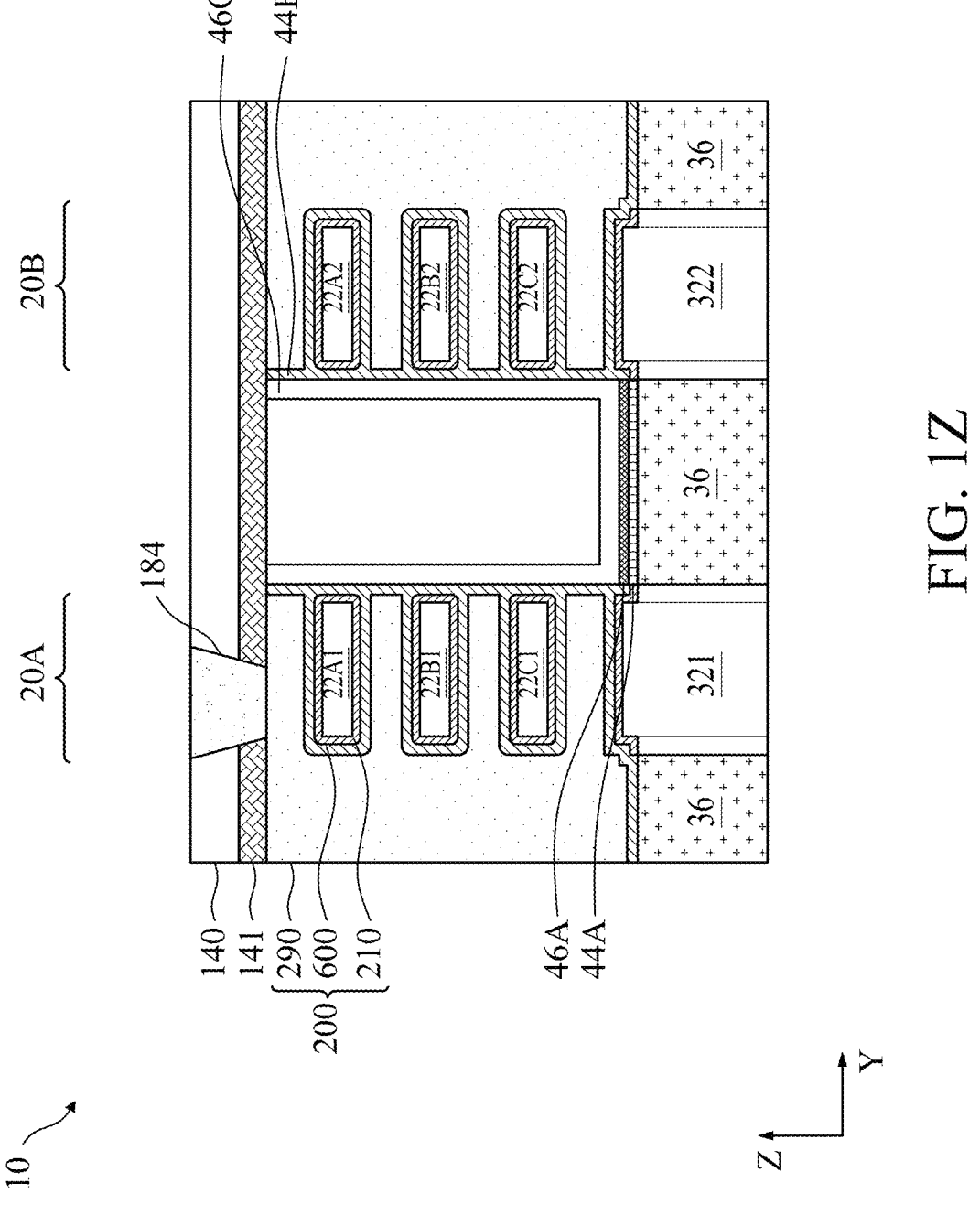

FIGS. 1A-1Z illustrate diagrammatic perspective and cross-sectional top and side views of a portion of an IC device 10 fabricated according to embodiments of the present disclosure, where the IC device 10 includes nanostructure devices 20A, 20B which may be gate-all-around FETs (GAAFETs). FIG. 1A is a diagrammatic perspective view of a portion of the IC device 10 in accordance with various embodiments. Certain features may be removed from view or not labeled intentionally in the views of FIGS. 1A-1Z for simplicity of illustration.

The nanostructure devices 20A, 20B may include an N-type FET (NFET), a P-type FET (PFET), or both. Integrated circuit devices such as the IC device 10 frequently include transistors having different threshold voltages based on their function in the IC device. For example, input/output (IO) transistors typically have the highest threshold voltages, core logic transistors typically have the lowest threshold voltages, and a third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages.

FIGS. 1A-1Z illustrate a method of forming the IC device 10 at various stages of fabrication in accordance with various embodiments. FIGS. 2A-2Z, 3A-3V, 4A-4J and 5 illustrate a method of forming an IC device 10A at various stages of fabrication according to embodiments of the present disclosure. FIG. 6 illustrates a flowchart of a method 1000 for forming an IC device, such as the IC device 10 or the IC device 10A, or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 1A-1Z and FIGS. 2A-2Z, 3A-3V, 4A-4J and 5 at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device or the device as the context requires.

In FIG. 1A, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 1A, a multi-layer stack or "lattice" is formed over the substrate 110 of alternating layers of first semiconductor layers used to form nanostructures or "channels" 22A1, 22B1, 22C1, 22A2, 22B2, 22C2 and second semiconductor layers used to form sacrificial nanostructures 24. Nanostructures 22A1-22C2 and sacrificial nanostructures 24, 24U may be referred to collectively as "the nanostructures 22, 24." In some embodiments, the first semiconductor layers may be formed of a first semiconductor material suitable for n-type nano-FETs, such as silicon, silicon carbide, or the like, and the second semiconductor layers may be formed of a second semiconductor material suitable for p-type nano-FETs, such as silicon germanium or the like. Each of the layers of the multi-layer stack may be epitaxially grown using a process such as chemical vapor deposition (CVD), atomic layer deposition (ALD), vapor phase epitaxy (VPE), molecular beam epitaxy (MBE), or the like. As shown in FIG. 1A, an upper second semiconductor layer for forming an upper sacrificial nanostructure 24U, an optional first semiconductor layer for forming a top silicon 27, an oxide layer for forming oxide layer 28 and hard mask layers for forming hard mask 29 are formed over the top first semiconductor layer. In some embodiments, the oxide layer 28 is a pad oxide layer, and the hard mask layer 29 may include silicon, and may be a multilayer for forming first hard mask layer 29A and second hard mask layer 29B on first hard mask layer 29A. Inclusion of the top silicon 27 may improve (i.e., reduce) interface trap density or "Dit." In some embodiments, the top silicon 27 is not present.

Three layers of each of the first semiconductor layers and the second semiconductor layers form the nanostructures 22, 24 illustrated. In some embodiments, the multi-layer stack may include one or two each or four or more each of the first semiconductor layers and the second semiconductor layers. Although the multi-layer stack that is patterned to form the nanostructures 22, 24 is illustrated as including a second semiconductor layer as the bottommost layer of the multi-layer stack, in some embodiments, the bottommost layer of the multi-layer stack may be a first semiconductor layer.

Due to high etch selectivity between the first semiconductor materials and the second semiconductor materials, the second semiconductor layers of the second semiconductor material may be removed without significantly removing the first semiconductor layers of the first semiconductor material, thereby allowing the first semiconductor layers to be released to form channel regions of nanostructure devices, such as nanosheet FETs. In some embodiments, the first semiconductor layers are removed and the second semiconductor layers are patterned to form channel regions. The high etch selectivity allows the first semiconductor layers of the first semiconductor material to be removed without significantly removing the second semiconductor layers of the second semiconductor material, thereby allowing the second semiconductor layers to be patterned to form channel regions of nanostructure devices.

In FIG. 1A, fins 321, 322 and stacks of nanostructures 22 are formed in the multi-layer stack, corresponding to operation 1100 of FIG. 6. First nanostructures 22A1-22C2 (also referred to collectively as "channels 22") are formed from the first semiconductor layers, and sacrificial nanostructures 24 are formed from the second semiconductor layers. In some embodiments, the nanostructures 22, 24 and the fins 321, 322 may be formed by etching trenches or openings 35 in the multi-layer stack and the substrate 110. The etching may be any acceptable etch process, such as a reactive ion etch (RIE), neutral beam etch (NBE), the like, or a combination thereof. The etching may be anisotropic. Distance between adjacent fins 321, 322 and nanostructures 22, 24 in the Y-axis direction may be from about 18 nm to about 100 nm. The nanostructures 22A1, 22B1, 22C1 and the nanostructures 22A2, 22B2, 22C2 may be referred to as a first stack and a second stack, respectively. The first stack is labeled as fin stack 26 in FIG. 1A.

The fins 321, 322 and the nanostructures 22, 24 may be patterned by any suitable method. For example, one or more photolithography processes, including double-patterning or multi-patterning processes, may be used to form the fins 321, 322 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 321, 322. In some embodiments, the hard mask layer 29 is patterned, for example by a photolithography process, then the pattern is transferred by an etch process to form the fins 321, 322 and the nanostructures 22, 24. Each of the fins 321, 322 and its overlying nanostructures 22, 24 may be collectively referred to as a "fin stack." The fin stack 26 including the fin 321 and the nanostructures 22A1, 22B1, 22C1, 24 is outlined by a dashed line in FIG. 1A. Two fin stacks 26 are shown in FIG. 1A, though fewer or more than two fin stacks may also be formed by the patterning process. In some embodiments, fin stacks 26 overlying a neighboring pair of fins, such as the fins 321, 322, may be separated by a distance in the Y-axis direction of about 40 nm to about 60 nm, or may be separated by a distance in the Y-axis direction shorter than the first distance, for example, in a range of about 20 nm to about 55 nm.

FIG. 1A illustrates the fins 321, 322 having vertically straight sidewalls. In some embodiments, the sidewalls are substantially vertical (non-tapered), such that width of the fins 321, 322 and the nanostructures 22, 24 is substantially similar, and the nanostructures 22, 24 are rectangular in shape (e.g., have rectangular profile in the Y-Z plane). In some embodiments, the fins 321, 322 have tapered sidewalls, such that a width of each of the fins 321, 322 and/or the nanostructures 22, 24 continuously increases in a direction towards the substrate 110. In such embodiments, the nanostructures 22, 24 may have a different width from each other and be trapezoidal in shape (e.g., have trapezoidal profile in the Y-Z plane).

In FIG. 1B, the hard mask 29 and oxide layer 28 are removed, and isolation regions 36, which may be shallow trench isolation (STI) regions, are formed adjacent and between the fins 321, 322. The isolation regions 36 may be formed by depositing an insulation material layer that forms an isolation core 36C in the trenches 35. In some embodiments, the insulation material layer is formed over the substrate 110, the fins 321, 322, and nanostructures 22, 24, and between adjacent fins 321, 322 and nanostructures 22, 24. The insulation material layer may be an oxide, such as silicon oxide, a nitride, the like, or a combination thereof, and may be formed by high-density plasma CVD (HDP-CVD), flowable CVD (FCVD), the like, or a combination thereof. In some embodiments, an isolation liner 36L is first formed along surfaces of the substrate 110, the fins 321, 322, and the nanostructures 22, 24. Thereafter, the isolation core 36C may be formed over the liner 36L of a material such as those discussed above.

The insulation material layer undergoes a removal process, such as a chemical mechanical polish (CMP), an etch-back process, combinations thereof, or the like, to remove excess insulation material of the insulation material layer over hard mask 29, leaving the isolation liner 36L and the isolation core 36C, as shown in FIG. 1B. The isolation core 36C and the isolation liner 36L may be referred to collectively as "the isolation region 36." In the figures, although both the isolation core and the isolation liner are illustrated, the isolation regions 36 may be labeled simply with the reference numeral "36" overlying the isolation core to simplify illustration.

In FIG. 1B, following formation of the isolation regions 36, an optional capping layer 27A, which may be silicon, may be formed on an upper surface of the top silicon 27, sidewalls of the nanostructures 22, 24, and upper surface of the isolation liner 36L when present. The capping layer 27A may further reduce Dit.

Following formation of the capping layer 27A or following formation of the isolation regions 36 when the capping layer 27A is not formed, sacrificial dielectric layers 44A, 44B are formed as conformal layers on exposed surfaces of the top silicon 27 when present, the nanostructures 22, 24 and the isolation regions 36. The sacrificial dielectric layers 44A, 44B may be referred to collectively as "the dielectric liner 44." A first sacrificial dielectric layer 44A may include a first dielectric material, which may be SiN in some embodiments. A second sacrificial dielectric layer 44B may include a second dielectric material different than the first dielectric material, which may be SiO in some embodiments. The first sacrificial dielectric layer 44A may be used as an endcap dielectric for selecting a dimension of the endcap.

In FIG. 1C, following formation of the isolation regions 36, sacrificial gate structures 45 are formed over the fins 321, 322, the isolation regions 36 and the nanostructures 22, 24, with the sacrificial dielectric liner 44 therebetween, corresponding to act 1200 of FIG. 6. Two sacrificial gate structures 45 are shown in FIG. 1C, and many further sacrificial gate structures 45 may be formed substantially parallel to and concurrently with the sacrificial gate structures 45 shown.

In FIG. 1C, when forming the sacrificial gate structures 45, a sacrificial gate layer is formed on the sacrificial dielectric liner 44 over the fins 321, 322 and/or the nanostructures 22, 24. The sacrificial gate layer 45 may be made of materials that have a high etch selectivity to one or more of the first and second sacrificial dielectric layers 44A, 44B of the sacrificial dielectric liner 44. The sacrificial gate structures 45 may be conductive, semiconductive, or non-conductive material and may be or include amorphous silicon, polycrystalline-silicon (polysilicon), poly-crystalline silicon-germanium (poly-SiGe), metallic nitrides, metallic silicides, metallic oxides, and metals. The sacrificial gate structures 45 may be deposited by physical vapor deposition (PVD), CVD, sputter deposition, or other techniques for depositing the selected material. One or more mask layers may be formed over the sacrificial gate layer, and may include, for example, silicon nitride, silicon oxynitride, or the like. The mask layers may be used as a mask to etch exposed regions of the sacrificial gate layer to form the sacrificial gate structures 45.

In FIG. 1D, following formation of the sacrificial gate structures 45, exposed regions of the sacrificial dielectric liner 44 may be removed or "trimmed" by one or more suitable etching operations. For example, a first etching operation may remove exposed regions of the second sacrificial dielectric layer 44B, thereby exposing the first sacrificial dielectric layer 44A. Then, a second etching operation may remove exposed regions of the first sacrificial dielectric layer 44A, thereby exposing portions of the nanostructures 22, 24 and the isolation regions 36 adjacent (i.e., not underneath) the sacrificial gate structures 45.

In FIG. 1E, following formation of the sacrificial gate structures 45 and trimming of the sacrificial dielectric liner 44, one or more gate spacer or "sidewall spacer" layers 41 are formed covering the sacrificial gate structures 45 and exposed regions of the stacks 26, the fins 321, 322 and the isolation regions 36. The gate spacer layer 41 is formed by any suitable deposition process, such as a PVD, CVD, ALD, or the like. Following formation of the gate spacer layer 41, horizontal portions (e.g., in the X-Y plane) of the gate spacer layer 41 may be removed, thereby exposing upper surfaces of the stacks 26 and the isolation regions 36. In some embodiments, capping portions or "fin spacers" 41F of the gate spacer layer 41 remain over edge regions of the isolation regions 36 after removal of the horizontal portions of the gate spacer layer 41.

Following removal of the horizontal portions of the gate spacer layer 41, one or more removal operations are performed to recess the stacks 26, the isolation regions 36 and the fins 321, 322 exposed through the gate spacer layer 41. The removal operations may include suitable etch operations for removing materials of the channels 22, the second semiconductor layers 24, the fins 321, 322 and the isolation regions 36, such as RIE, NBE, ALE, or the like. In some embodiments, the capping portions 41F of the gate spacer layer 41 remain over edge regions of the isolation regions 36 after recessing of the stacks 26 and the fins 321, 322.

The gate spacers 41 are disposed above the channel 22A1, which is the uppermost channel 22 of the channels 22A1-22C1. The gate spacers 41 may include a dielectric material, for example a low-k material such as SiOCN, SiON, SiN, or SiOC. The fin spacers 41F may remain following recessing of the fins 321, 322 and prior to forming the source/drain regions 82. The fin spacers 41F may extend in the first direction (e.g., the X-axis direction). The fin spacers 41F may be positioned to abut source/drain regions formed in a later operation (e.g., the source/drain regions 82 of FIG. 1G). As such, the source/drain regions 82 may have one side in contact with the fin spacers 41F. The fin spacers 41F may be in contact with the source/drain region 82, the isolation region 36, and an etch stop layer 131 that is formed following formation of the source/drain regions 82 (see FIG. 1H).

In FIGS. 1E and 1F, inner spacers 74 are formed. A selective etching process is performed to recess exposed end portions of the nanostructures 24 without substantially attacking the nanostructures 22. After the selective etching process, recesses are formed in the nanostructures 24 at locations where the removed end portions used to be. Next, an inner spacer layer is formed to fill the recesses between the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses in the nanostructures 24) form the inner spacers 74. The resulting structure is shown in FIGS. 1E and 1F.

In some embodiments, due to the presence of the fin spacers 41F, regions of the isolation regions 36 exposed by the fin spacers 41F may be recessed slightly relative to regions (e.g., peripheral regions) of the isolation regions 36 protected by the fin spacers 41F.

FIG. 1G illustrates formation of the source/drain regions 82, corresponding to act 1300 of FIG. 6. Source/drain region(s) may refer to a source or a drain, individually or collectively dependent upon the context. In the illustrated embodiment, the source/drain regions 82 are epitaxially grown from epitaxial material(s). The source/drain regions 82 are grown on exposed portions of the fins 321, 322 and contact the nanostructures 22 and the fin spacers 41F. Initially, the source/drain regions 82 grow between neighboring isolation structures 36. The fin spacers 41F on the isolation structure 36 laterally confine the source/drain regions 82 as they grows upward from the fins 321, 322. In some embodiments, the source/drain regions 82 exert stress in the respective channels 22, thereby improving performance. The source/drain regions 82 are formed such that each sacrificial gate structure 45 is disposed between respective neighboring pairs of the source/drain regions 82. In some embodiments, the spacer layer 41 and the inner spacers 74 separate the source/drain regions 82 from the sacrificial gate structure 45 by an appropriate lateral distance (e.g., in the X-axis direction) to prevent electrical bridging to subsequently formed gate structures 200 of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 over two neighboring fins of the fins 321, 322.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth.

In FIGS. 1H and 1I, following formation of the source/drain regions 82, a dielectric layer or "contact etch stop layer (CESL)" 131 is formed on exposed surfaces of the sidewall spacers 41, the source/drain regions 82 and the isolation regions 36. The CESL 131 is conformally deposited on the sacrificial gate structures 45, the sidewall spacers 41, the source/drain regions 82 and the isolation regions 36. An interlayer dielectric (ILD) 130 is deposited on the CESL 131.

The CESL 131 can provide a mechanism to stop an etching process when forming source/drain contacts to the source/drain regions 82. The CESL 131 may be formed of a dielectric material having a different etch selectivity from the adjacent ILD layer 130. The material of the CESL 131 may include silicon nitride (SiN or Si3N4), silicon carbon nitride (SiCN) or a combination thereof, and may be deposited by CVD, PECVD, ALD, or another deposition process. In some examples, the CESL 131 has a thickness in a range from about 2 nm to about 5 nm. The material of the ILD layer 130 may include silicon dioxide or a low-k dielectric material (e.g., a material having a dielectric constant (k-value) lower than the k-value (about 3.9) of silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide (SiOxCy), Spin-On-Glass (SOG) or a combination thereof. The ILD layer 130 may be deposited by spin-on coating, CVD, Flowable CVD (FCVD), PECVD, PVD, or another deposition process.

Following formation of the CESL 131 and the ILD 130, a planarization process, for example a chemical mechanical polishing (CMP) process, is performed on the ILD layer 130 and the CESL 131. Hard masks on the sacrificial gate structures 45 and upper portions of the sidewall spacers 41 are also removed in the planarization process. After the planarization process, the sacrificial gate structure 45 is exposed. The top surfaces of the ILD 130 and the CESL 131 may be coplanar with the top surfaces of the sacrificial gate structures 45 and the sidewall spacers 41.

In some embodiments, following planarization of the ILD 130, the CESL 131, the sacrificial gate structures 45 and the sidewall spacers 41, the ILD 130 is recessed by a suitable etching operation, and an ILD cap 133 is formed over the ILD 130, as shown in FIG. 1H. The ILD cap 133 protects the ILD 130 during removal of the second sacrificial dielectric layer 44B during a replacement gate operation, as the second sacrificial dielectric layer 44B may be the same material as the ILD 130.

In FIG. 1H, following formation of the CESL 131, the ILD 130 and the ILD cap 133, the sacrificial gate structures 45 are removed, corresponding to act 1400 of FIG. 6. The removal may be by a suitable etching operation, for example, that is selective to material of the sacrificial gate structures 45 without substantially attacking the sidewall spacers 41 and the ILD cap 133. In some embodiments, the sacrificial gate layer 45 is removed by an anisotropic dry etch process. For example, the etching process may include a dry etch process using reaction gas(es) that selectively etch the sacrificial gate layer 45 without etching the sidewall spacers 41. Removal of the sacrificial gate structures 45 may terminate on the second sacrificial dielectric layer 44B, which may act as an etch stop layer during the etching process. Following removal of the sacrificial gate structures 45, remaining portions of the second sacrificial dielectric layer 44B are removed by a suitable etching operation. As shown in FIGS. 1H and 1I, the first sacrificial dielectric layer 44A remains covering the nanostructures 22, 24, the fins 321, 322 and the isolation regions 36. The opening or space remaining after removing the sacrificial gate structure 45 may be referred to as a "trench" or a "gate trench."

FIGS. 1J-1S illustrate formation of a wall structure 300, corresponding to act 1500 of FIG. 6. The wall structure is formed in the trench 39 labeled in FIG. 1H.

In FIGS. 1J and 1K, following removal of the sacrificial gate structures 45 and the second sacrificial dielectric layer 44B, a first wall dielectric layer 46A is formed on exposed surfaces of the first sacrificial dielectric layer 44A, the sidewall spacers 41, the CESL 131 and the ILD cap 133. The first wall dielectric layer 46A may be a high-k dielectric liner having dielectric constant "k" greater than about 3.9 and less than about 7. In some embodiments, the first wall dielectric layer 46A includes a metal oxide, which may be LaO, AlO, AlON, ZrO, HfO, ZnO, ZrN, ZrAlO, TiO, TaO, YO or the like. The first wall dielectric layer 46A may be deposited using CVD, physical vapor deposition (PVD) or atomic layer deposition (ALD). The first wall dielectric layer 46A has high etch selectivity to a second wall dielectric layer 46B, which may be a low-k dielectric liner including a dielectric material, which may be SiO2, SiN, SiCN, SiOC, SiOCN having k less than about 7. The first wall dielectric layer 46A is advantageous as an etch stop layer in a later etching operation.

Following formation of the first wall dielectric layer 46A, the second wall dielectric layer 46B may be formed by a suitable deposition process, which may be CVD, PVD, ALD, or the like. The second wall dielectric layer 46B may be a conformal liner layer formed directly on the first wall dielectric layer 46A. As shown in FIG. 1K, the first wall dielectric layer 46A may be in direct contact with the first sacrificial dielectric layer 44A on two sides, and may be in direct contact with the sidewall spacers 41 on two other sides. In some embodiments, the second and third wall dielectric layers 46B, 46C are the same or different materials from each other.

Next, in FIGS. 1L and 1M, following formation of the second wall dielectric layer 46B, the second wall dielectric layer 46B is patterned to select location of a wall structure 300 that is formed in a later operation. In some embodiments, a masking layer 500, which may include one or more layers of photoresist and an anti-reflective coating (e.g., a back-side anti-reflective coating, or "BARC") may be formed over the second wall dielectric layer 46B and patterned to expose some portions of the second wall dielectric layer 46B while protecting other portions of the second wall dielectric layer 46B, as shown in FIG. 1L. Following patterning of the masking layer 500, exposed portions of the second wall dielectric layer 46B are removed by a suitable etching process, while protected portions thereof remain. Vertical edges of the masking layer 500 may be directly above the fin stacks 26, for example, landing at about centers of the fin stacks 26 along the Y-axis direction. As such, the remaining portions of the second wall dielectric layer 46B following patterning may partially overlap the fin stacks 26 along the Y-axis direction. The masking layer 500 also protects a portion of the second wall dielectric layer 46B overlying the ILD cap 133, such that the top of the second wall dielectric layer 46B is higher than the ILD cap 133. In the etching operation that patterns the second wall dielectric layer 46B, the first wall dielectric layer 46A may act as an etch stop layer, such that the etching operation may terminate on reaching the first wall dielectric layer 46A.

In FIGS. 1N and 1O, following patterning of the second wall dielectric layer 46B, a third wall dielectric layer 46C is formed in the gate trench over the first wall dielectric layer 46A and the second wall dielectric layer 46B. The third wall dielectric layer 46C may further be formed over the ILD 130 and ILD cap 133, as shown in FIG. 1N. As such, the top of the third wall dielectric layer 46C may be higher than the ILD cap 133 and the top of the gate trench. The third wall dielectric layer 46C may include SiO2, SiN, SiCN, SiOC, SiOCN, or another suitable dielectric material having k<7. The third wall dielectric layer 46C may be formed by a CVD, PVD, ALD, or other suitable deposition process. During deposition of the third wall dielectric layer 46C, the material thereof may initially deposit on exposed horizontal and vertical surfaces of the first wall dielectric layer 46A and the second wall dielectric layer 46B. As shown in FIG. 1O, due to reduced space where the second wall dielectric layer 46B is located, material of the third wall dielectric layer 46C merges between the fin structures 26 and the sidewall spacers 41, such that few or no voids are present in the third wall dielectric layer 46C between sidewalls of the second wall dielectric layer 46B.

In FIGS. 1P and 1Q, the third wall dielectric layer 46C is pulled back using the first wall dielectric layer 46A as an etch stop layer. The pulling back may be a suitable etching process that is selective to material of the third wall dielectric layer 46C without substantially attacking material of the first wall dielectric layer 46A.

In FIGS. 1R and 1S, exposed portions of the first wall dielectric layer 46A and the first sacrificial dielectric layer 44A are removed. The exposed portions of the first wall dielectric layer 46A may be removed by a first etching process that is selective to the material of the first wall dielectric layer 46A. Next, the exposed portions of the first sacrificial dielectric layer 44A may be removed by a second etching process that is selective to the material of the first sacrificial dielectric layer 44A, resulting in the structure shown in FIG. 1R. The first, second and third wall dielectric layers 46A-46C may be referred to collectively as a wall structure 300.

In FIG. 1T, the channels 22 are released by removal of the nanostructures 24, corresponding to act 1600 of FIG. 6. After the nanostructures 24 are removed, the nanostructures 22 form a plurality of nanosheets that extend horizontally (e.g., parallel to a major upper surface of the substrate 110). The nanosheets may be collectively referred to as the channels 22 of the nanostructure devices 20A, 20B formed. In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs. In some other embodiments, the nanostructures 22 may be removed and the nanostructures 24 may be patterned to form channel regions of both PFETs and NFETs.

In some embodiments, the nanosheets 22 of the nanostructure devices 20A, 20B are reshaped (e.g. thinned) by a further etching process to improve gate fill window. The reshaping may be performed by an isotropic etching process selective to the nanosheets 22. After reshaping, the nanosheets 22 may exhibit a dog bone shape in which middle portions of the nanosheets 22 are thinner than peripheral portions of the nanosheets 22 along the X-axis direction.

Figure 7:
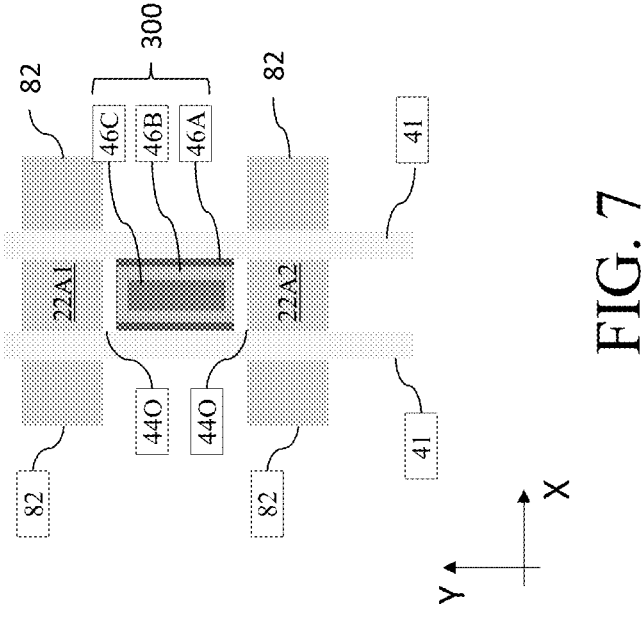

In FIGS. 1U and 7, following releasing of the channels 22, exposed portions of the first sacrificial dielectric layer 44A and the first wall dielectric layer 46A are removed, resulting in the structure shown in FIG. 1U. Exposed portions of the first sacrificial dielectric layer 44A may be removed by a first etching process, which may be an isotropic etching process selective to the material of the first sacrificial dielectric layer 44A that does not substantially attack materials of the wall structure 300, the sidewall spacers 41, the isolation regions 36, the inner spacers 74, the channels 22 and the fins 321, 322. Following removal of the exposed portions of the first sacrificial dielectric layer 44A, exposed portions of the first wall dielectric layer 46A are removed by a second etching process, which may be an isotropic etching process selective to the material of the first wall dielectric layer 46A.

In some embodiments, in the region laterally between the channel 22 and the wall structure 300, the first sacrificial dielectric layer 44A and the first wall dielectric layer 46A are removed completely or substantially completely, which is shown in FIG. 1U. In some embodiments, as shown in FIG. 7, at least some portion of one or more of the first sacrificial dielectric layer 44A and the first wall dielectric layer 46A remain between the channel 22 and the wall structure 300. The region between the side of the channels 22 adjacent the wall structure 300 and the wall structure 300 is referred to as an endcap region. The endcap region may have width in the Y-axis direction in a range of about 2 nm to about 5 nm.

Also, as shown in FIG. 7, adjacent the isolation region 36 under the wall structure 300 and the fins 321, 322, the first sacrificial dielectric layer 44A and the first wall dielectric layer 46A may remain between the fins 321, 322 and the second wall dielectric layer 46B. In the embodiment shown in FIG. 1U, the first sacrificial dielectric layer 44A and the first wall dielectric layer 46A are pulled back from the fins 321, 322, such that ends of the sacrificial dielectric layer 44A and the first wall dielectric layer 46A are substantially coplanar with vertical sidewalls of the second wall dielectric layer 46B.

In FIG. 1V, some portions of the first sacrificial dielectric layer 44A and the first wall dielectric layer 46A may remain on the underside of horizontally extended portions of the second wall dielectric layer 46B above the uppermost channels 22A1, 22A2. In the embodiment shown in FIG. 1U, the first sacrificial dielectric layer 44A and the first wall dielectric layer 46A may be substantially completely removed from the underside of the horizontally extended portions of the second wall dielectric layer 46B above the uppermost channels 22A1, 22A2.

In FIG. 1W, gate structures 200 are formed, corresponding to act 1700 of FIG. 6. The gate structures 200 may be formed by one or more deposition operations, such as a PVD, CVD, ALD, or the like. Each gate structure 200, generally includes an interfacial layer (IL, or "first IL") 210, at least one gate dielectric layer 600 and a conductive core layer 290. In some embodiments, each replacement gate 200 further includes a second interfacial layer and one or more work function layers.

In some embodiments, the first IL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms. As shown in FIG. 1W, the first IL 210 may be present all around each of the channels 22. When the first sacrificial dielectric layer 44A and the first wall dielectric layer 46A remain between the channels 22 and the wall structure 300, the first IL 210 may not be present on surfaces of the channels 22 that face the wall structure 300, namely the surface of the channels 22 on which the first sacrificial dielectric layer 44A and the first wall dielectric layer 46A remain.

The gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the gate dielectric layer 600 to have a thickness in a range between about 10 angstroms and about 100 angstroms.

As shown in FIG. 1W, the gate dielectric layer 600 may be a continuous layer that conforms to (e.g., is in contact with) sidewalls of the second and third wall dielectric layers 46B, 46C of the wall structure 300 and the first IL 210. In the endcap, the gate dielectric layer 600 may merge to form a continuous layer, as shown in FIG. 1W. In some embodiments, the gate dielectric layer 600 fully fills the space in the endcap between the first IL 210 and the second wall dielectric layer 46B. In some embodiments, the gate dielectric layer 600 merges but does not fully fill the space in the endcap. In such embodiments, one or more of a work function metal layer and a conductive core layer 290 may fill space remaining between the gate dielectric layer 600 and the second wall dielectric layer 46B. Thickness of the space between the gate dielectric layer 600 and the second wall dielectric layer 46B may be less than about 1 nm. When thickness of the space is above about 1 nm, AC performance may be degraded.

When the first sacrificial dielectric layer 44A and the first wall dielectric layer 46A are pulled back from the fins 321, 322, the gate dielectric layer 600 may extend into the respective spaces between the fins 321, 322 and the wall structure 300, as shown in FIG. 1W. When formed in the embodiment of FIG. 1V, the gate dielectric layer 600 may cover exposed portions of the first sacrificial dielectric layer 44A and the first wall dielectric layer 46A on sidewalls of the fins 321, 322 and on the underside of the second wall dielectric layer 46B.

In some embodiments, the gate dielectric layer 600 includes a high-k dielectric material, which may refer to dielectric materials having a high dielectric constant that is greater than a dielectric constant of about 3.9. Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the nanostructure devices 20A, 20B.

One or more work function metal layers may be formed on the gate dielectric layer 600. The work function metal layers may include at least one of an N-type work function metal layer, an in-situ capping layer, or an oxygen blocking layer, which may be formed on a work function barrier layer, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 1W further illustrates the conductive core layer 290. In some embodiments, a glue layer (not separately illustrated) is formed between the oxygen blocking layer of the work function metal layer and the conductive core layer 290. The glue layer may promote and/or enhance the adhesion between the conductive core layer 290 and the work function metal layer. In some embodiments, the glue layer may be formed of a metal nitride, such as TiN, TaN, MoN, WN, or another suitable material, using ALD. In some embodiments, thickness of the glue layer is between about 10 A and about 25 A. The conductive core layer 290 may be formed on the glue layer, and may include a conductive material such as tungsten, cobalt, ruthenium, iridium, molybdenum, copper, aluminum, or combinations thereof. In some embodiments, the conductive core layer 290 may be deposited using methods such as CVD, PVD, plating, and/or other suitable processes. In some embodiments, a seam, which may be an air gap, is formed in the conductive core layer 290 vertically between the channels (e.g., the channels 22A2, 22B2). In some embodiments, the conductive core layer 290 is conformally deposited on the work function metal layer. The seam may form due to sidewall deposited film merging during the conformal deposition. In some embodiments, the seam is not present between the neighboring channels 22A2, 22B2.

In some embodiments, an upper surface of the conductive core layer 290 may be above the wall structure 300, such that the conductive core layer 290 covers the upper surface of the wall structure 300.

In FIG. 1X, following formation of the gate structure 200, a removal operation, which may include grinding, CMP or the like, is performed which removes material of the upper portion of the wall structure 300, the gate structure 200, the sidewall spacers, the ILD cap 133, the CESL 131 and the ILD 130. Following the removal operation, as shown in FIG. 1X, the upper surface of the wall structure 300 is level with the upper surface of the gate structure 200, such that the wall structure 300 isolates regions of the gate structure 200 on either side thereof from each other.

FIG. 1X illustrates dimensions D1, D2, D3, D4, D5, D6, D7, D8, D9 and D10. The dimension D1 is thickness of the gate dielectric 600 or extension of the gate dielectric 600 beyond a sidewall of the first IL 210 facing away from the wall structure 300, which may be in a range of about 1 nm to about 2 nm. The dimension D2 is separation between the channel 22 and the wall structure 300, which may be in a range of about 2 nm to about 5 nm. The dimension D3 is width of the wall structure 300 in the Y-axis direction, which may be in a range of about 10 nm to about 30 nm. The dimension D4 is extension of the gate structure 200 above the upper surface of the uppermost channel 22A1, 22A2, which may be in a range of about 5 nm to about 15 nm. The dimension D5 is height of the channels 22 in the Z-axis direction, which may be in a range of about 3 nm to about 8 nm. The dimension D6 is vertical separation between adjacent channels 22 (e.g., between the channels 22A2 and 22B2), which may be in a range of about 5 nm to about 15 nm, and is the same as or substantially equal to the dimension D4 in some embodiments, which is advantageous for improving uniformity of performance between nanosheets 22, such as for improving uniformity of threshold voltage among the nanosheets 22. A person having skill in the art will be able to determine the meaning of "substantially equal" as regards the distances D4 and D6 based on one or more of material of the conductive core layer 290, process used to select the thickness of the gate structure 200 over the uppermost channels 22 (e.g., a CMP), selected thickness (e.g., the dimension D4), and the like. For example, a CMP used to trim thickness of the gate structure 200 over the uppermost channels 22A1, 22A2 may have a process variation associated therewith. Similarly, the distance D6 may be associated with a process variation of an epitaxial growth operation used to form the nanostructures 24 and an etch operation that removes the nanostructures 24, which affect the distance D6 between the nanostructures 22. These various process variations are known to those skilled in the art.

The dimension D7 is thickness of the first wall dielectric layer 46A, for example, directly over the isolation region 36, which may be in a range of about 1 nm to about 3 nm. The dimension D8 is thickness of the first sacrificial dielectric layer 44A, for example, between the wall structure 300 and the isolation region 36, which may be in a range of about 1 nm to about 3 nm. The dimension D9 is thickness (e.g., in the Y-axis direction) of the second wall dielectric layer 46B, which may be in a range of about 1 nm to about 4 nm. The dimension D10 is height of the wall structure 300 not inclusive of the first wall dielectric layer 46A, and is generally greater than height of the fin stack 26. In some embodiments, the dimension D10 is in a range of about 8 nm to about 200 nm, such as about 10 nm to about 100 nm. Although not specifically labeled, downward vertical extension of the wall structure 300 beneath the upper surface of the fins 321, 322 may be in a range of about 5 nm to about 10 nm, though other suitable ranges may be ascertained by those having skill in the art.

FIG. 1Y is a detailed view of region 70 of FIG. 1X. In some embodiments, as shown in FIG. 1Y, the gate dielectric 600 does not fully merge in the endcap 700 between channel 22 (e.g., the channel 22B1) and the wall structure 300. During formation of metal layers on the gate dielectric 600, such as a work function metal layer and/or the conductive core layer 290, the metal layers may extend into and merge in the endcap between portions of the gate dielectric 600 on sidewalls of the wall structure 300 and the first IL 210. A distance D15 is thickness of the metal layers in the endcap, which may be less than about 1 nm in some embodiments. Greater than about 1 nm, the thickness of the metal layers may degrade AC performance of the device 10.

In FIG. 1Z, a gate via 184 is formed to contact the gate structure 200 to provide electrical connection between the gate structure 200 and one or more other electrical devices of the IC device 10 or external to the IC device 10. A second ESL 141 may be formed as a conformal layer on the gate structure 200 and the wall structure 300, then a second ILD 140 may be formed on the second ESL 141. In some embodiments, the second ESL 141 includes a material described with reference to the CESL 131. In some embodiments, the second ILD 140 includes a material described with reference to the ILD 130. An opening may be formed through the second ILD 140 and the second ESL 141 that exposes the gate structure 200, and the gate via 184 may be formed in the opening on the gate structure 200. In some embodiments, the gate via 184 includes the same material as the conductive core layer 290. Further metallization layers, such as a mid-end-of-line (MEOL) and/or a back-end-of-line (BEOL) interconnect structure may be formed on the second ILD 140 to provide additional electrical interconnection between devices of the IC device 10.

FIGS. 2A-2Z, 3A-3V and 4A-4J illustrate diagrammatic perspective and cross-sectional top and side views of a portion of an IC device 10A fabricated according to embodiments of the present disclosure, where the IC device 10A includes nanostructure devices 20A, 20B which may be gate-all-around FETs (GAAFETs). Many operations shown in FIGS. 2A-4J are similar to or the same as those described with reference to FIGS. 1A-1Z for forming the IC device 10, and are not described in detail for brevity.

Figure 2A:
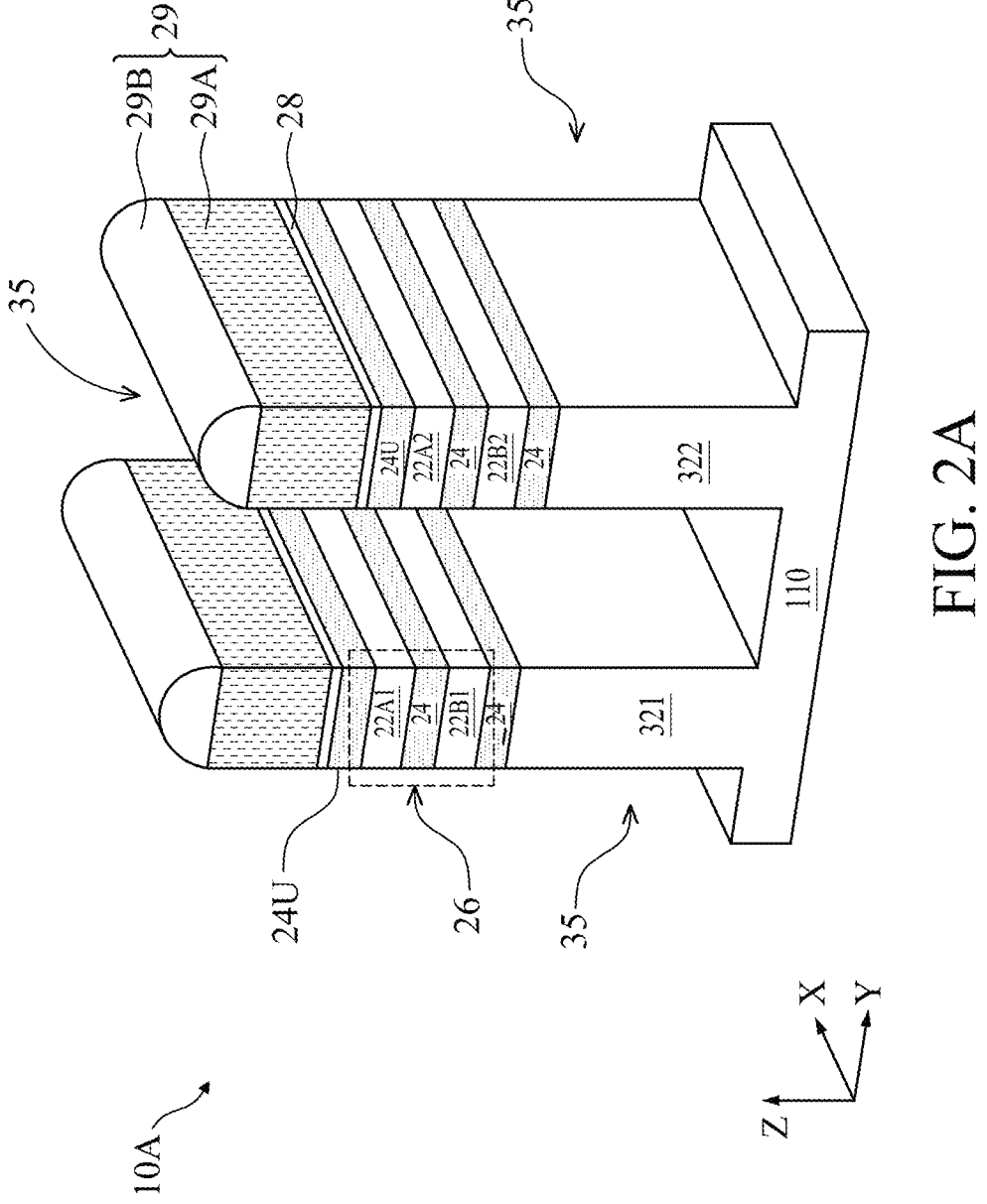
FIGS. 2A-2Z, 3A-3V, 4A-4J and 5 are intermediate perspective views of an IC device at various stages of fabrication according to embodiments of the present disclosure.

FIG. 2A is a perspective view of an intermediate stage of fabrication of the IC device 10A. FIG. 2A is similar in many respects to FIG. 1A, and related details thereof may be found in the description of FIG. 1A. In FIG. 2A, the fin stacks 26 are shown including two nanosheets 22 instead of the three nanosheets 22 shown in FIG. 1A. The top silicon 27 of FIG. 1A is also omitted from view in FIG. 2A. In some embodiments, the IC device 10A in the intermediate stage shown in FIG. 2A includes the top silicon 27.

Figure 2B:
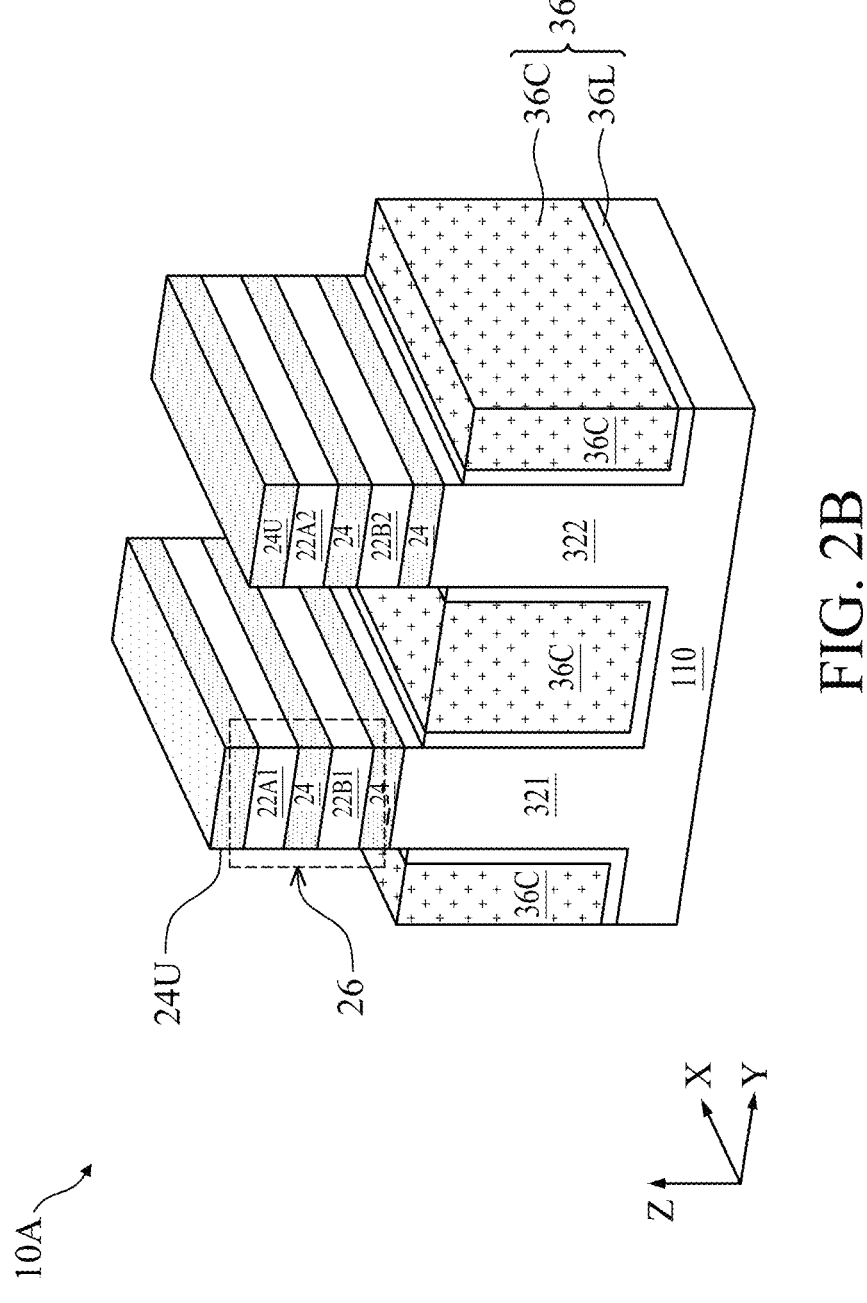

In FIG. 2B, the isolation regions 36 are formed, which is described with reference to FIG. 1B.

Figure 2C:
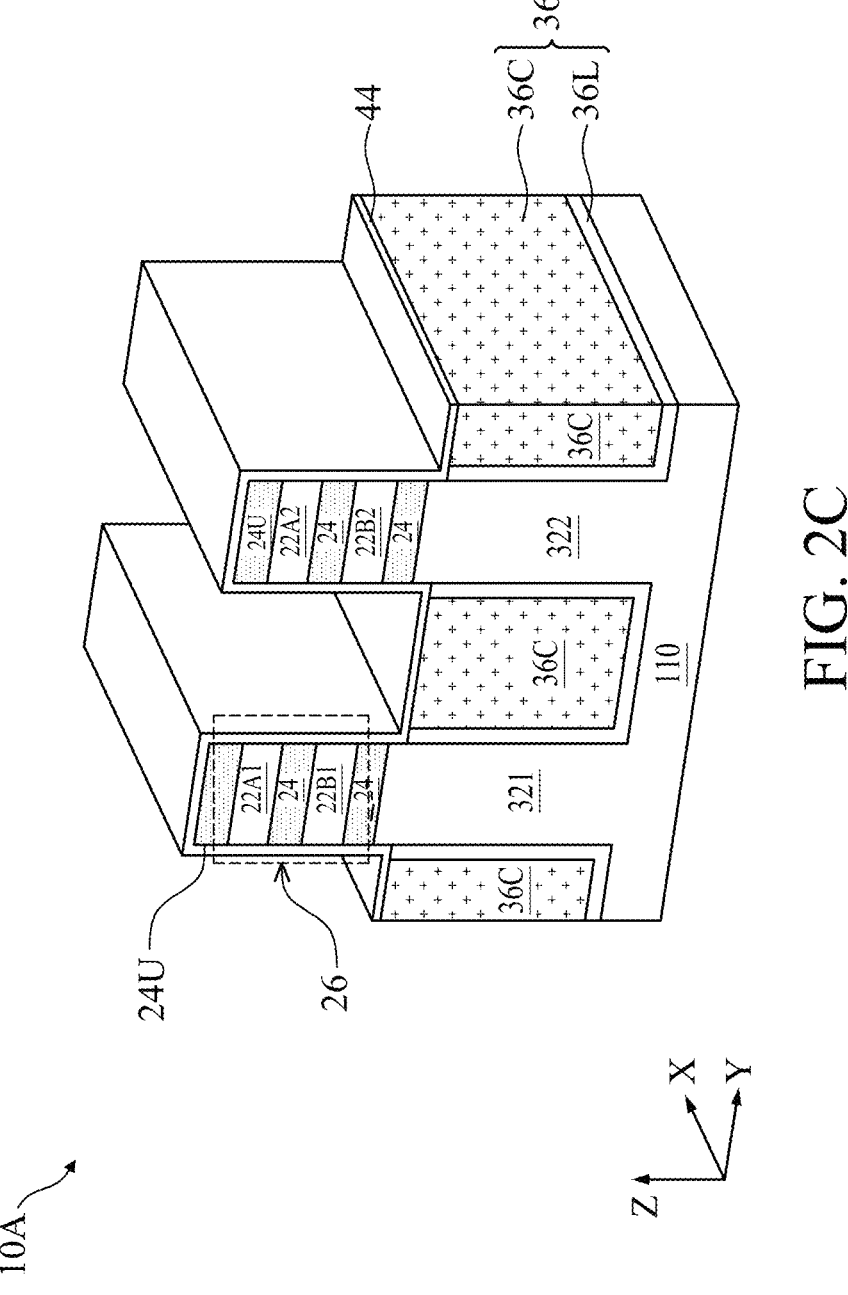

In FIG. 2C, a single sacrificial gate dielectric layer 44 is formed, which may be the same as or similar to the second sacrificial dielectric layer 44B, and is described with reference to FIG. 1B. In some embodiments, the sacrificial gate dielectric layer 44 is a dielectric layer that may be an oxide, such as SiO.

Figure 2D:
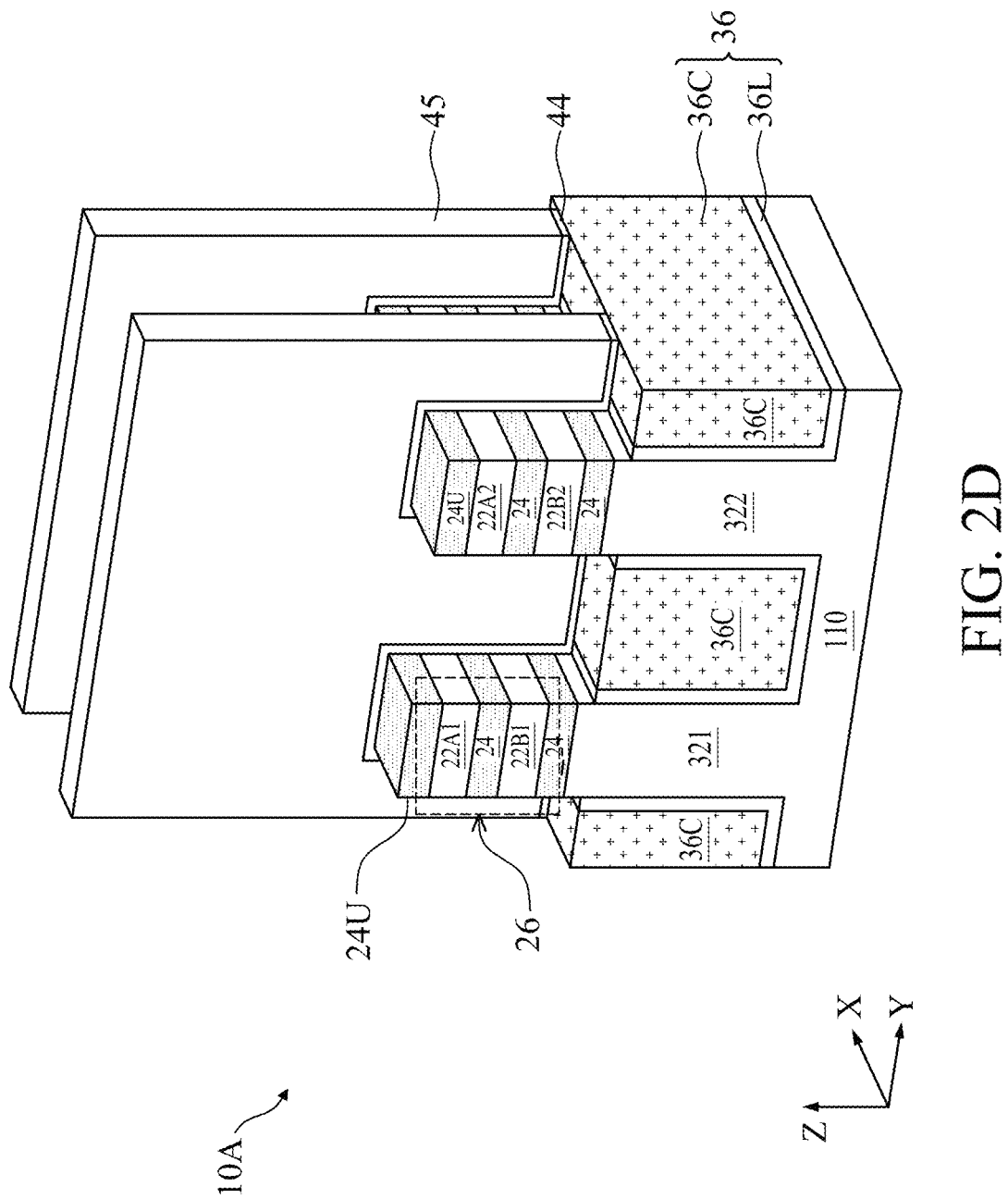

In FIG. 2D, a sacrificial gate structure 45 is formed over the fin stacks 26 and the sacrificial gate dielectric layer 44. Details about the sacrificial gate structure 45 are described with reference to FIG. 1C. Exposed portions of the sacrificial gate dielectric layer 44 are then recessed to expose the fin stacks 26, which is described with reference to FIG. 1D.

Figure 2E:
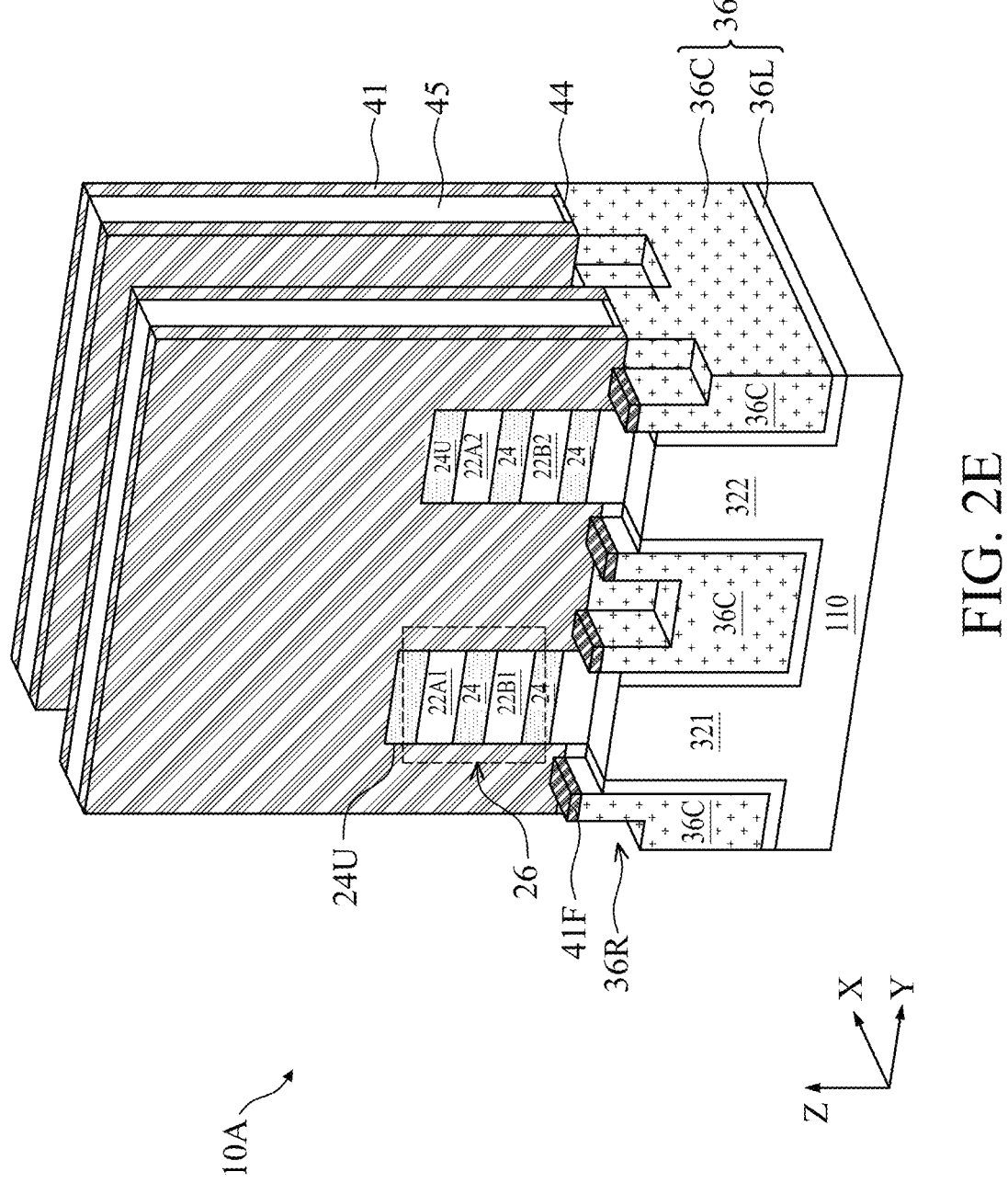
Figure 2F:
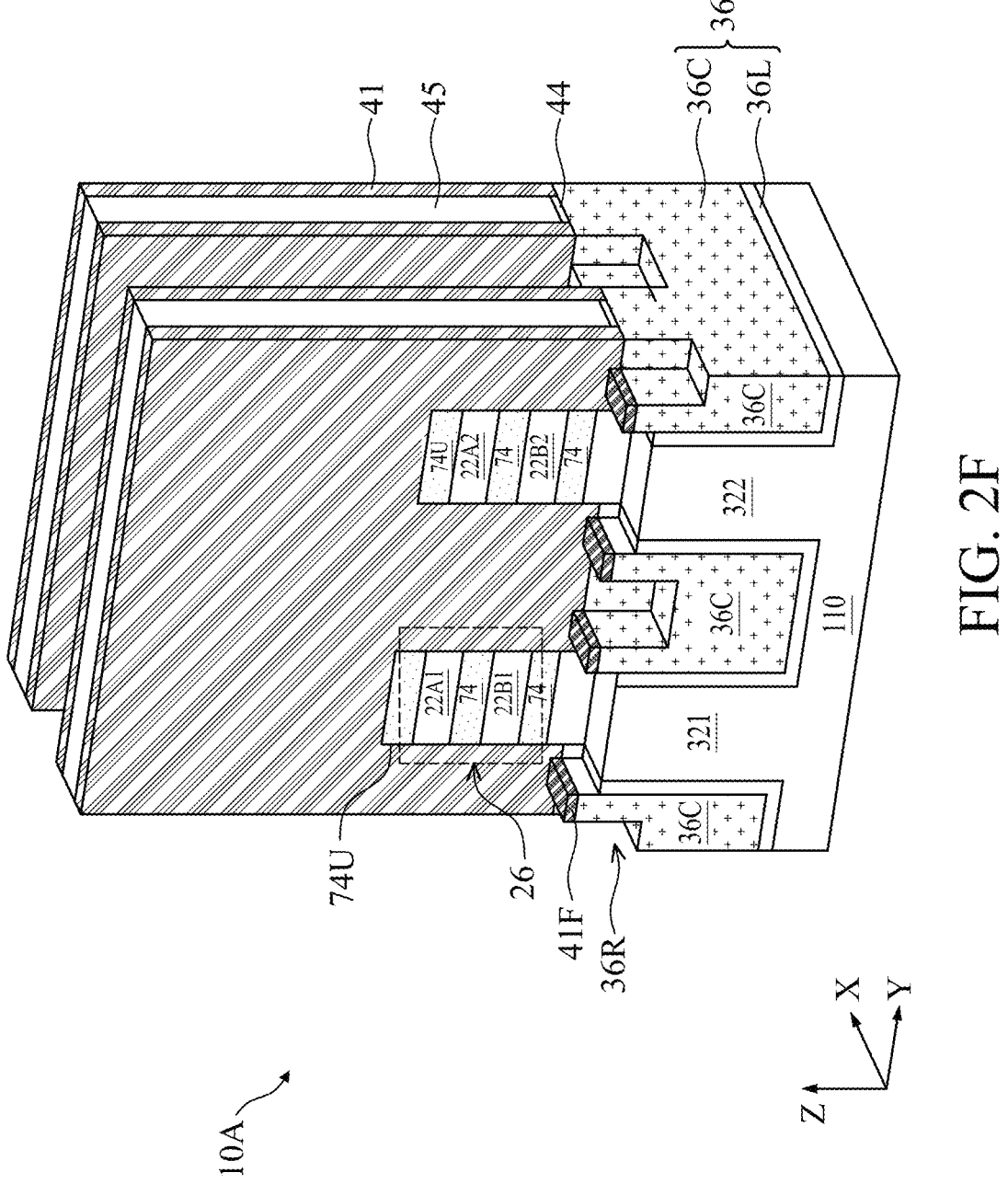

In FIGS. 2E and 2F, sidewall spacers 41 and fin spacers 41F are formed on the sacrificial gate structure 45, exposed portions of the fin stacks 26 are recessed, then inner spacers 74 are formed, resulting in the structure shown in FIG. 2E, which is similar to what is described with reference to FIGS. 1E and 1F.

Figure 2G:
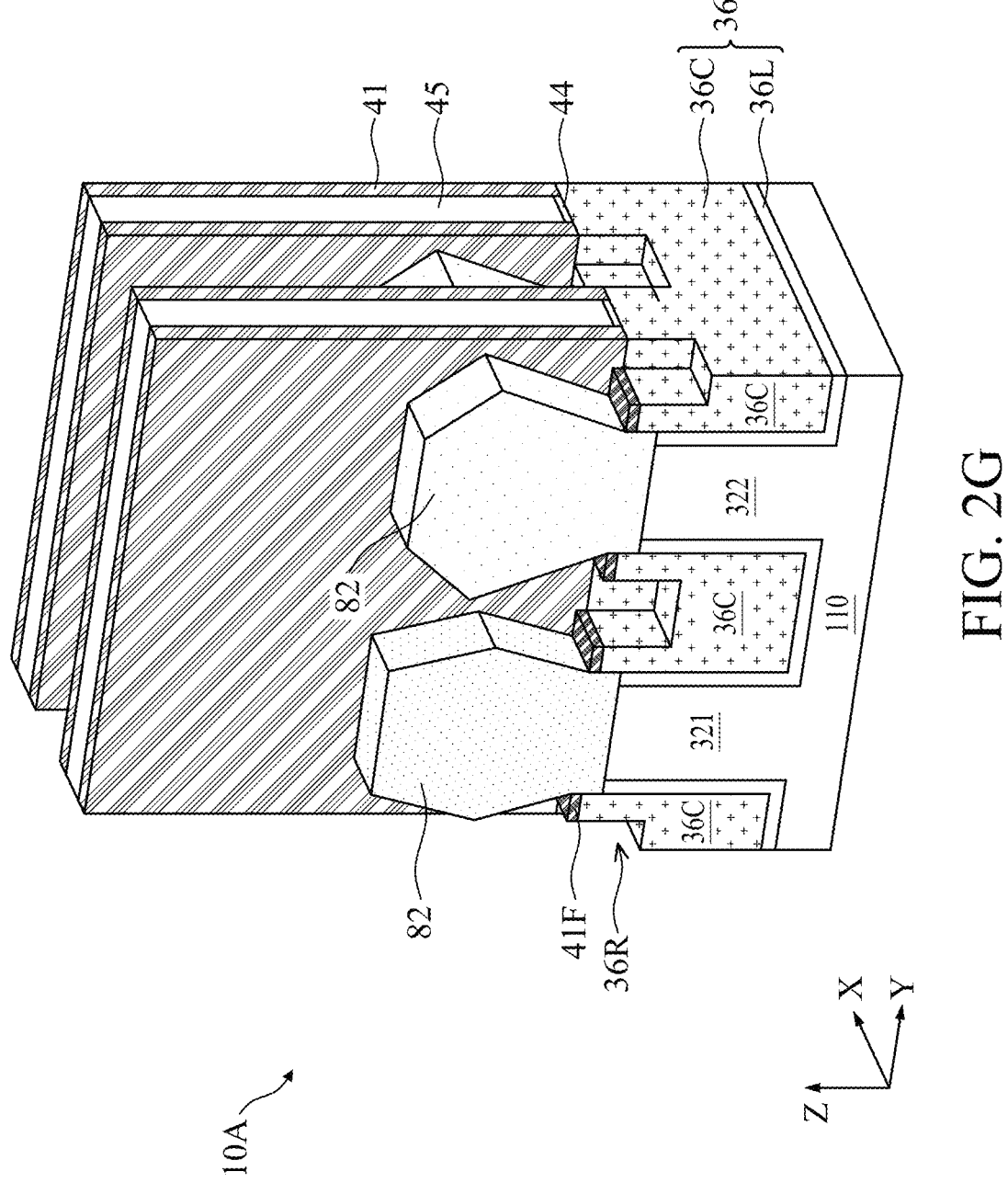

In FIG. 2G, source/drain regions 82 are formed on the fins 321, 322, which is described in detail with reference to FIG. 1G.

Figure 2H:
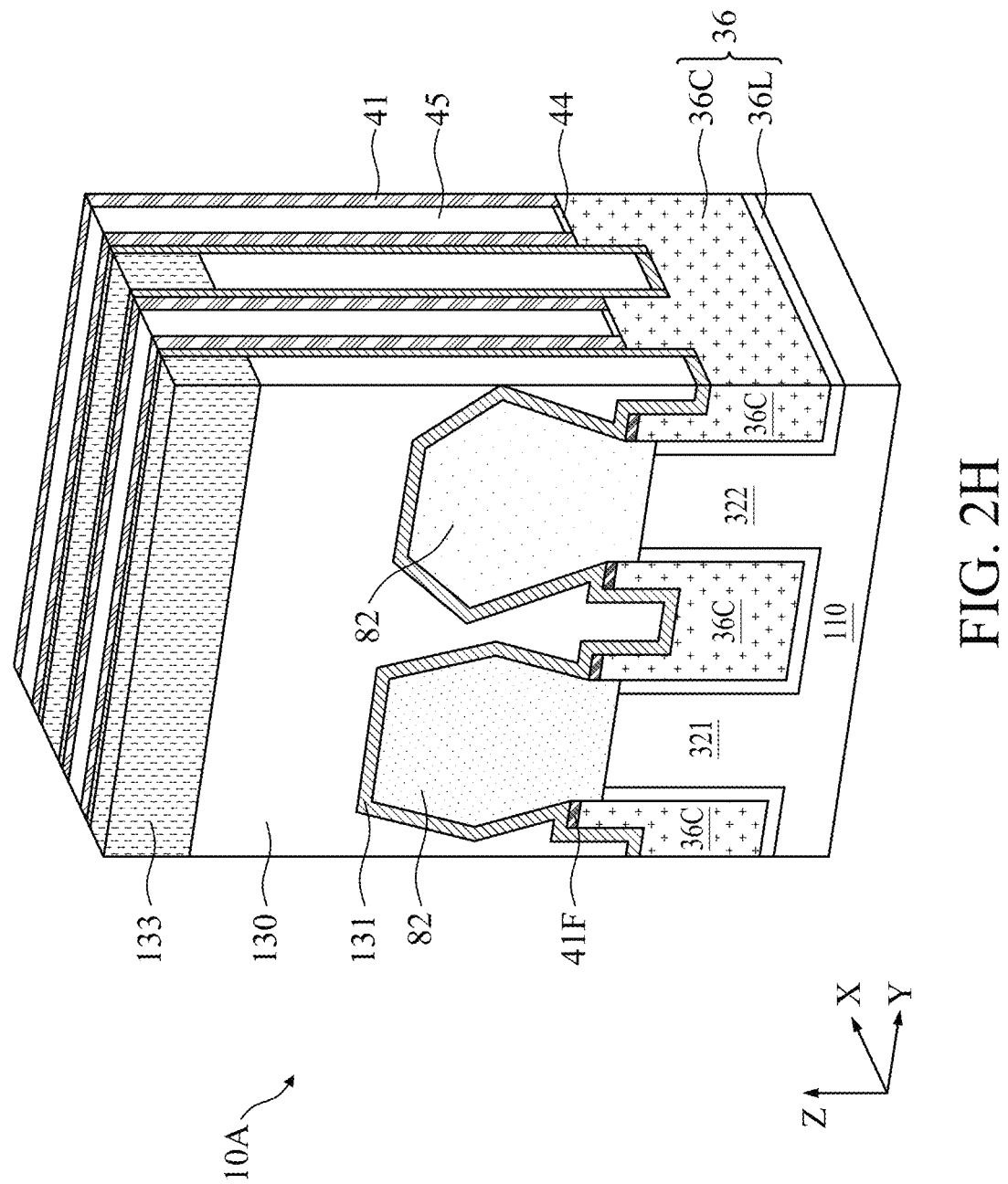
Figure 2I:
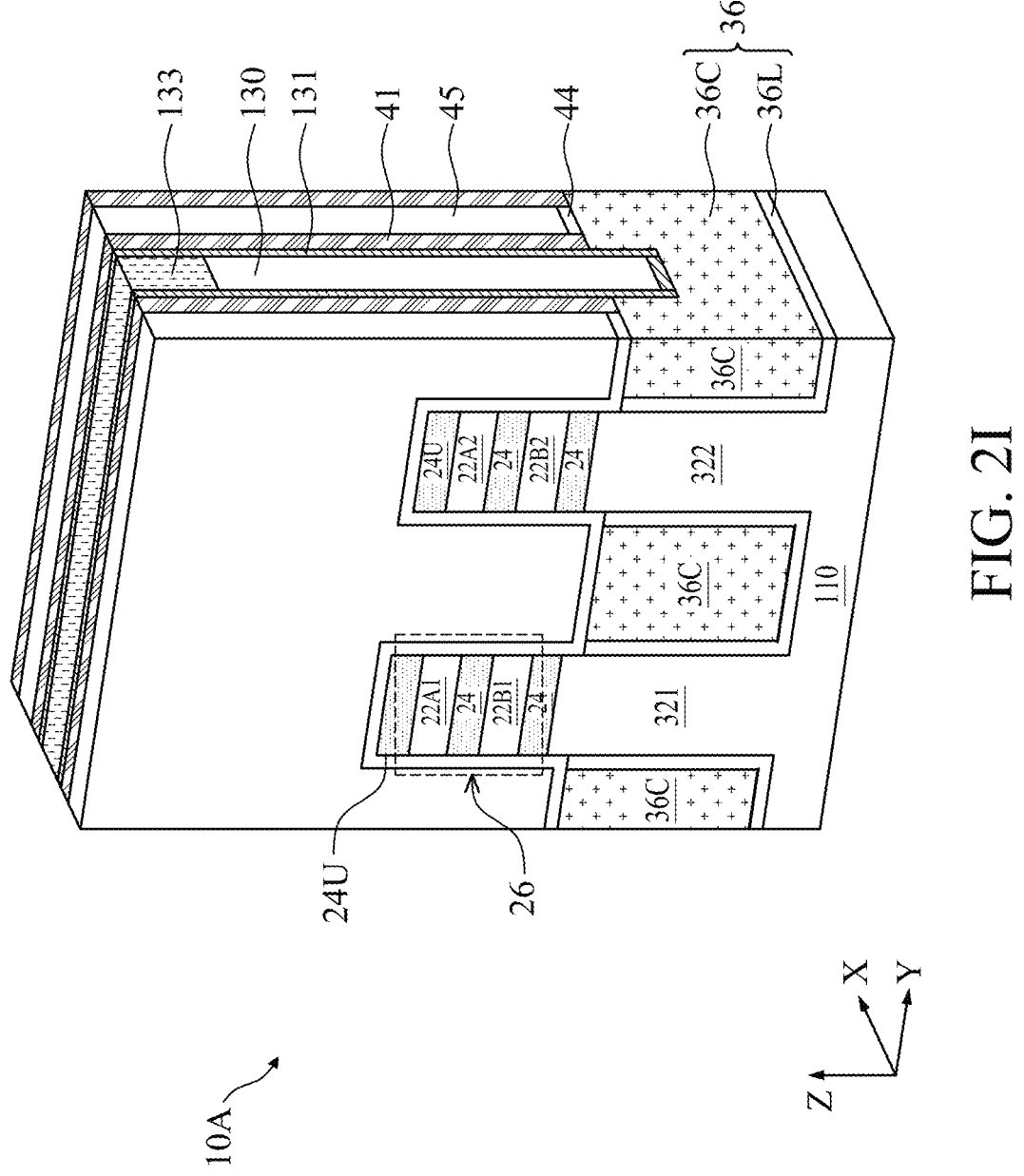

In FIGS. 2H and 2I, a CESL 131, an ILD 130 and an ILD cap 133 are formed, which is described in detail with reference to FIG. 1H. FIG. 2H shows a perspective view at the source/drain regions 82, and FIG. 2I shows a perspective view at the sacrificial gate structure 45 and the fin stack 26.

Figure 2K:
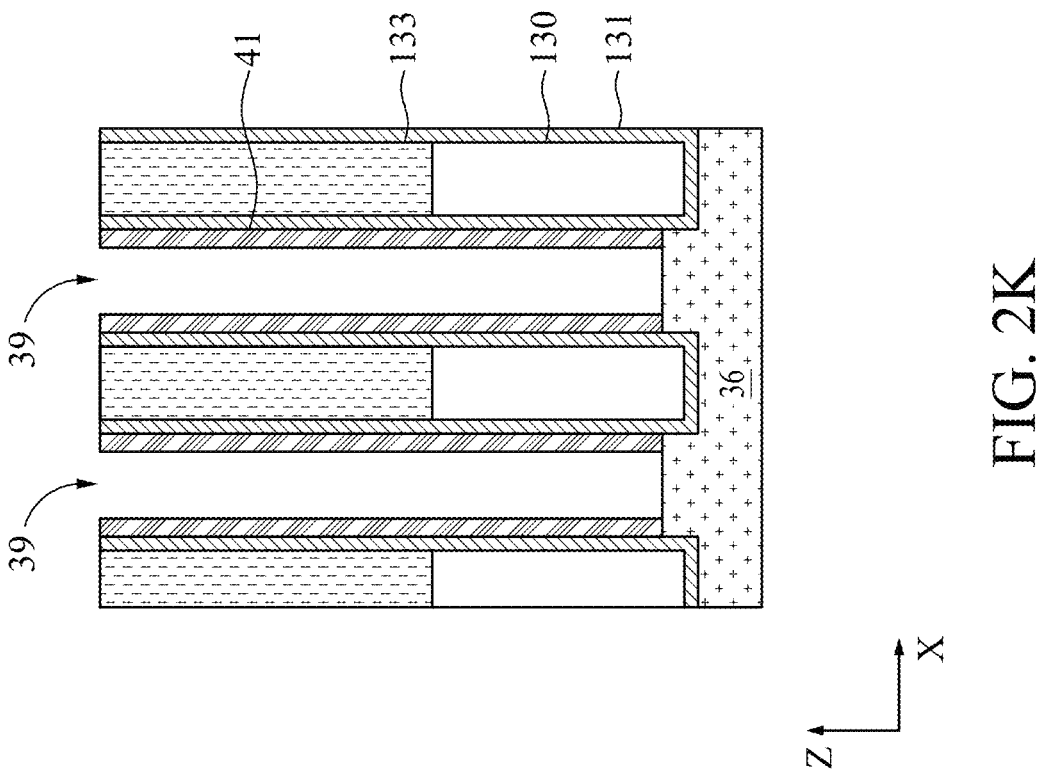
Figure 2J:
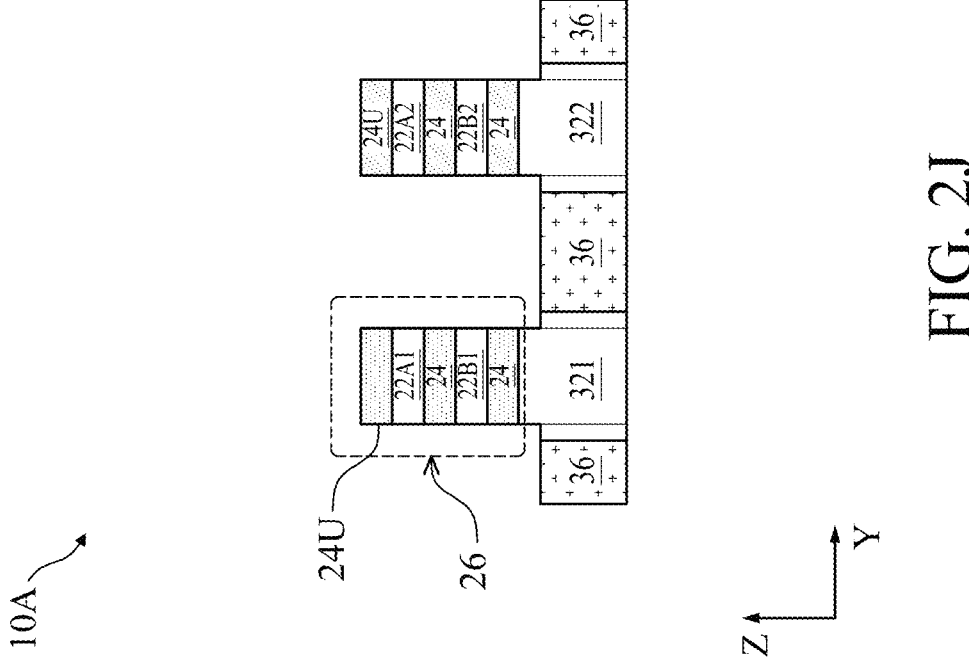

In FIGS. 2J and 2K, the sacrificial gate structure 45 and the sacrificial gate dielectric layer 44 are removed using one or more etching processes, in accordance with some embodiments, thereby forming trenches 39 between the sidewall spacers 41 and exposing the fin stacks 26. Removal of the sacrificial gate structure 45 is described in detail with reference to FIG. 1H, however in the embodiment shown in FIG. 2J, the first sacrificial dielectric layer 44A is not present, such that following removal of the sacrificial gate structure in FIGS. 2J and 2K, the fin stacks 26 and the isolation regions 36 are exposed in the trenches 39.

Figure 2L:
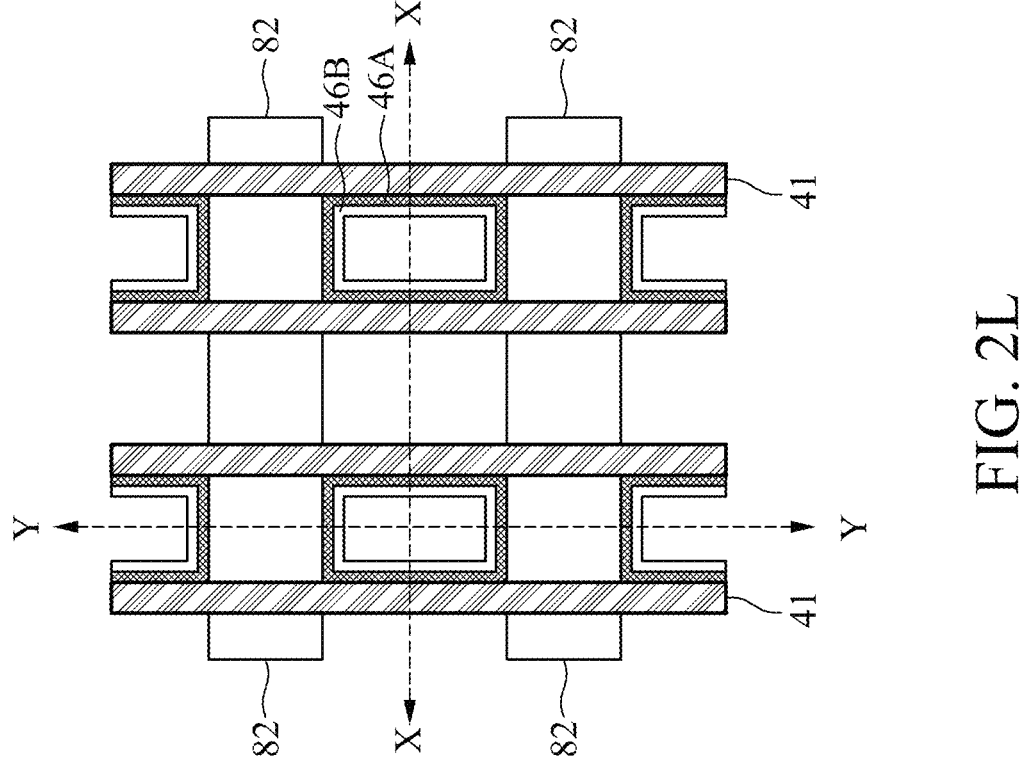
Figures 2M, 2N:
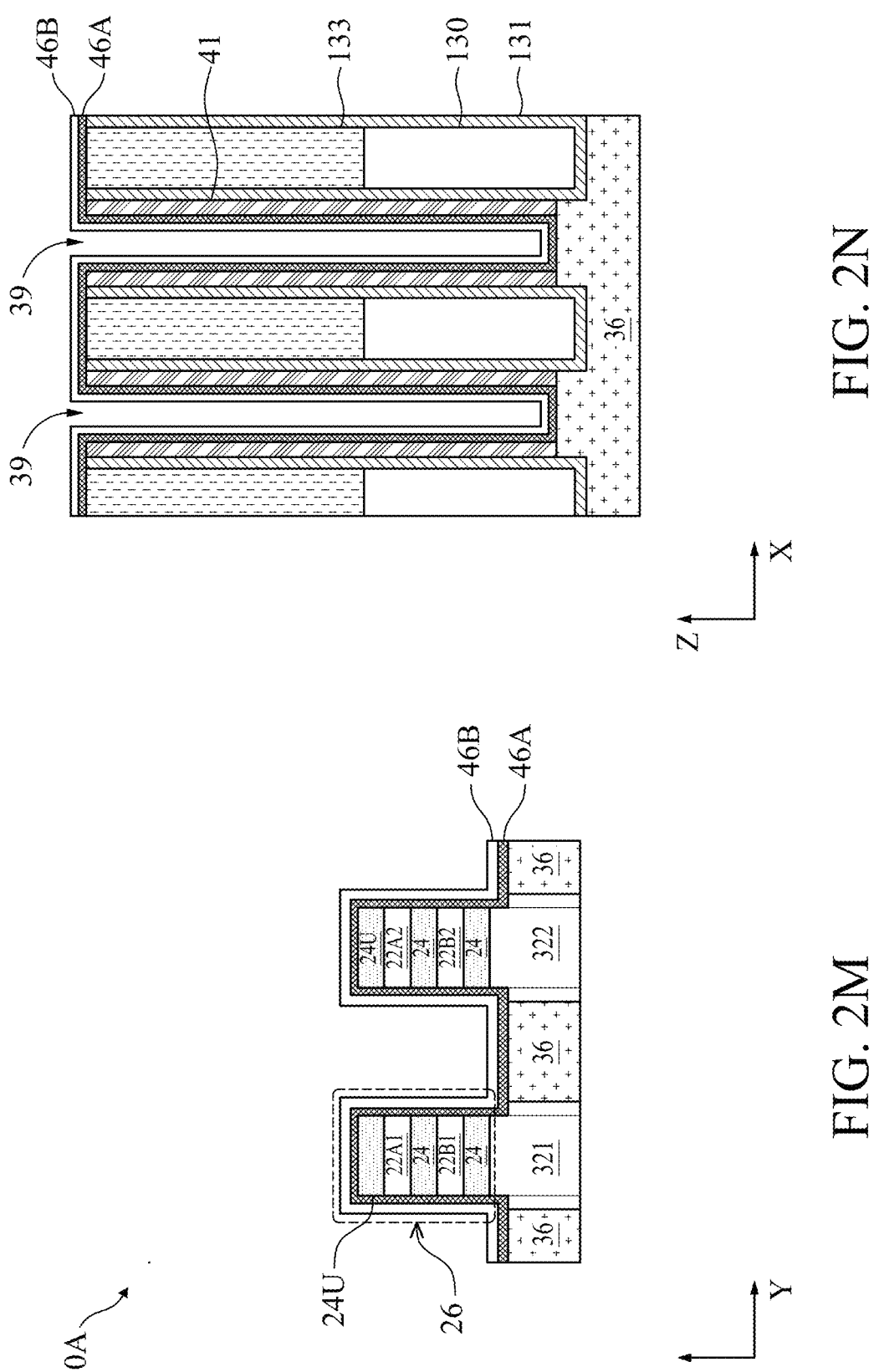

In FIGS. 2L, 2M, 2N, first and second wall dielectric layers 46A, 46B are formed on the exposed surfaces of the sidewall spacers 41, the isolation regions 36, the fin stacks 26, the CESL 131 and the ILD cap 133. Formation of the first and second wall dielectric layers 46A, 46B is described with reference to FIG. 1J.

In FIGS. 2O-2Z, the second wall dielectric layer 46B is trimmed in preparation for forming the wall structure 300 by depositing the third wall dielectric layer 46C. Trimming of the second wall dielectric layer 46B is described with reference to FIG. 1L, and will be described here in more detail.

Figures 2O, 2P:
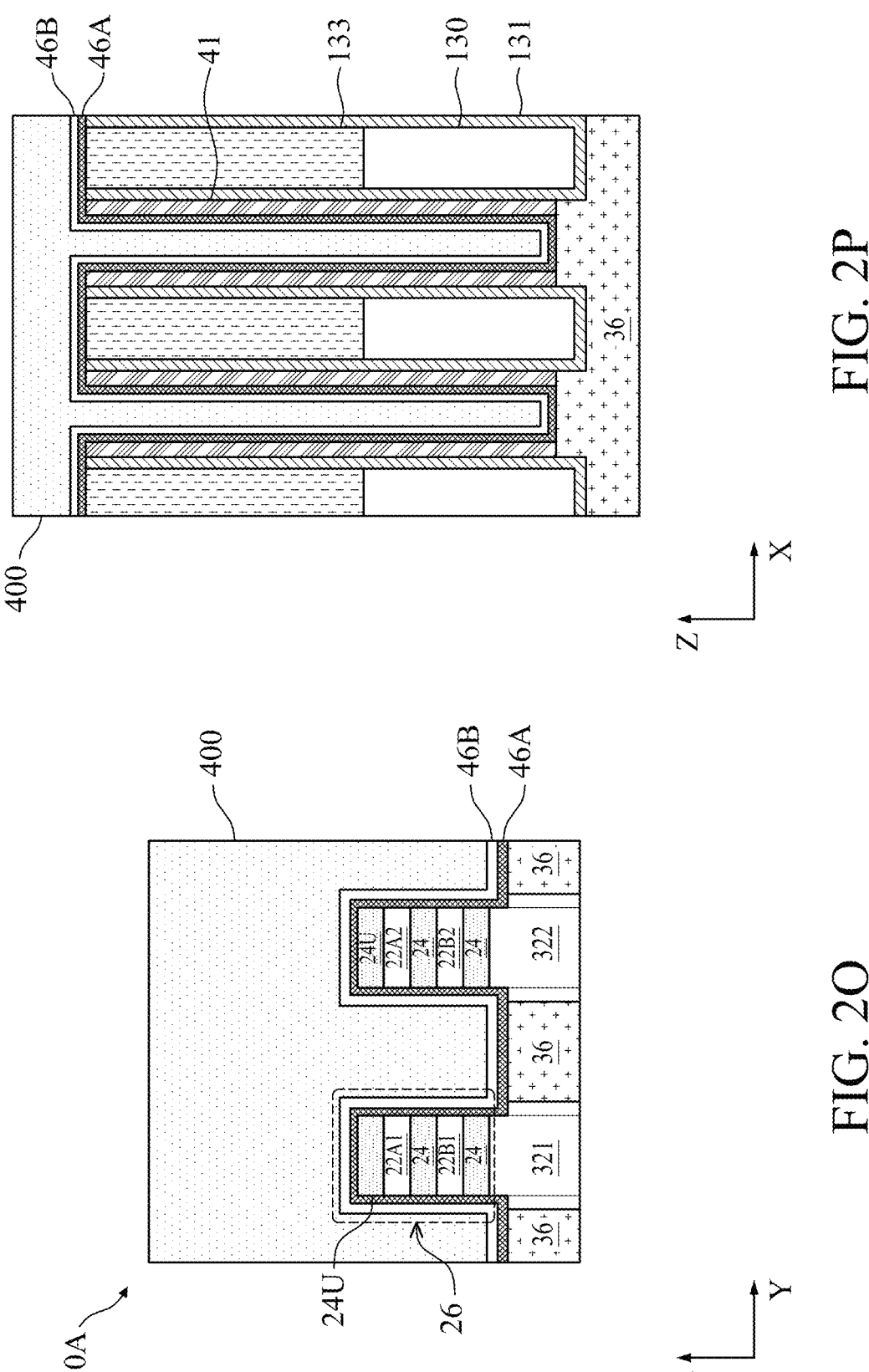

In FIGS. 2O, 2P, a masking layer 400, which may be or include a BARC layer, is formed on the device 10A, and fills the trenches 39. In some embodiments, the masking layer 400 extends above the trenches 39, and covers the upper surface of the second wall dielectric layer 46B, as shown in FIG. 2P.

Figures 2Q, 2R:
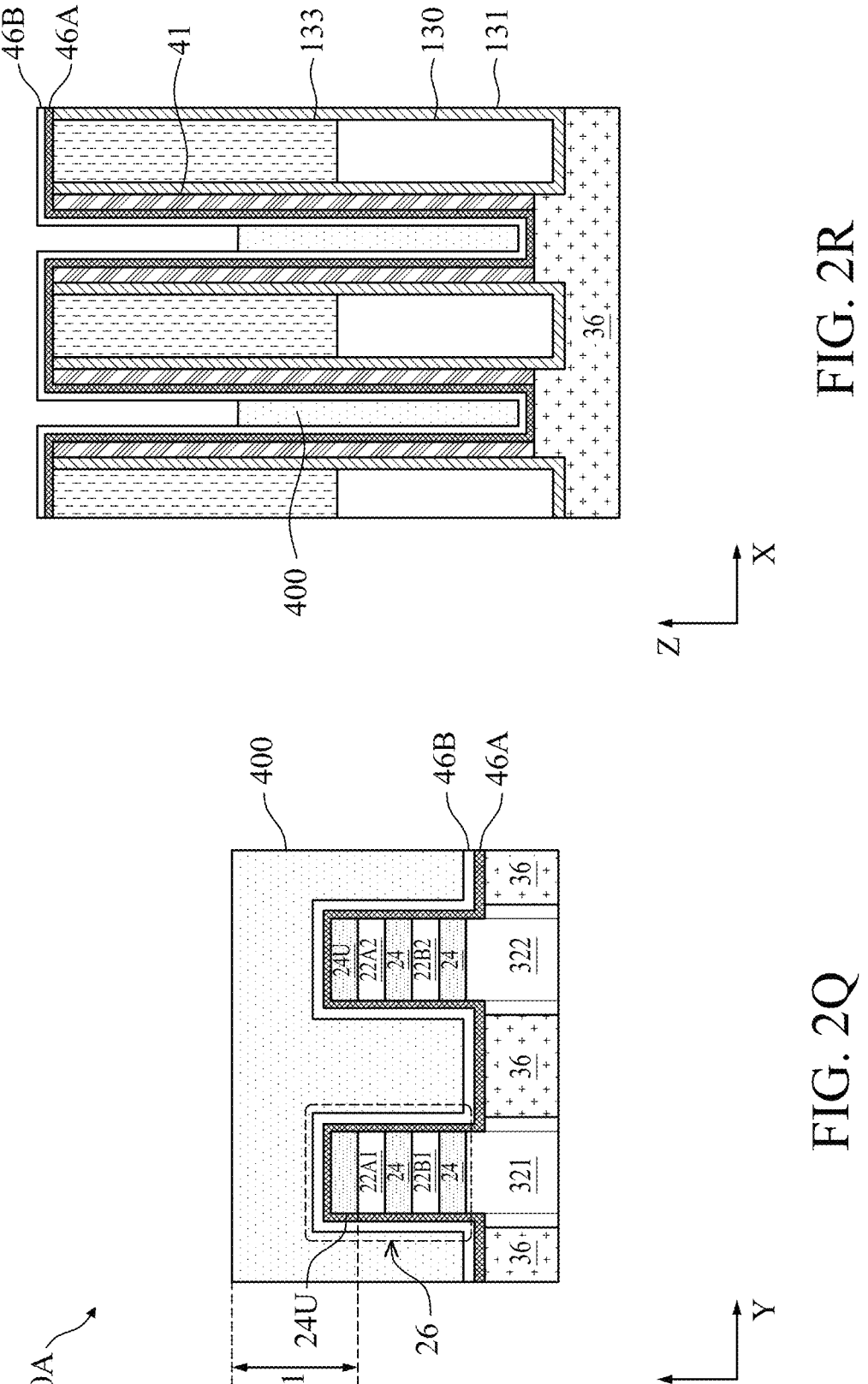

In FIGS. 2Q, 2R, following formation of the masking layer 400, the masking layer 400 is recessed by a suitable etching process that is selective to material of the masking layer 400 without substantially attacking the second wall dielectric layer 46B. The etching process may be timed, such that the masking layer 400 after recessing has an upper surface that is above the upper surface of the uppermost nanosheets 22A1, 22A2 by a distance in a range of about 10 nm to about 25 nm. Height of the masking layer 400 is selected in such a way as to form the wall structure 300 to a selected height.

Figures 2S, 2T:
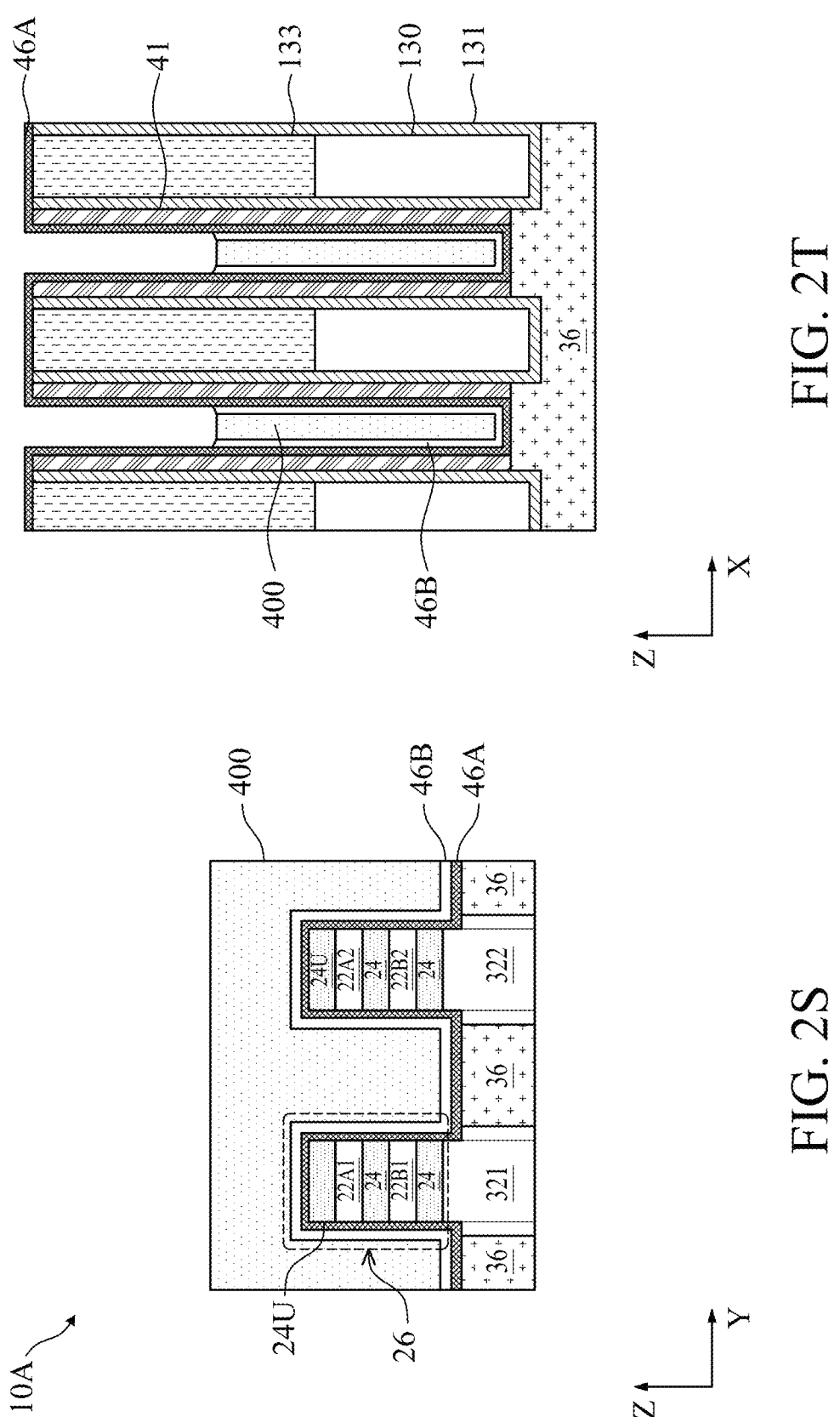

In FIGS. 2S, 2T, a suitable etching process is performed to remove portions of the second wall dielectric layer 46B over the sidewall spacers 41, the CESL 131 and the ILD cap 133, and to recess portions of the second wall dielectric layer 46B in the trenches 39 to a height substantially level with, or slightly below, the upper surface of the masking layer 400, as shown in FIG. 2T. In some embodiments, the upper surface of the second wall dielectric layer 46B after recessing is above the upper surface of the uppermost nanosheets 22A1, 22A2 and is below the lower surface of the ILD cap 133.

Figures 2V, 2W:
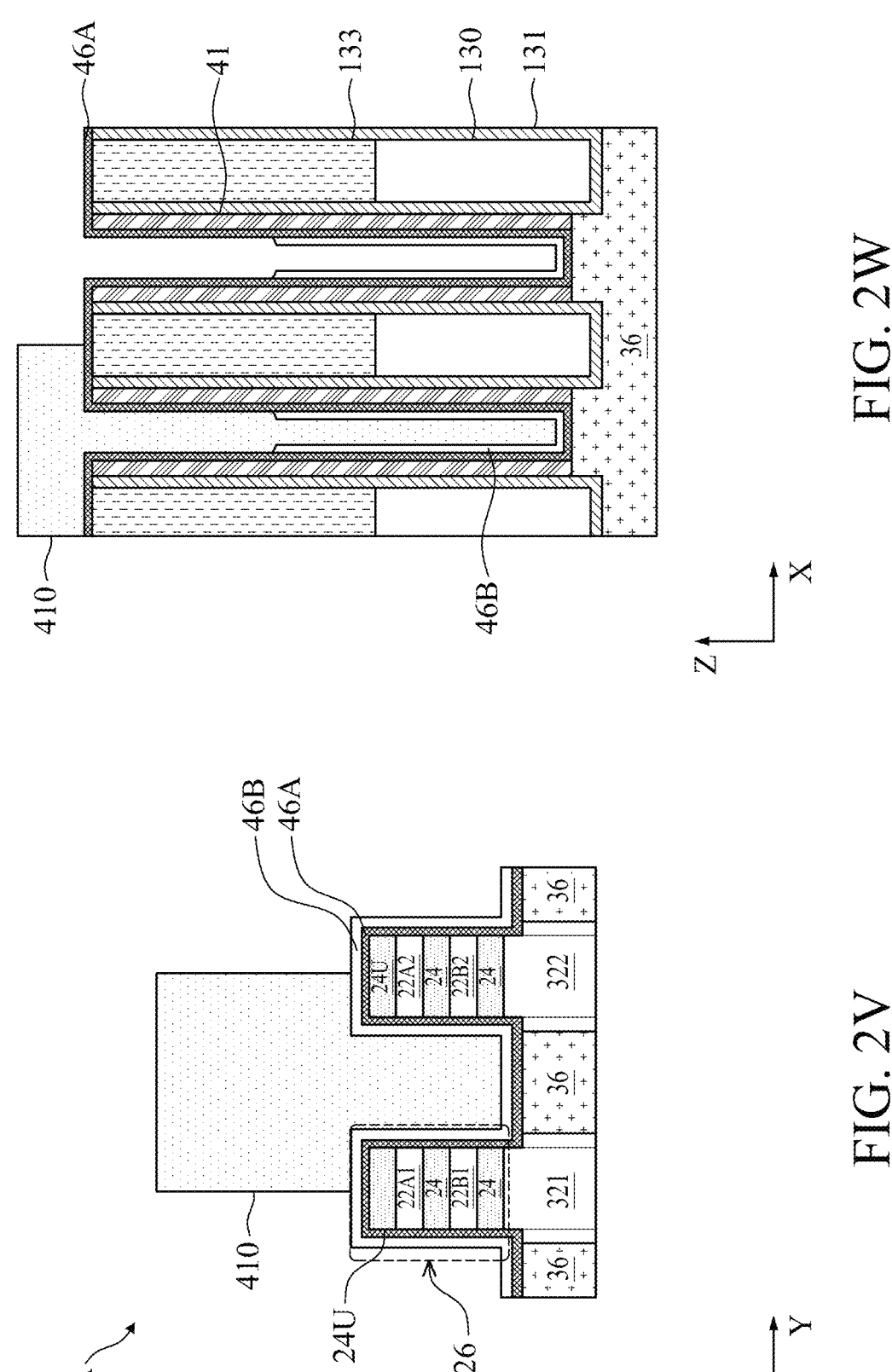

In FIGS. 2U-2W, a second masking layer 410 is formed and patterned. The second masking layer 410 may be or include a photoresist, a BARC, or the like. The second masking layer 410 may be deposited to cover the IC device 10, then a suitable photolithography exposure and removal operation may be performed to remove unexposed or exposed portions of the second masking layer 410, resulting in the structure shown in FIGS. 2U-2W.

Figure 2X:
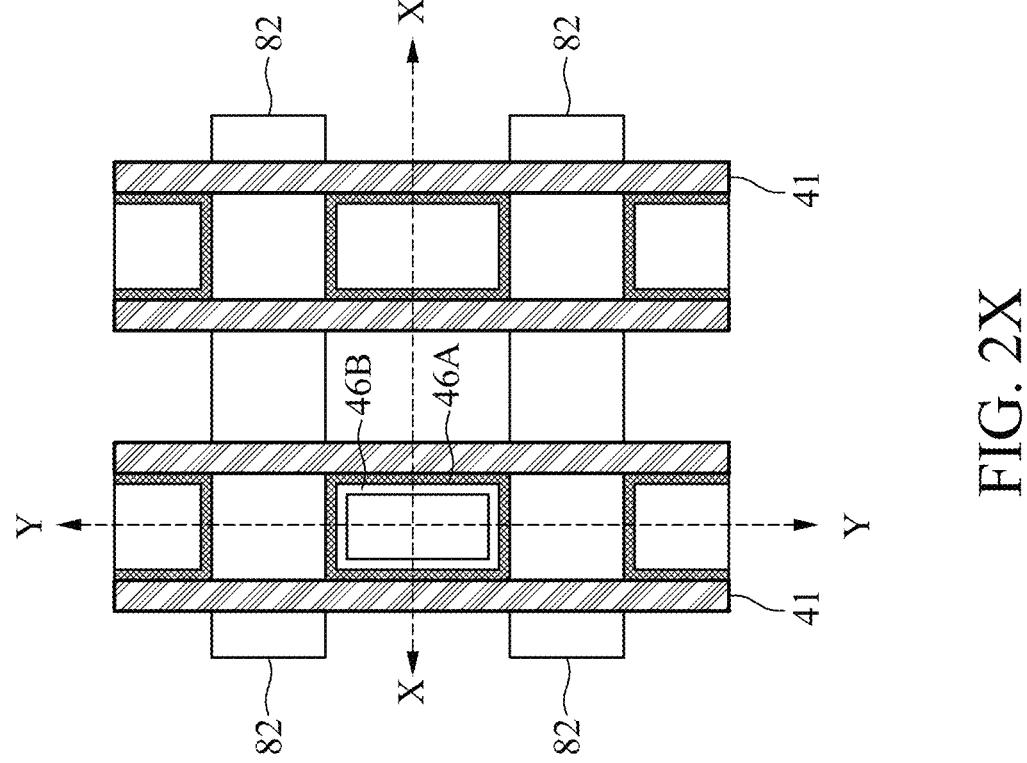

In FIGS. 2X-2Z, portions of the second wall dielectric layer 46B exposed by the second masking layer 410 are removed by a suitable etching process that removes material of the second wall dielectric layer 46B without substantially attacking the first wall dielectric layer 46A. As shown in FIG. 2Y, during etching, the portion of the second wall dielectric layer 46B remaining under the second mask layer 410 may be slightly overetched, such that the ends of the second wall dielectric layer 46B are recessed back slightly from sidewalls of the second masking layer 410. As shown in FIGS. 2X and 2Z, exposed trenches 39 may be substantially free of the second wall dielectric layer 46B, such that the first wall dielectric layer 46B is fully or substantially fully exposed in the trenches 39. The second masking layer 410 is then removed by a suitable removal process.

Figure 3A:
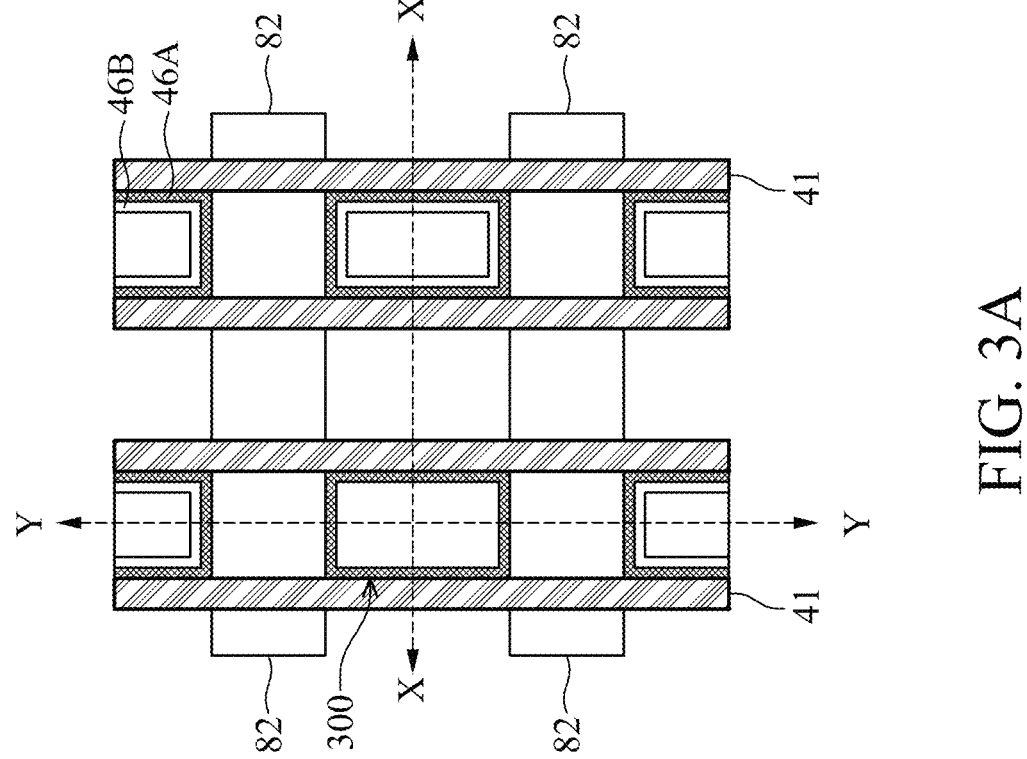
Figures 3B, 3C:
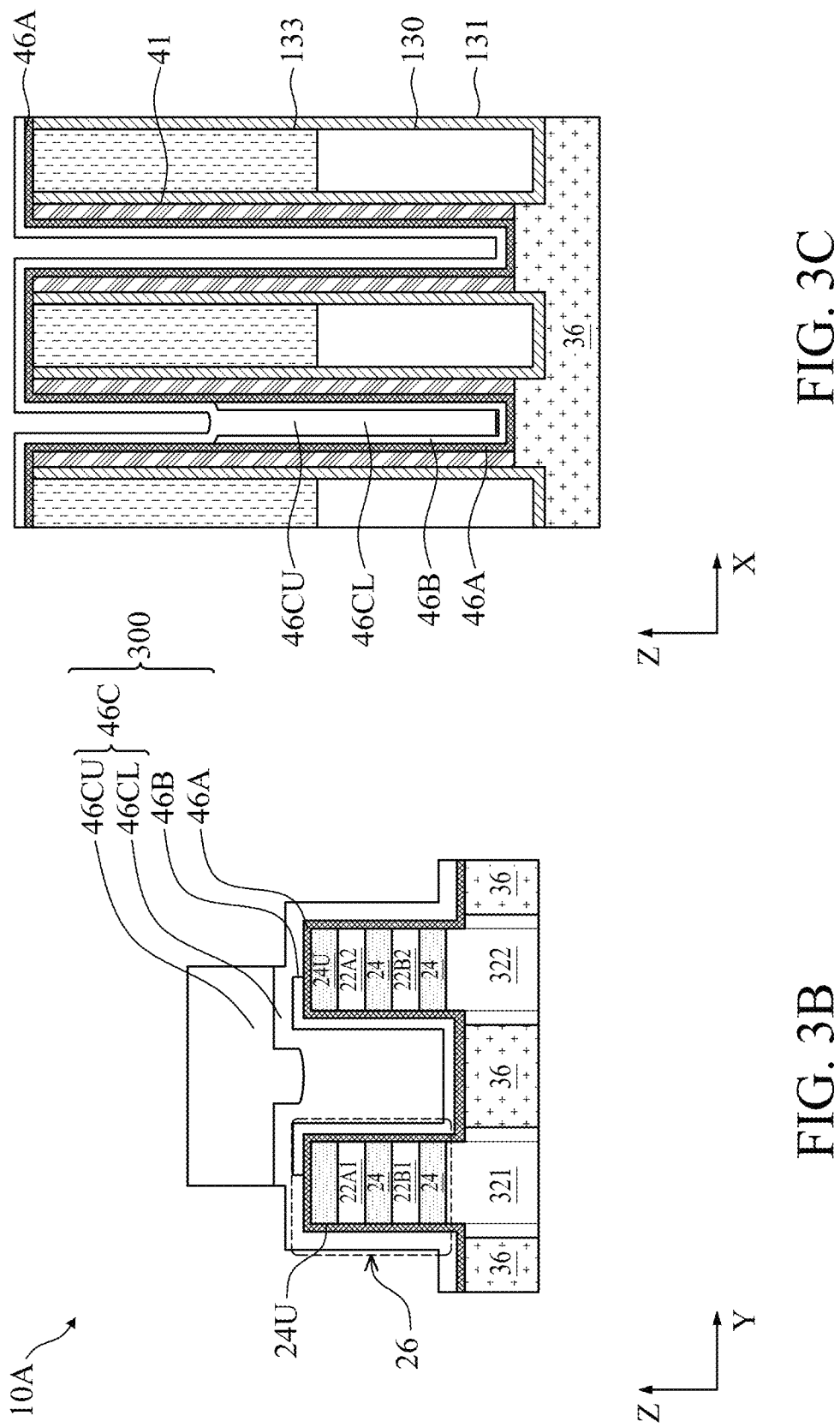

In FIGS. 3A-3C, the third wall dielectric layer 46C is formed, which is described in detail with reference to FIGS. 1N and 1O. As described with reference to FIGS. 1N and 1O, the third wall dielectric layer 46C merges in trenches 39 having the second wall dielectric layer 46B therein. In some embodiments, a lower portion 46CL of the third wall dielectric layer 46C may merge at a different time (e.g., prior to) an upper portion 46CU of the third wall dielectric layer 46C merging. A visible interface may be present between the upper and lower portions 46CU, 46CL, as shown in FIG. 3B, in some embodiments. In other embodiments, no visible interface is present between the upper and lower portions 46CU, 46CL, even when the merging times are different as just described. In trenches 39 substantially free of the second wall dielectric layer 46B, the third wall dielectric layer 46C tends not to merge, or may not merge at all.

Figure 3D:
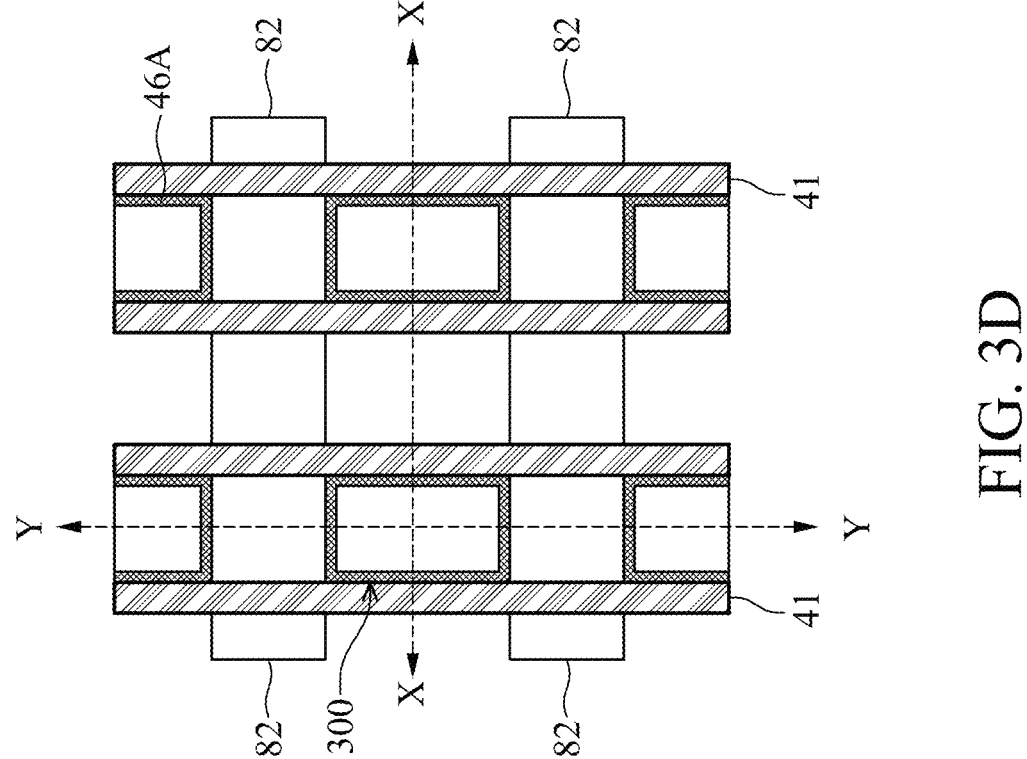
Figures 3E, 3F:
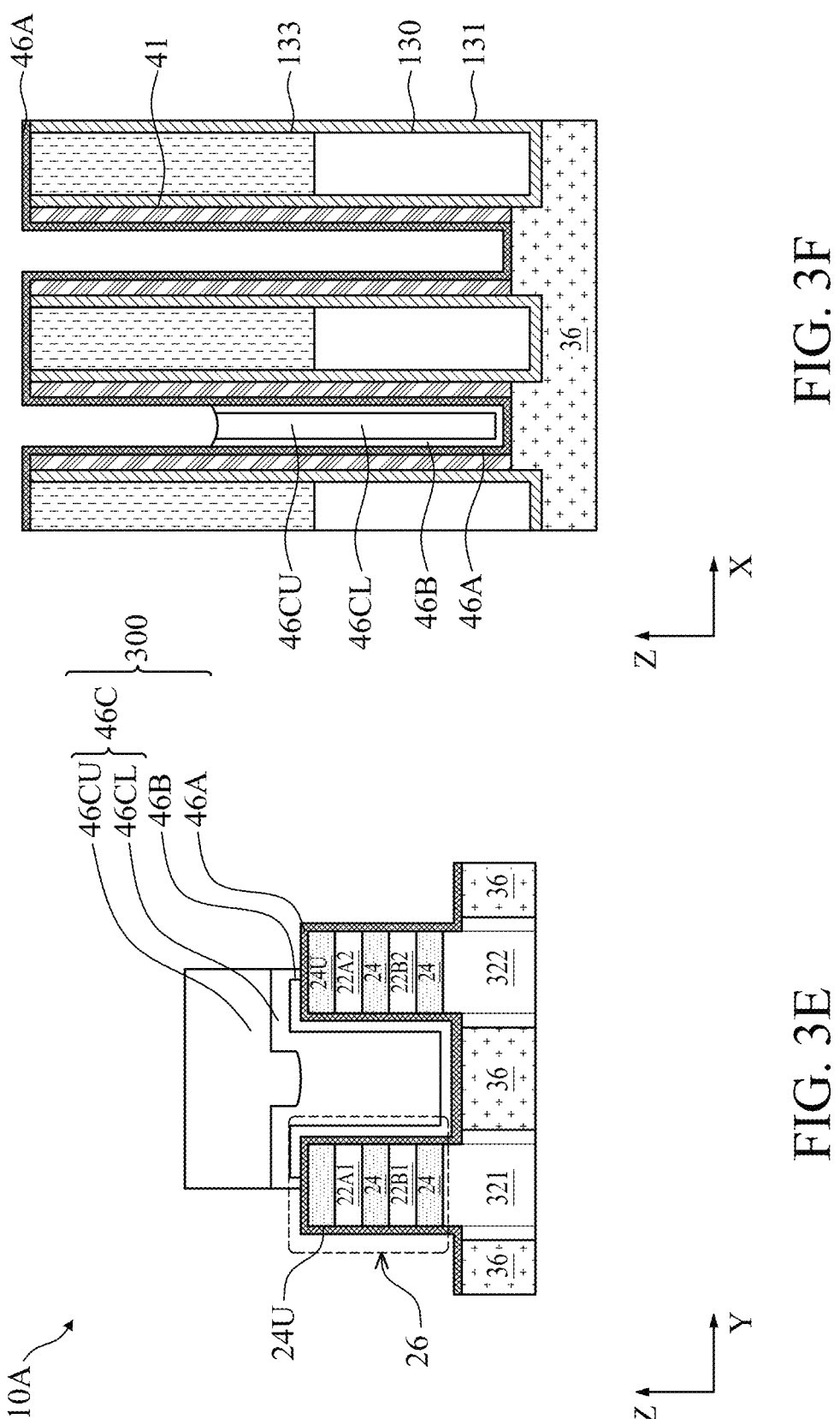

In FIGS. 3D-3F, the third wall dielectric layer 46C is pulled back by a suitable etching process, which is described with reference to FIGS. 1P, 1Q. The first wall dielectric layer 46A may be used as an etch stop layer during the etching process that pulls back the third wall dielectric layer 46C. In some embodiments, the upper surface of the third wall dielectric layer 46C in the trench 39 is lower than the lower surface of the ILD cap 133.

Figure 3G:
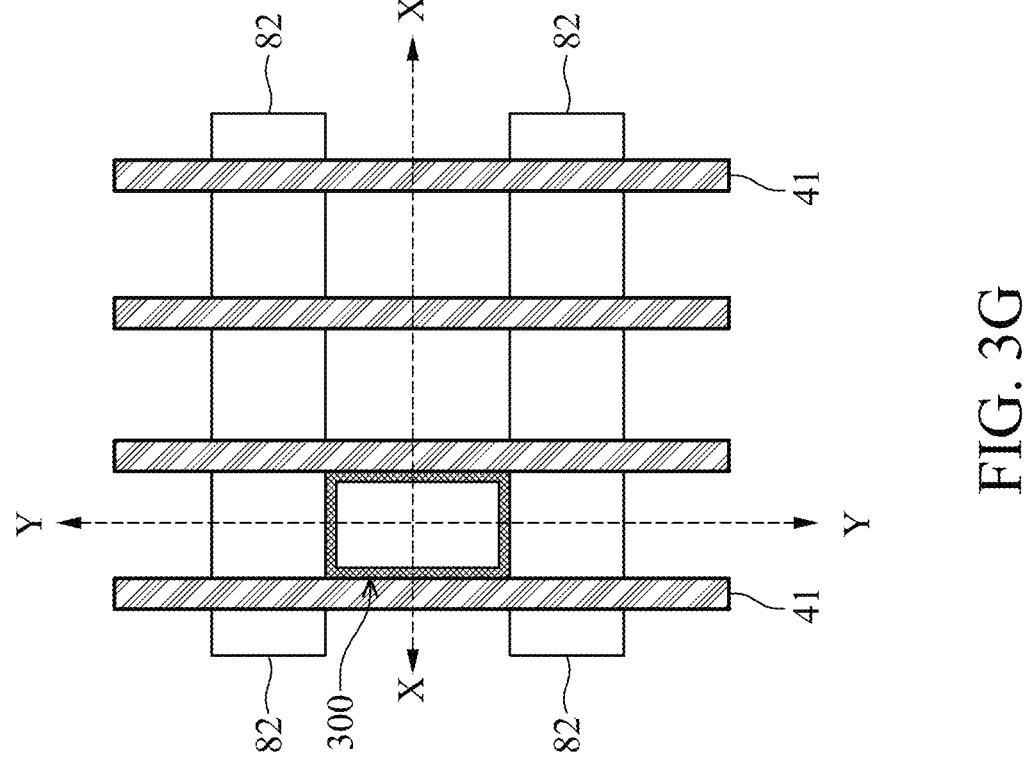
Figures 3H, 3I:
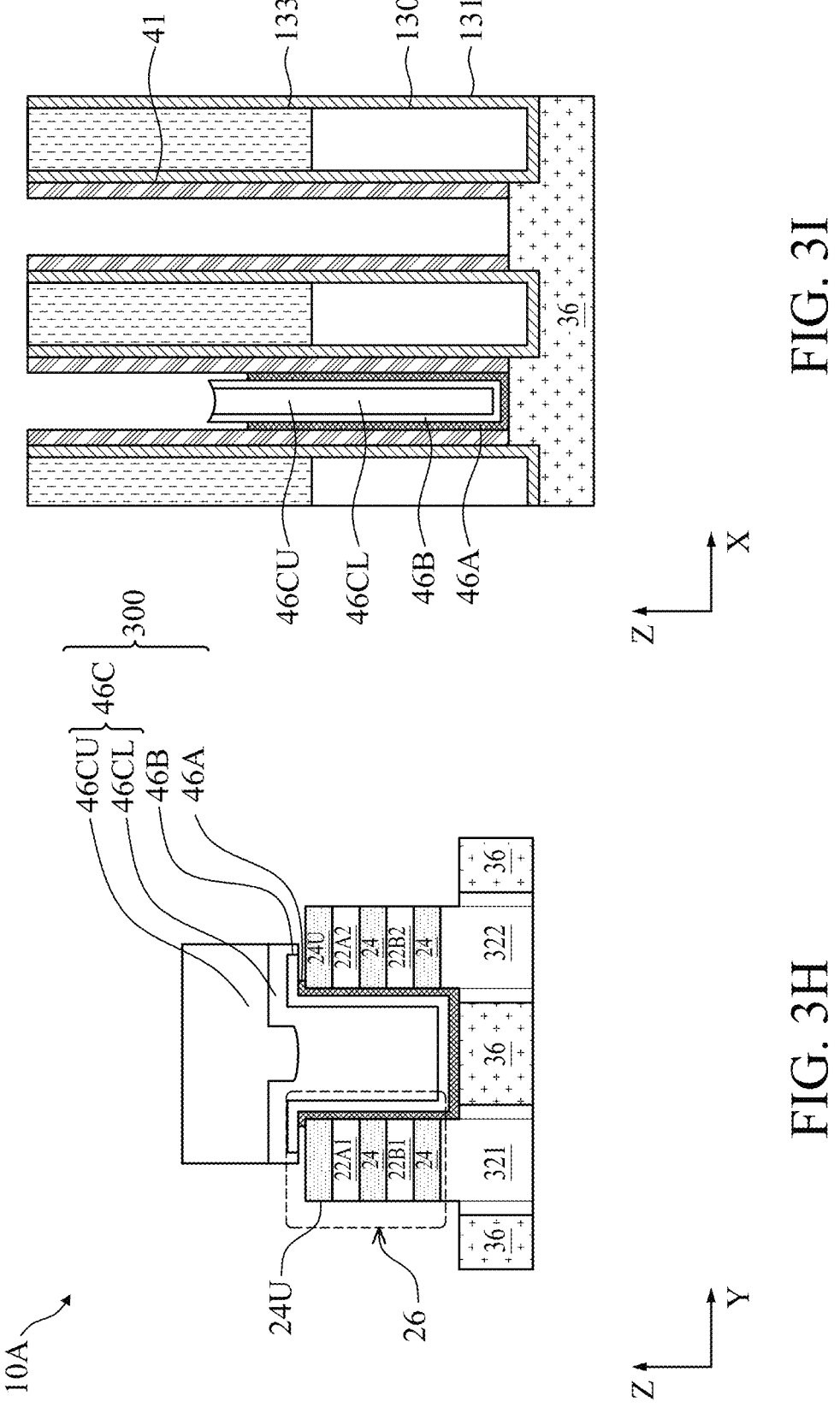

In FIGS. 3G-3I, exposed portions of the first wall dielectric layer 46A are removed, which is described in detail with reference to FIGS. 1R, 1S. In some embodiments, as shown in FIG. 3H, the portion of the first wall dielectric layer 46A underlying the second and third wall dielectric layers 46B, 46C over the fin stacks 26 is overetched, such that ends of the first wall dielectric layer 46A are recessed back from the sidewalls of the second and third wall dielectric layers 46B, 46C. As shown in FIG. 3I, vertical portions of the first wall dielectric layer 46A may also be recessed to a level below the upper surfaces of the second and third wall dielectric layers 46B, 46C.

Figures 3J, 3K:
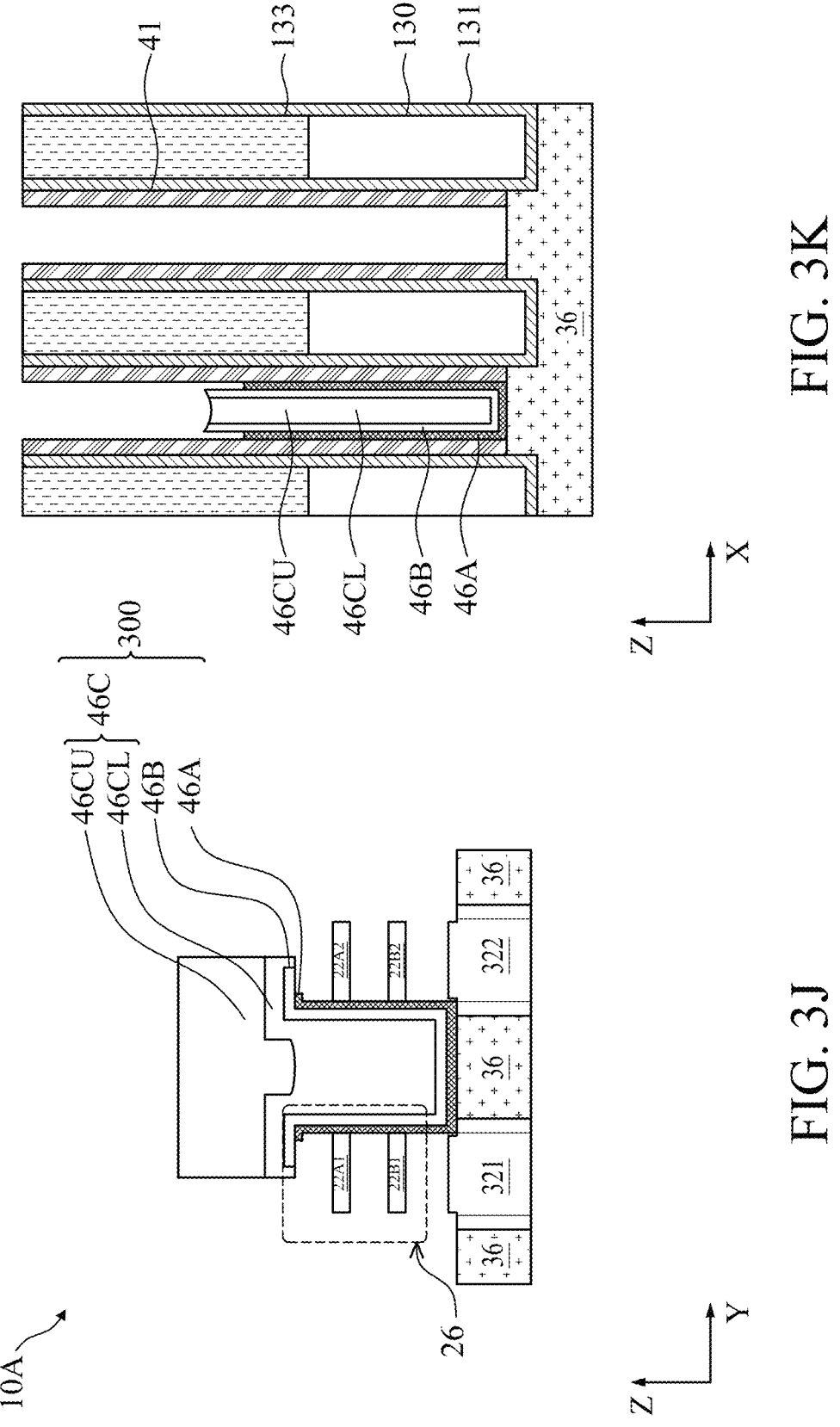

In FIGS. 3J, 3K, the channels 22 are released, which is described in detail with reference to FIG. 1T. Following release of the channels 22, portions of the first wall dielectric layer 46A may be exposed, and some portions of the first wall dielectric layer 46A are in the endcap between the channels 22 and the second wall dielectric layer 46B.

Figures 3M, 3N:
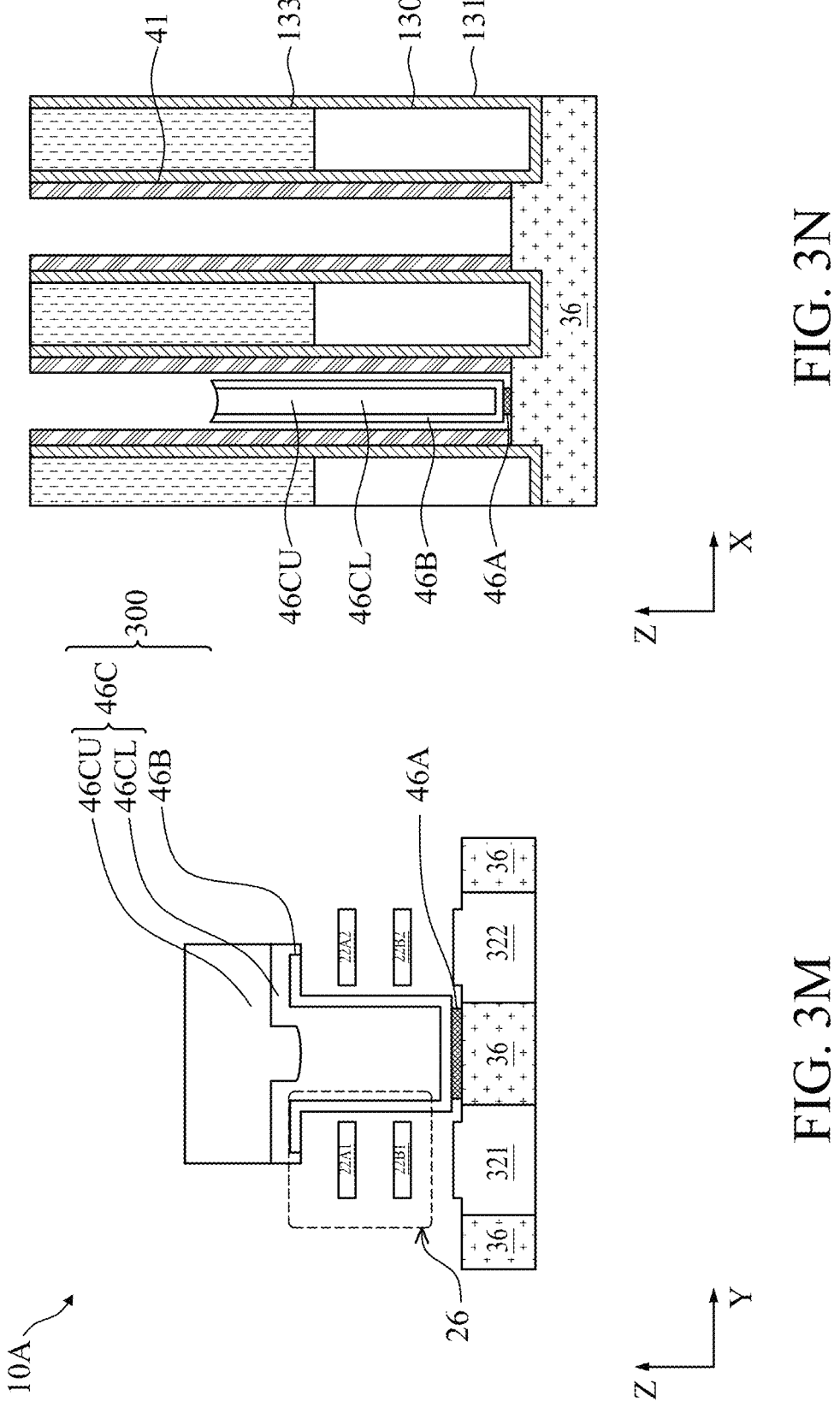
Figure 30:
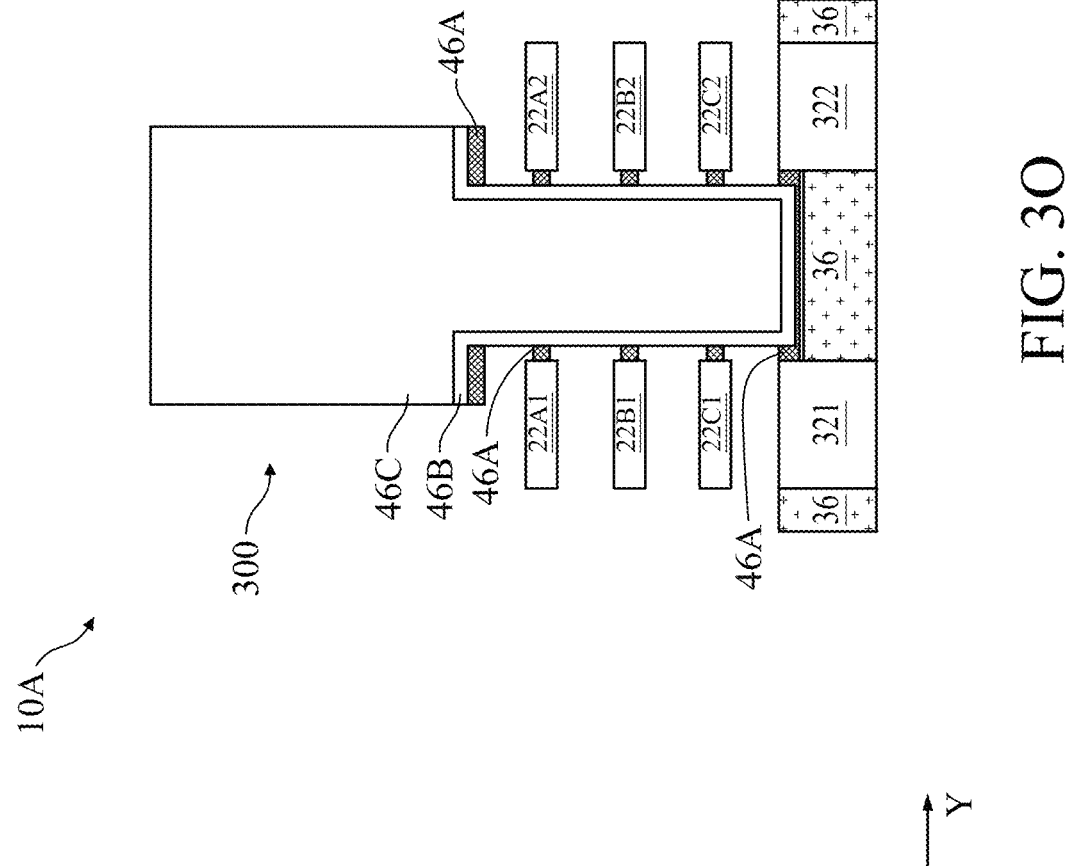

In FIGS. 3L-3N, portions of the first wall dielectric layer 46A are removed, which is described with reference to FIGS. 1U and 1V. As shown in FIG. 3M, the first wall dielectric layer 46A may be removed from the endcap, and the endcap may have width in the Y-axis direction in a range of about 2 nm to about 5 nm. A portion of the first wall dielectric layer 46A may remain between the isolation region 36 and the second wall dielectric layer 46B overlying the isolation region 36. As shown in FIG. 3O, in some embodiments, the first wall dielectric layer 46A may remain in the endcap.

Figures 3P, 3Q:
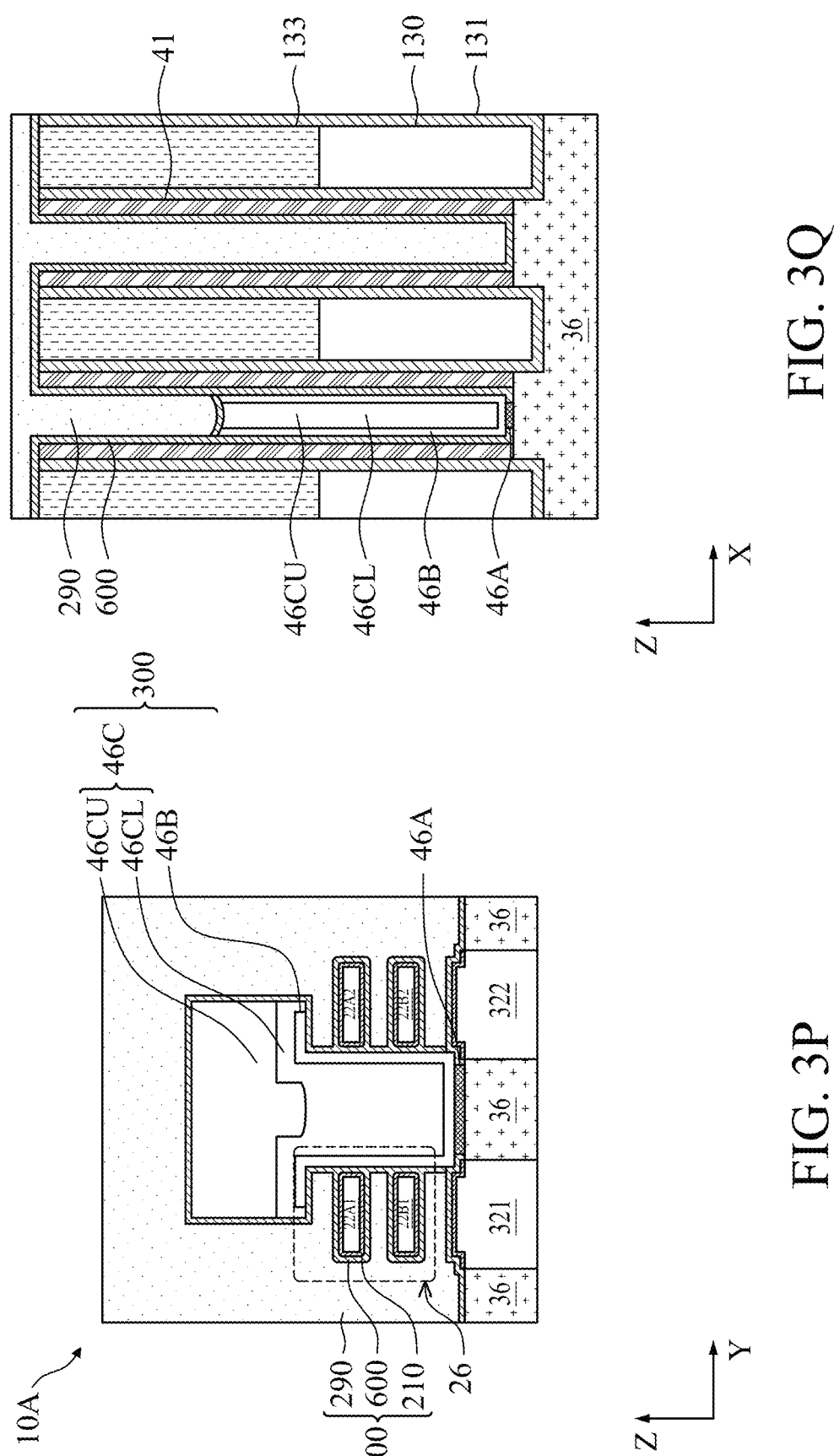

In FIGS. 3P, 3Q, the gate structure 200 is formed, which is described with reference to FIG. 1W.

Figures 3R, 3S:
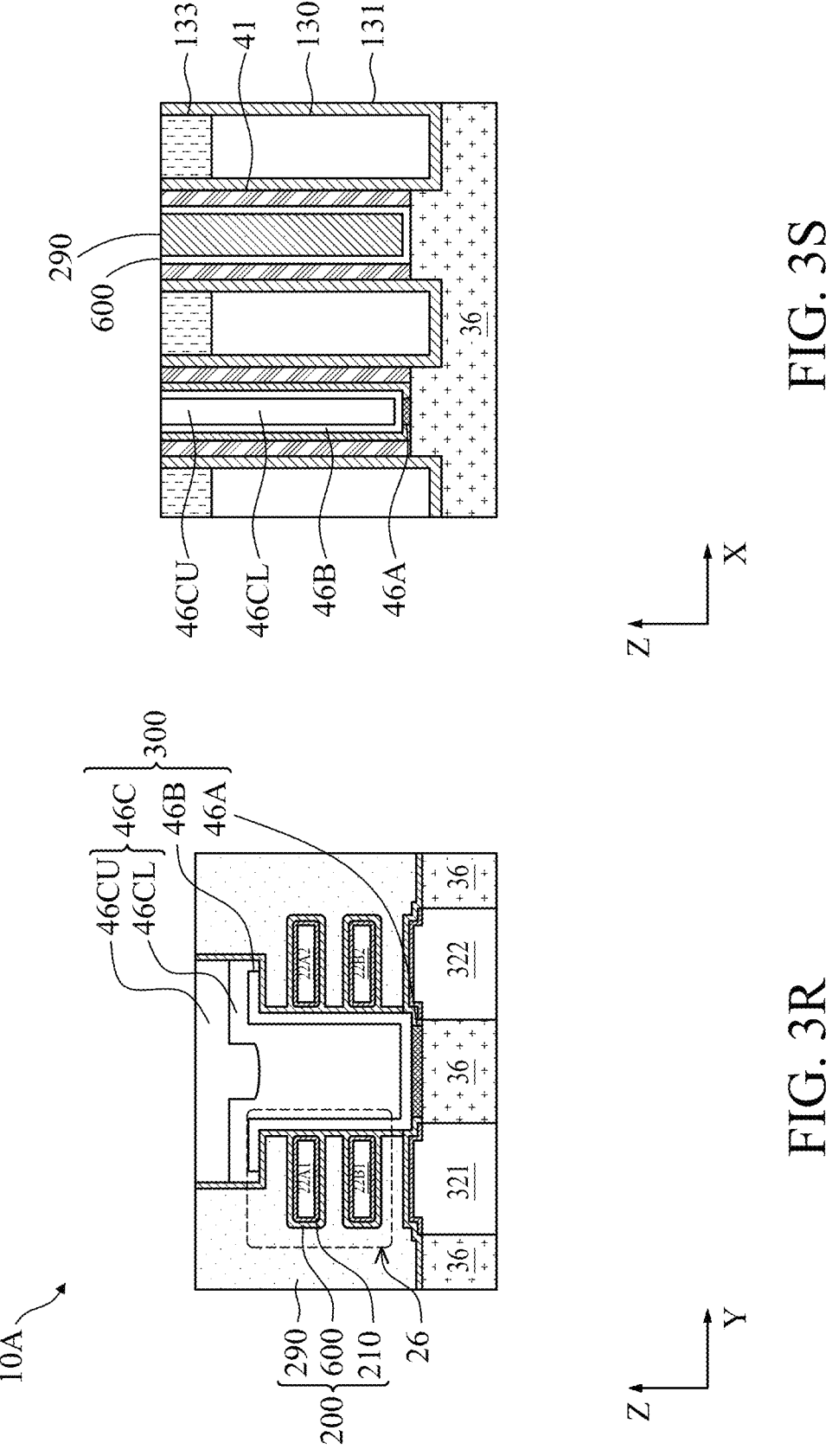

In FIGS. 3R-3U, the gate structure 200 and the wall structure 300 are recessed, which is described with reference to FIG. 1X. In some embodiments, as shown in FIGS. 3R, 3S, the gate structure 200 and the wall structure 300 are recessed by at least two removal operations. A first removal operation shown in FIGS. 3R, 3S may use an upper portion of the wall structure 300 (i.e., the wider portion above the fin stacks 26) as a stop layer in a CMP. When the upper portion is used as the stop layer in the CMP, the upper portion may be partially removed, as shown in FIG. 3R. Following the first removal operation, portions of the gate structure 200 on either side of the wall structure 300 are isolated physically and electrically from each other.

Figures 3T, 3U:
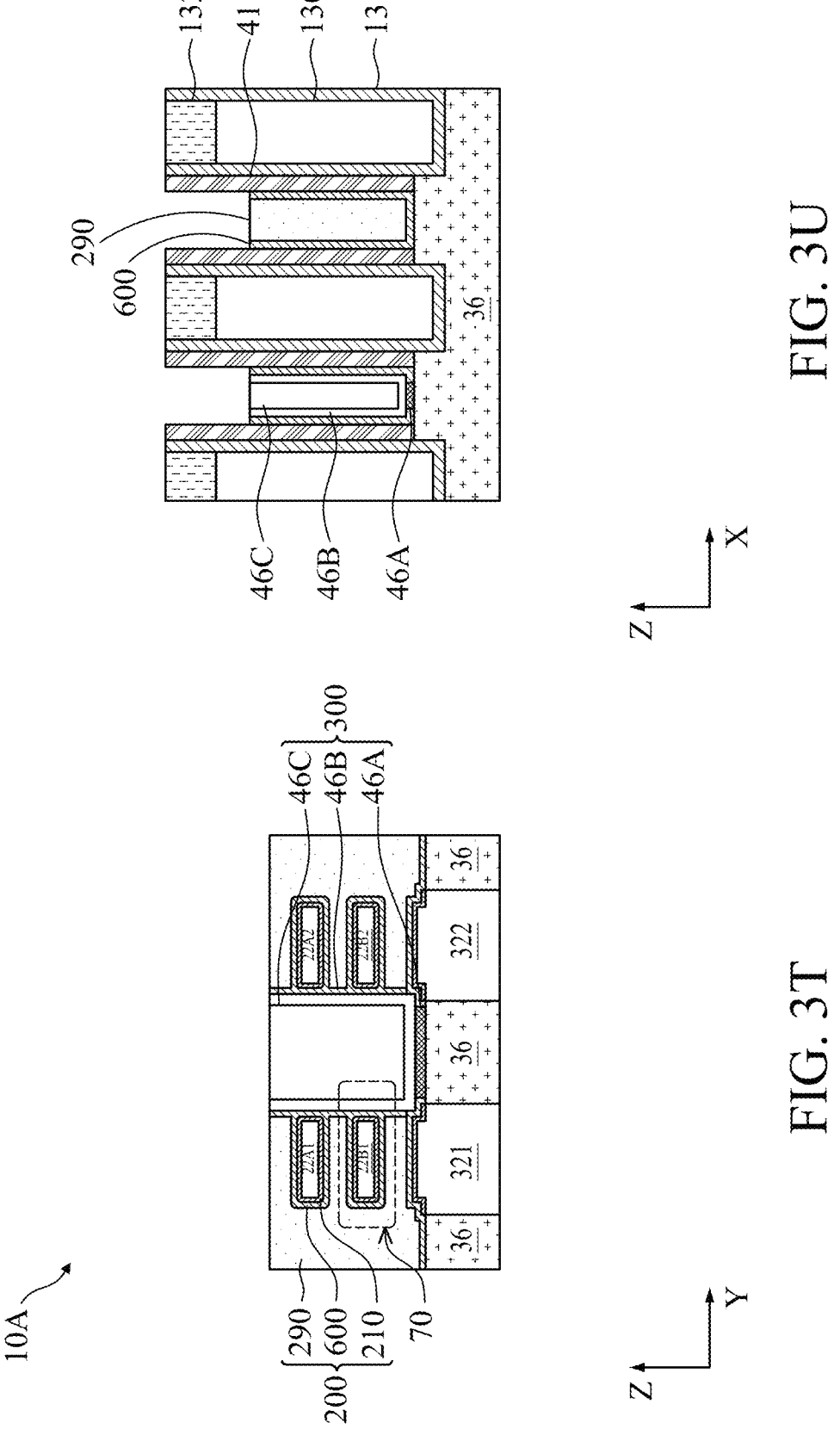

In a second removal operation shown in FIGS. 3T, 3U, the wider, upper portion of the wall structure 300 is removed, and thickness of the gate structure 200 (e.g., the conductive core layer 290 and/or work function metal layer) is selected to be substantially the same as between the channels 22, as described with reference to FIG. 1X. The second removal operation may be a second CMP.

Figure 3V:
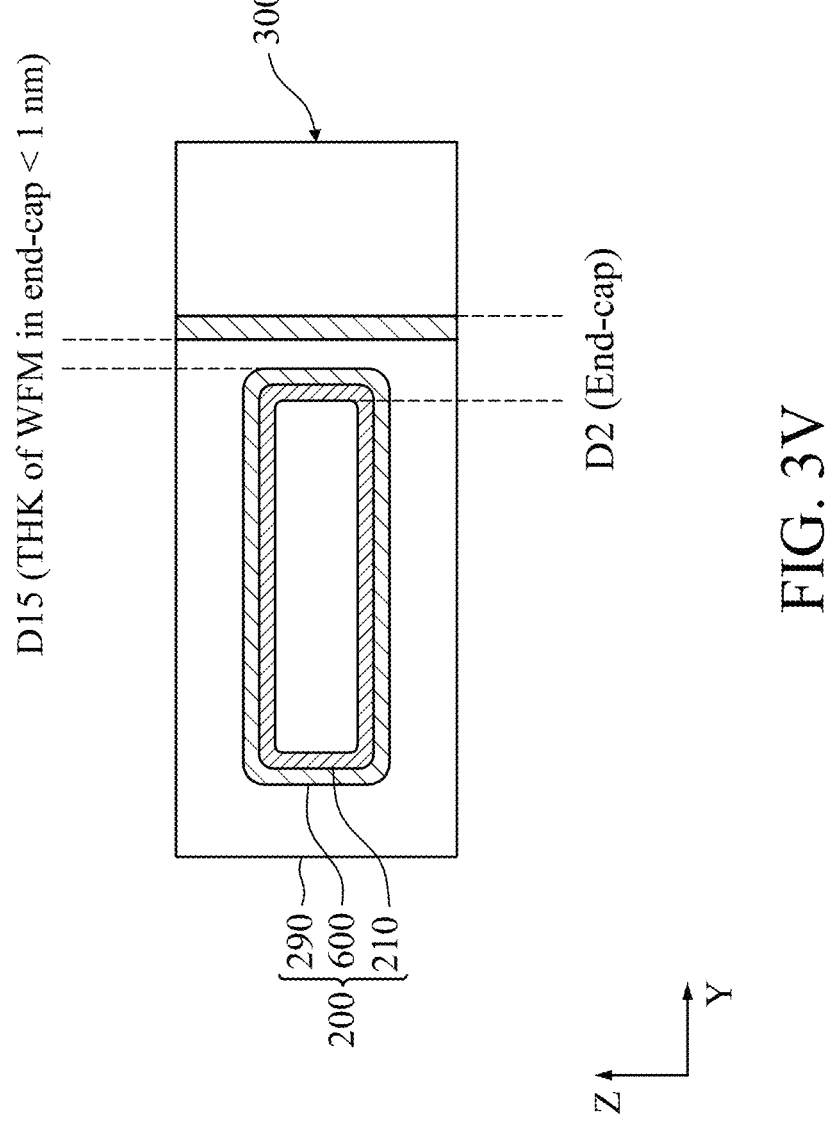

Similar to the description of FIG. 1Y, in FIG. 3V, the work function metal and/or conductive core layer 290 in the endcap may have thickness D15 that is less than about 1 nm.

Figures 4A, 4B:
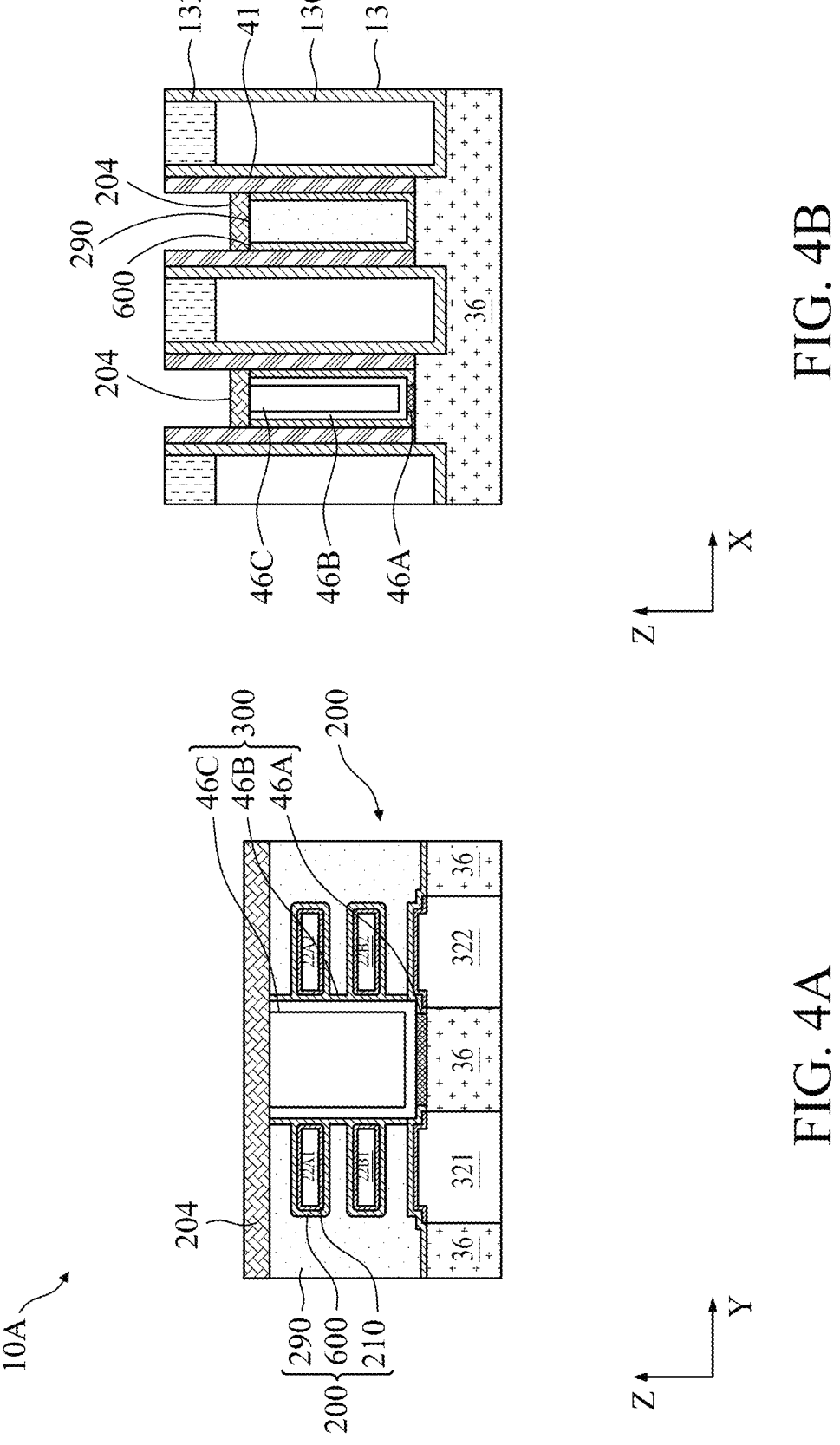

In some embodiments, as shown in FIGS. 4A, 4B, following recessing of the gate structure 200 and the wall structure 300, a conductive bridging layer 204 may be formed that electrically connects the gate structures 200 on either side of the wall structure 300 to each other, corresponding to act 1800 of FIG. 6. The conductive bridge layer 204 may include fluorine-free tungsten (FFW), which may be advantageous to lower contact resistance between the gate structure 200 and a gate via 184 formed in a subsequent process. The upper surface of the conductive bridging layer 204 may be below the lower surface of the ILD cap 133.

FIGS. 4C-4H illustrate formation of a gate isolation structure 99, corresponding to act 1900 of FIG. 6.

Figures 4C, 4D:
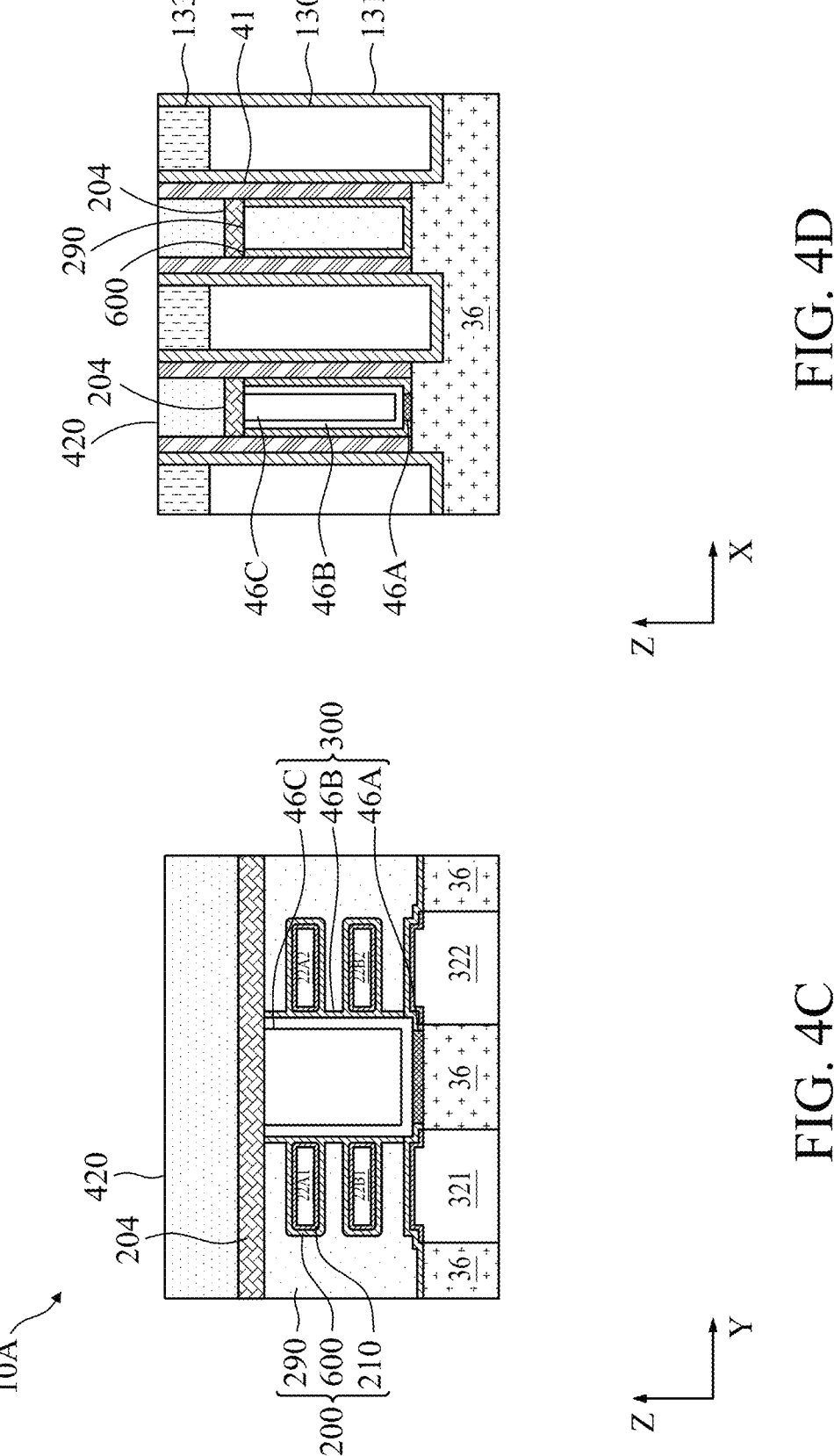

In FIGS. 4C, 4D, following formation of the conductive bridging layer 204, a masking layer 420 may be formed on the conductive bridging layer 204. The masking layer 420 may be a dielectric material, and may be deposited by PVD, CVD, ALD, or another suitable deposition process. Excess material of the masking layer 420 overlying the sidewall spacers 41, the ILD cap 133 and the CESL 131 may be removed by a CMP.

Figure 4E:
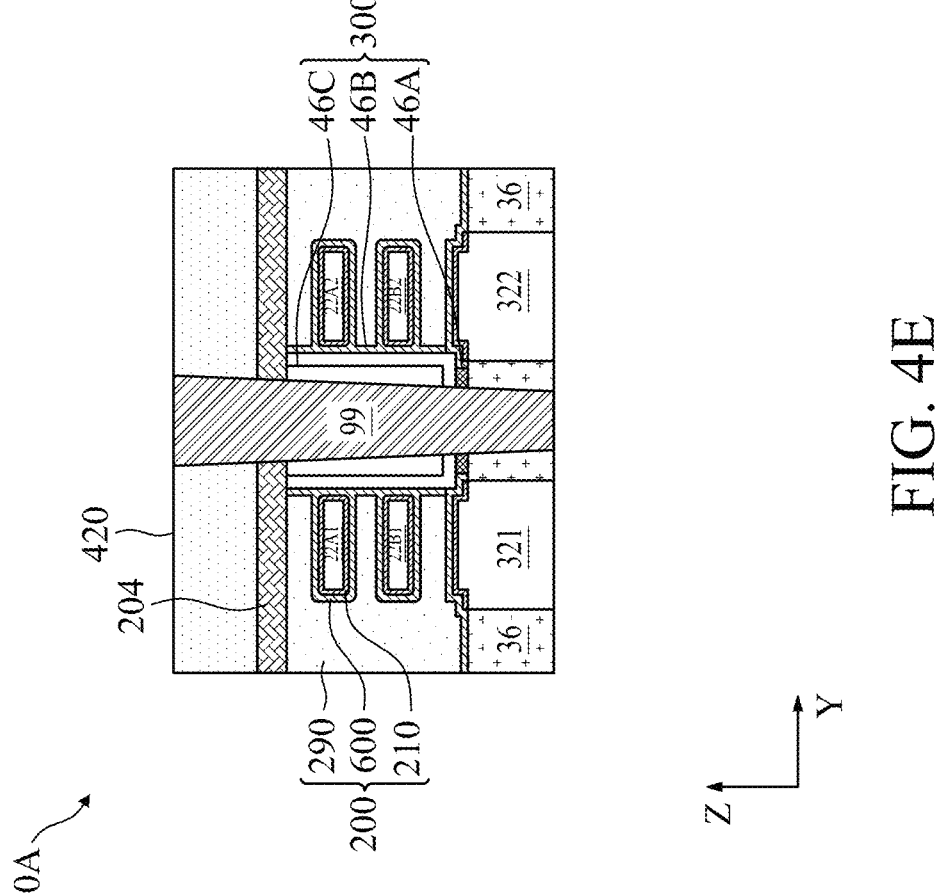

In FIG. 4E, following deposition of the masking layer 420, the masking layer 420 may be patterned by a suitable patterning process to form an opening that is over and overlaps the wall structure 300. The opening may expose the conductive bridging layer 204. Following forming the opening, the exposed portion of the conductive bridging layer 204 is removed by a suitable etching process, which may be an anisotropic etch that is selective to the material (e.g., FFW) of the conductive bridging layer 204, thereby extending the opening through the conductive bridging layer 204 and exposing the wall structure 300. A second etching process may be performed to further extend the opening into and through the wall structure 300. The second etching process may include multiple etching operations for respectively etching through the third wall dielectric layer 46C, the second wall dielectric layer 46B and the first wall dielectric layer 46A, and also etching into or through the isolation region 36. In some embodiments, the second etching process stops on in the third wall dielectric layer 46C, on or in the second wall dielectric layer 46B, or on or in the first wall dielectric layer 46A.

Because the endcap side of the nanosheets 22 abuts the wall structure 300, such that substantially no work function metal and/or conductive core layer 290 (e.g., less than 1 nm) is present in the endcap, threshold voltage variation is reduced, and minimum feature size uniformity ("CDU") and/or photolithography overlay shift (e.g., when forming the opening for the gate isolation structure 99) are less of a concern.

Following the second etching process that extends the opening, a gate isolation structure or "CMG" 99 may be formed in the opening by a suitable deposition process. In some embodiments, the gate isolation structure 99 includes SiN, SiO2, Al2O3, ZrO2 or other suitable dielectric material. The gate isolation structure 99 may be deposited in the opening by a suitable process, such as CVD and/or other suitable technique. Following deposition of the gate isolation structure 99, a removal process, such as CMP or another suitable process, can be performed to remove excess material of the gate isolation structure 99 from over the masking layer 420, such that the upper surface of the gate isolation structure 99 is substantially level with an upper surface of the masking layer 420. The gate isolation structure 99 generally inherits the shape of the opening.

Figures 4F, 4G:
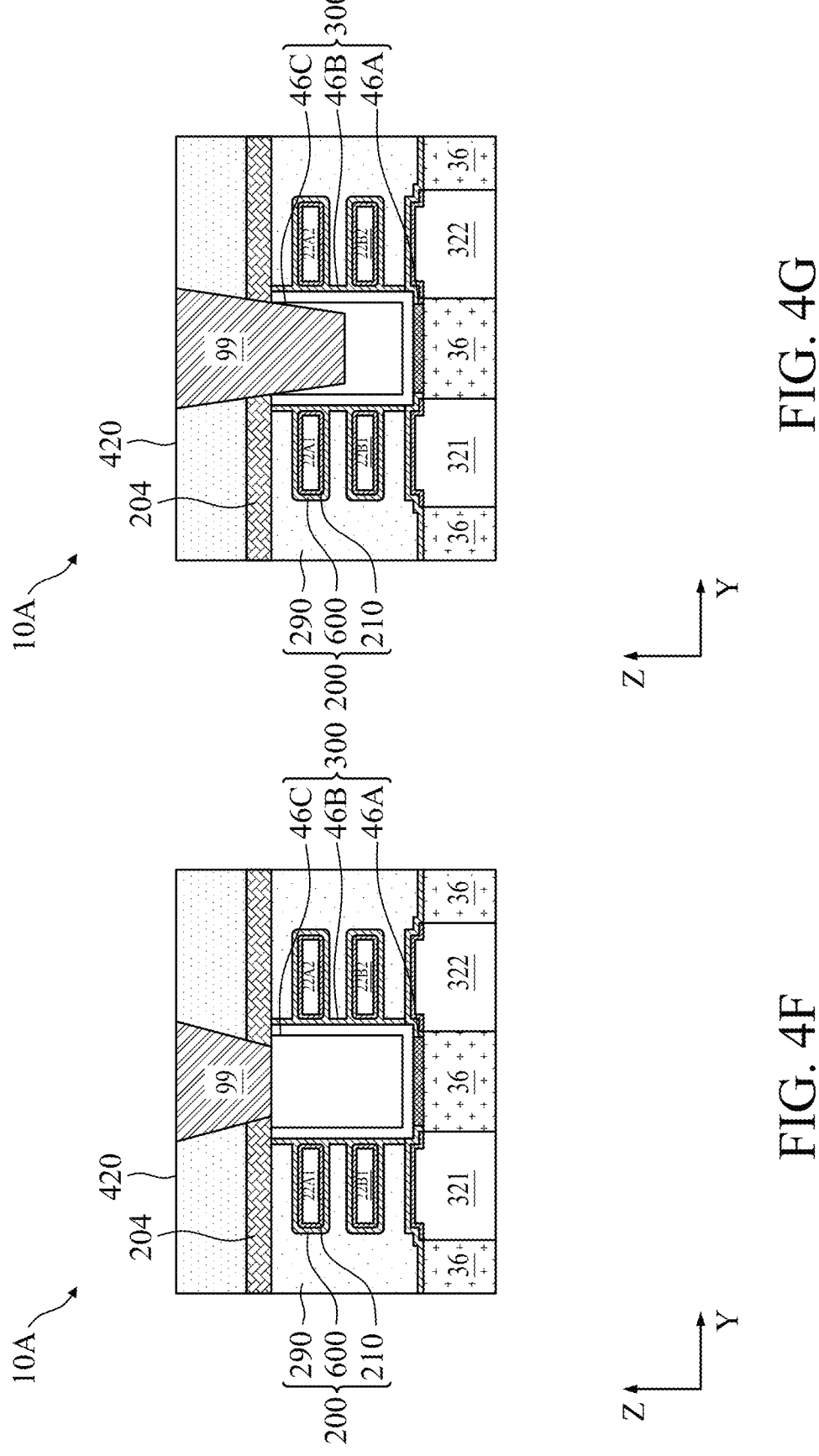

FIGS. 4F, 4G illustrate embodiments in which the gate isolation structure 99 lands on the upper surface of the wall structure 300 (FIG. 4F) or is embedded partially into the wall structure 300 (FIG. 4G).

Figure 4H:
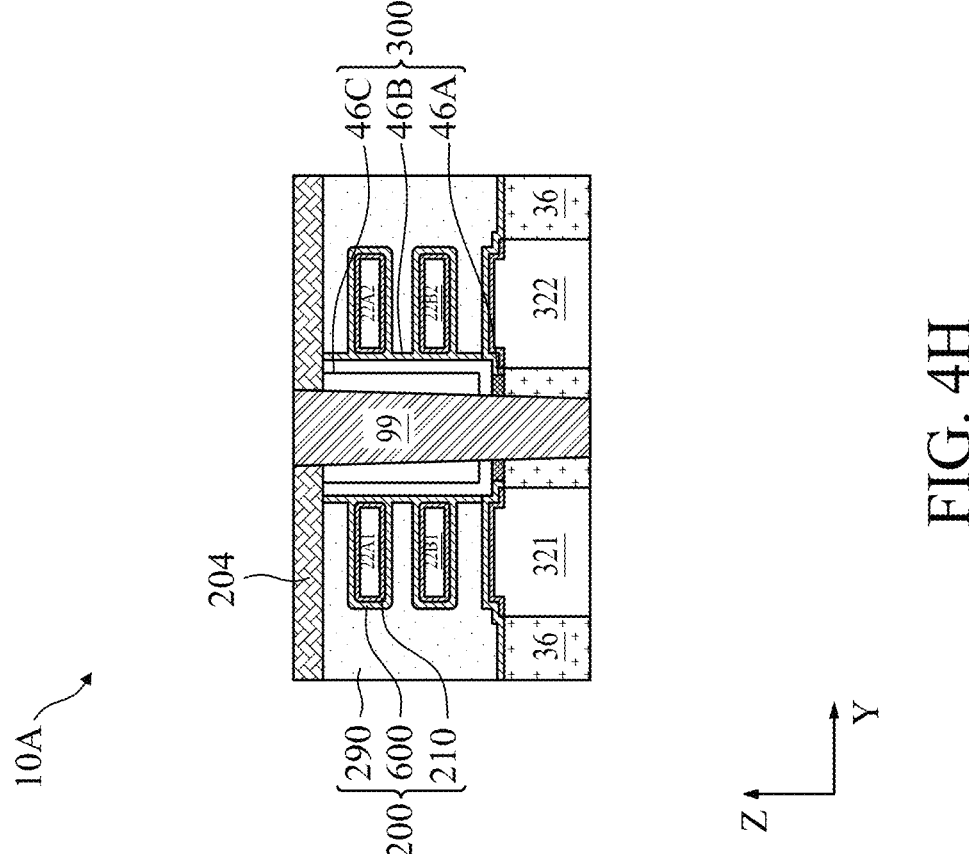

In FIG. 4H, following the CMP that removes the excess material of the gate isolation structure 99, another CMP may be performed to remove the masking layer 420 and the gate isolation structure 99 over the conductive bridging layer 204, thereby exposing the conductive bridging layer 204.

Figures 4I, 4J:
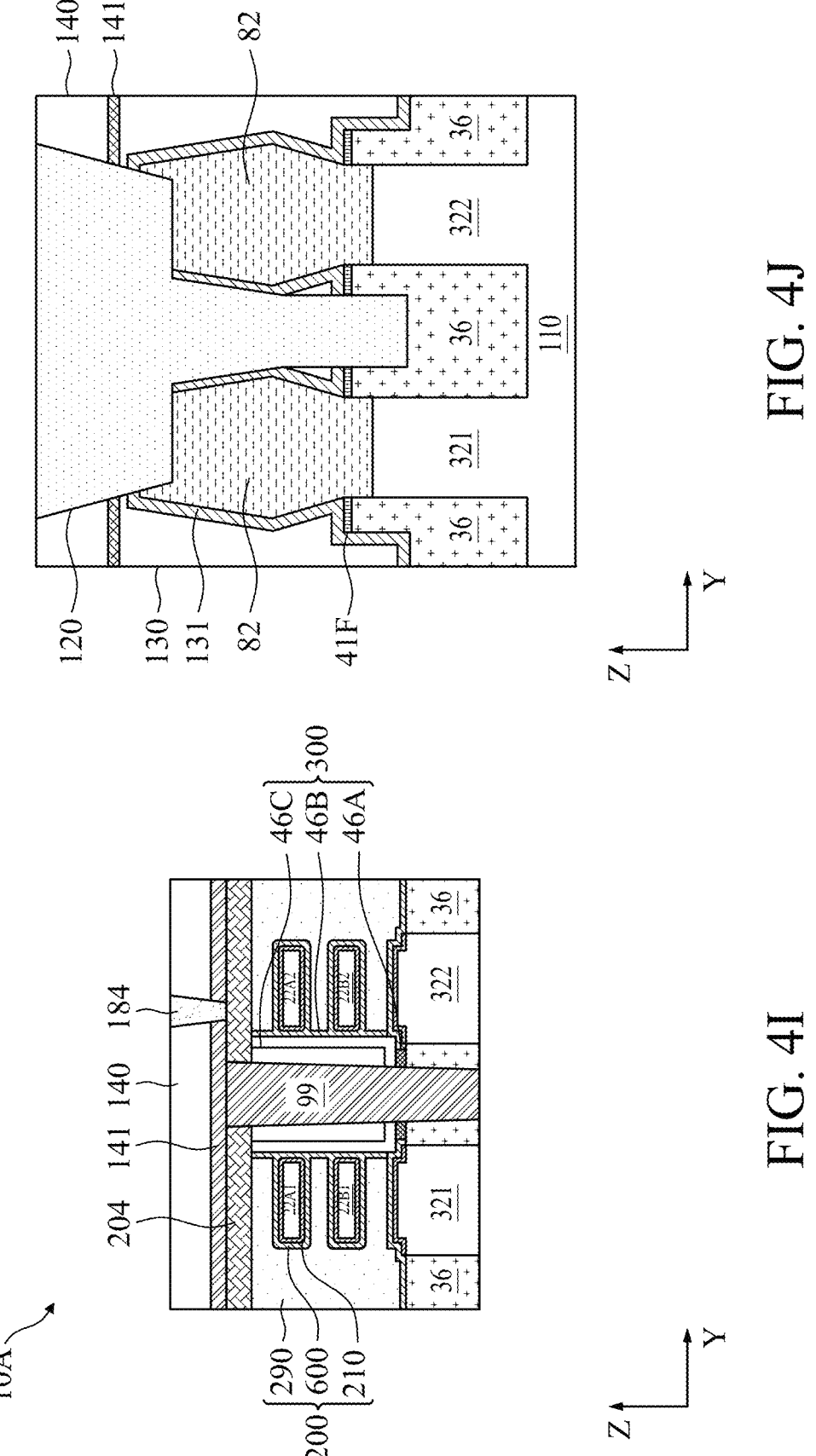

In FIG. 4I, following exposing the conductive bridging layer 204, a second ESL 141 and second ILD 140 are formed on the conductive bridging layer 204 and the gate isolation structure 99, which is described with reference to FIG. 1Z. A gate via 184 may be formed through the second ILD 140 and the second ESL 141 to contact the conductive bridging layer 204.

FIG. 4J shows formation of a source/drain contact 120, which may extend through the second ILD 140, the second ESL 141, the ILD 130, the CESL 131 and partially into the source/drain regions 82. The source/drain contact 120 may include a conductive material such as tungsten, cobalt, ruthenium, iridium, molybdenum, copper, aluminum, or combinations thereof. The source/drain contact 120 may be adjacent a barrier layer (not shown), such as SiN or TiN, which helps prevent or reduce diffusion of materials from and into the source/drain contacts 120. A silicide layer may also be formed between the source/drain regions 82 and the source/drain contacts 120, so as to reduce the source/drain contact resistance. The silicide layer may contain a metal silicide material, such as cobalt silicide in some embodiments, or TiSi in some other embodiments. As shown in FIG. 4J, the source/drain contact 120 may extend into the isolation region 36. Sidewalls of a lower portion of the source/drain contact 120 may be separated from the source/drain regions 82 by the CESL 131. As illustrated in FIG. 4J, the wall structure 300 and the gate isolation structure 99 may not be present between the source/drain regions 82, which is advantageous for forming increased contact area between the source/drain contact 120 and the source/drain regions 82.

Figure 5:
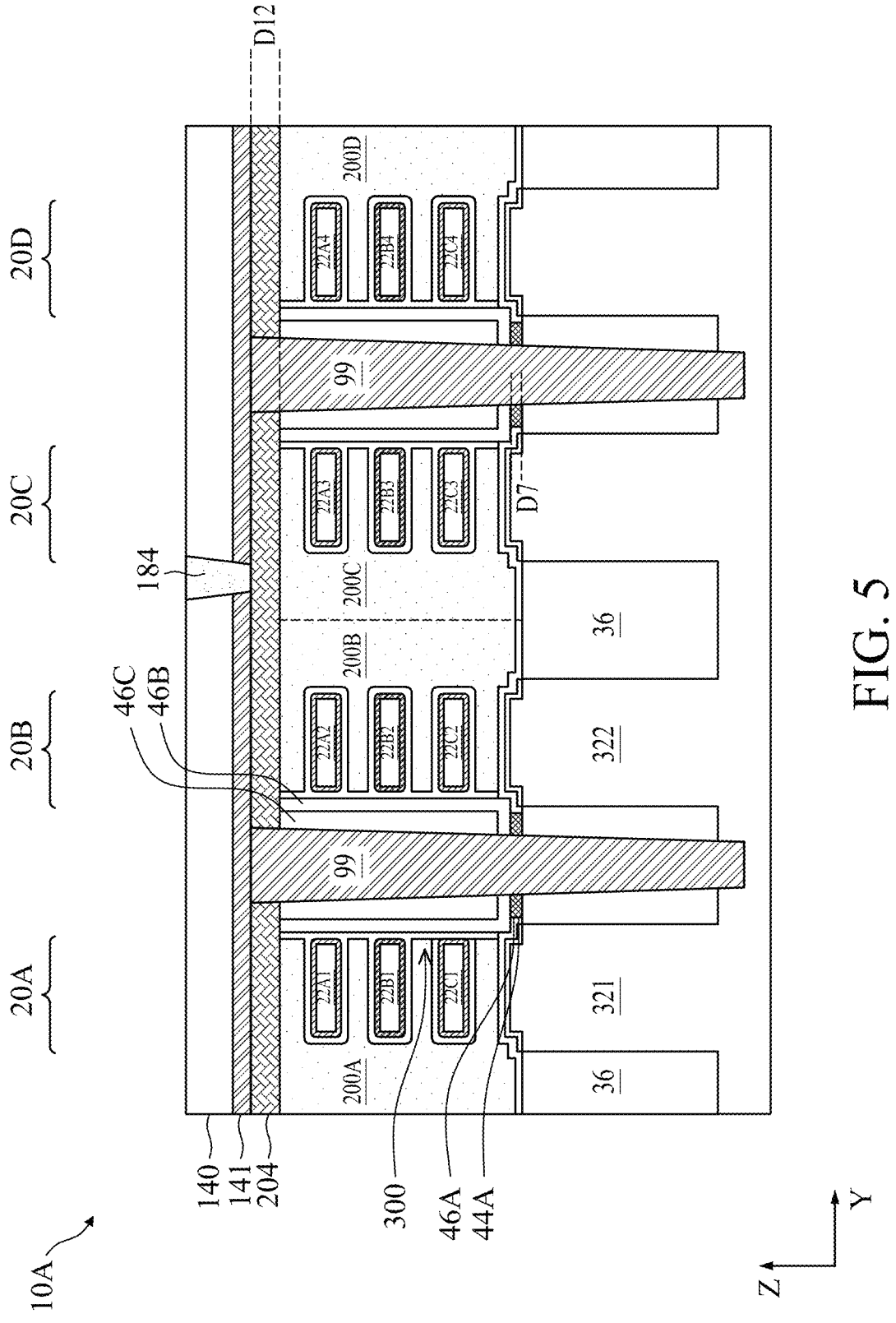
Figure 6:
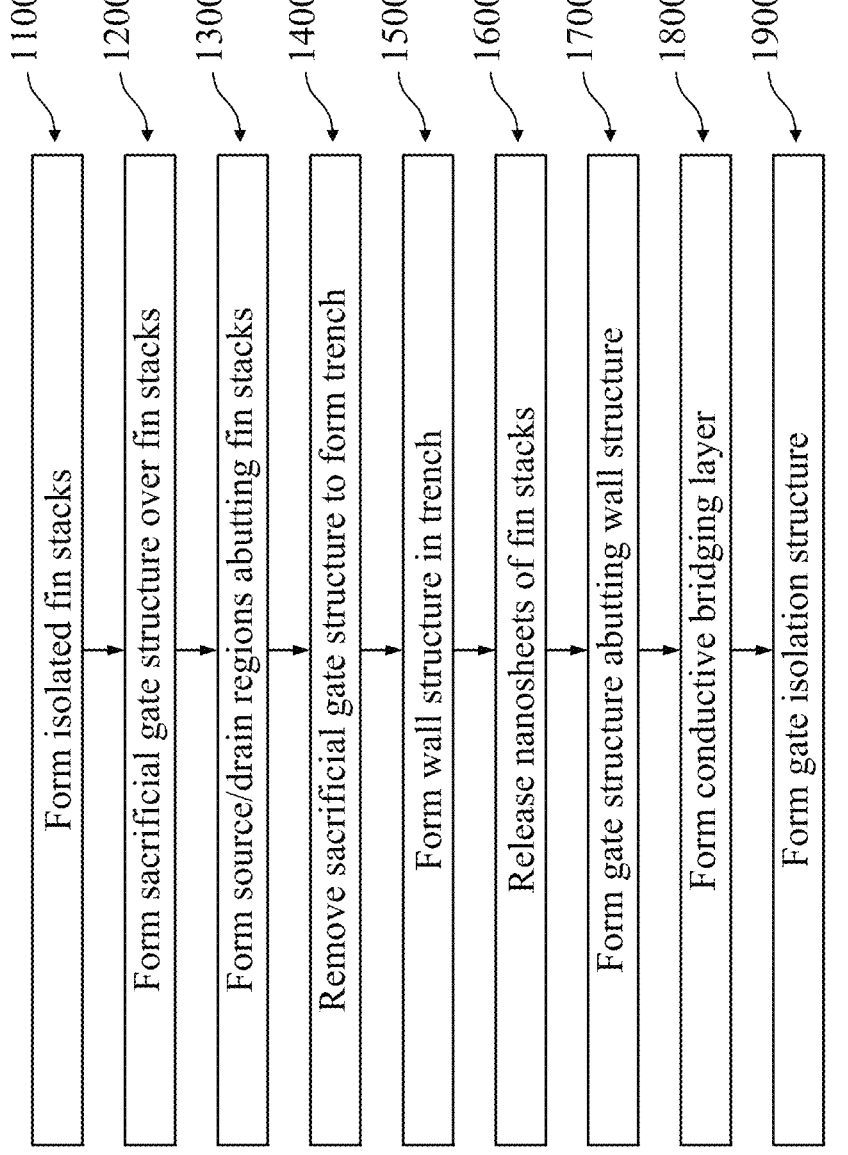
FIG. 6 is a flowchart of a method in accordance with various embodiments.

FIG. 5 illustrates an enlarged view of the IC device 10A in accordance with various embodiments. As shown in FIG. 5, the IC device 10A may include at least four nanostructure devices 20A, 20B, 20C, 20D. Each of the nanostructure devices 20A-20D may include a respective gate structure 200A-200D and respective nanostructure channels 22A1-22C4. In the IC device 10A shown in FIG. 5, each fin stack 26 includes three nanosheets 22. The gate structures 200B, 200C may be merged, and are illustrated with a dashed line, but may have no visible interface therebetween due to being formed simultaneously as a monolithic structure. The gate structures 200B, 200C are physically and electrically isolated on one side from the gate structure 200A of the nanostructure 20A and on the other side from the gate structure 200D of the nanostructure 20D. The isolation between the gate structures 200A-200D is by the wall structures 300 that separate the conductive core layers 290 from each other, and by the gate isolation structures 99 that separate the overlying portions of the conductive bridging layer 204 from each other. Dimensions D12 and D7 are shown in FIG. 5. The dimension D7 is described in detail with reference to FIG. 1X. The dimension D12 is thickness of the conductive bridging layer 204 in the Z-axis direction, which may be in a range of about 1 nm to about 8 nm, in some embodiments.

Embodiments may provide advantages. The wall structure 300 is only positioned between the gate structures 200 and does not extend to a region between the source/drain regions 82, which is advantageous for reducing leakage current. The gate structure 200 extends above the uppermost channels 22 by a distance substantially the same as interchannel spacing, which improves threshold voltage uniformity of the uppermost channels 22 relative to other lower channels 22 nearer the substrate 110. Work function metal and/or conductive core layer 290 of the gate structures 200 has thickness in the endcap of less than 1 nm, which is advantageous for improving AC performance of the nanostructure devices 20A-20D. The gate dielectric layer 600 wraps entirely around the nanosheets 22 in profile (e.g., the Y-Z plane, but not the X-Z plane), which improves short channel control.

In accordance with at least one embodiment, a device includes: a first stack of nanostructures; a second stack of nanostructures horizontally offset from the first stack; a first source/drain region abutting the first stack of nanostructures; a second source/drain region abutting the second stack of nanostructures; a wall structure between the first and second stacks and spaced apart from the nanostructures of the first stack; and a first gate structure, which includes: a gate dielectric layer that wraps around the nanostructures of the first stack; and a conductive core layer on the gate dielectric layer, wherein thickness of the conductive core layer between one of the nanostructure of the first stack and the wall structure is in a range of 0 nanometers to 1 nanometer, inclusive.

In accordance with at least one embodiment, a method includes: forming a first stack of nanostructures and a second stack of nanostructures; forming a sacrificial gate structure over the first and second stacks; forming a first source/drain region and a second source/drain region, the first source/drain region abutting the first stack, the second source/drain region abutting the second stack; forming a gate trench by removing the sacrificial gate structure; forming a wall structure in the gate trench; and forming a gate structure that wraps around the first and second stacks and abuts the wall structure, wherein upper surfaces of the gate structure and the wall structure are substantially coplanar.

In accordance with at least one embodiment, a device includes: a first stack of nanostructures; a second stack of nanostructures horizontally offset from the first stack; a first source/drain region abutting the first stack of nanostructures; a second source/drain region abutting the second stack of nanostructures; a wall structure between the first and second stacks and spaced apart from the nanostructures of the first stack by first openings; a sidewall spacer that extends from the first stack to the second stack; and a first gate structure including a gate dielectric layer that wraps around the nanostructures of the first stack and merges in the first openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a first stack of nanostructures;
a second stack of nanostructures horizontally offset from the first stack;
a first source/drain region abutting the first stack of nanostructures;

a second source/drain region abutting the second stack of nanostructures;
a wall structure between the first and second stacks and spaced apart from the nanostructures of the first stack; and
a first gate structure, including:
a gate dielectric layer that wraps around the nanostructures of the first stack; and
a conductive core layer on the gate dielectric layer, wherein thickness of the conductive core layer between one of the nanostructures of the first stack and the wall structure in an endcap region is greater than 0 nanometers and less than 1 nanometer.

2. The device of claim 1, wherein the wall structure includes:
a first dielectric layer; and
a second dielectric layer that is between the first dielectric layer and the first and second stacks.

3. The device of claim 1, further comprising:
an isolation region;
wherein the wall structure extends from an upper surface of the first gate structure to a level below a lower surface of the first gate structure.

4. The device of claim 3, further comprising:
a third dielectric layer between the wall structure and the isolation region.

5. The device of claim 1, further comprising:
a sidewall spacer that extends from the first stack to the second stack;
wherein the wall structure is separated from the first and second source/drain regions by the sidewall spacer.

6. The device of claim 1, wherein the first stack includes:
a first nanostructure; and
a second nanostructure over the first nanostructure and separated from the first nanostructure by a first distance;
wherein the first gate structure extends above the second nanostructure by a second distance that is substantially equal to the first distance.

7. The device of claim 1, further comprising:
a conductive layer on the first gate structure and the wall structure, the conductive layer being separated from the first stack by a second distance;
wherein a separation between adjacent nanostructures of the first stack is a first distance that is substantially equal to the second distance.

8. The device of claim 7, further comprising:
a gate isolation structure that extends completely through the conductive layer.

9. The device of claim 8, wherein the gate isolation structure extends into the wall structure.

10. The device of claim 8, wherein the gate isolation structure extends completely through the wall structure.

11. A method, comprising:
forming a first stack of nanostructures and a second stack of nanostructures;
forming a sacrificial gate structure over the first and second stacks;
forming a first source/drain region and a second source/drain region, the first source/drain region abutting the first stack, the second source/drain region abutting the second stack;
forming a gate trench by removing the sacrificial gate structure;
forming a wall structure in the gate trench; and
forming a gate structure that wraps around the first and second stacks and abuts the wall structure, wherein upper surfaces of the gate structure and the wall structure are substantially coplanar.

12. The method of claim 11, further comprising:

forming a conductive layer on the gate structure and the wall structure; and forming a gate isolation structure that extends completely through the conductive layer and contacts the wall structure.

13. The method of claim 11, wherein the forming a wall structure includes:

forming a first dielectric layer in the gate trench;

forming a second dielectric layer on the first dielectric layer, the first dielectric layer having higher dielectric constant than the second dielectric layer;

forming a patterned second dielectric layer region by patterning the second dielectric layer; and forming a third dielectric layer on the patterned second dielectric layer region, wherein the third dielectric layer merges in the gate trench in a space between vertical walls of the patterned second dielectric layer region.

14. The method of claim 13, wherein the forming a wall structure further includes:

forming openings by removing portions of the first dielectric layer between the first stack and the second dielectric layer.

15. The method of claim 14, wherein the forming a gate structure includes:

forming a gate dielectric layer on nanostructures of the first stack, the gate dielectric layer merging in the openings.

16. The method of claim 15, wherein the forming a gate structure further includes:

forming a conductive core layer on the gate dielectric layer, the conductive core layer having thickness in the openings that is between 0 nanometers and 1 nanometer, inclusive.

17. A device, comprising:

a first stack of nanostructures;

a second stack of nanostructures horizontally offset from the first stack;

a first source/drain region abutting the first stack of nanostructures;

a second source/drain region abutting the second stack of nanostructures;

a wall structure between the first and second stacks and spaced apart from the nanostructures of the first stack by first openings;

a sidewall spacer that extends from the first stack to the second stack; and a first gate structure including a gate dielectric layer that wraps around the nanostructures of the first stack and merges in the first openings.

18. The device of claim 17, further comprising:

a conductive layer on the first gate structure and the wall structure; and a gate isolation structure that extends completely through the conductive layer and contacts the wall structure.

19. The device of claim 18, wherein the first gate structure is between the first stack and the conductive layer, and separation between the first stack and the conductive layer is substantially equal to separation between adjacent nanostructures of the first stack.

20. The device of claim 17, wherein the sidewall spacer separates the wall structure from the first and second source/drain regions.

* * * * *